United States Patent
Tamura et al.

(10) Patent No.: US 7,465,674 B2
(45) Date of Patent: Dec. 16, 2008

(54) MANUFACTURING METHOD OF SEMICONDUCTOR DEVICE

(75) Inventors: Tomoko Tamura, Atsugi (JP); Kaori Ogita, Machida (JP); Koji Dairiki, Isehara (JP); Junya Maruyama, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 179 days.

(21) Appl. No.: 11/437,983

(22) Filed: May 22, 2006

(65) Prior Publication Data

US 2006/0270191 A1    Nov. 30, 2006

(30) Foreign Application Priority Data

May 31, 2005    (JP)    ............................. 2005-158761

(51) Int. Cl.
 *H01L 21/311*    (2006.01)
(52) U.S. Cl. ................. 438/739; 438/772; 257/E21.038
(58) Field of Classification Search ................. 438/739, 438/771, 770, 772, 907, 908, 910; 257/E21.034, 257/E21.035, E21.038
See application file for complete search history.

(56) References Cited

U.S. PATENT DOCUMENTS

| | | | |
|---|---|---|---|
| 5,273,609 A * | 12/1993 | Moslehi ................. | 156/345.28 |
| 5,324,683 A * | 6/1994 | Fitch et al. ................. | 438/422 |
| 5,757,456 A | 5/1998 | Yamazaki et al. | |
| 6,118,502 A | 9/2000 | Yamazaki et al. | |
| 6,127,199 A | 10/2000 | Inoue et al. | |
| 6,372,608 B1 | 4/2002 | Shimoda et al. | |
| 6,645,830 B2 | 11/2003 | Shimoda | |
| RE38,466 E | 3/2004 | Inoue | |
| 6,787,440 B2 * | 9/2004 | Parker et al. ................. | 438/591 |
| 6,818,530 B2 | 11/2004 | Shimoda | |

(Continued)

FOREIGN PATENT DOCUMENTS

EP    0 858 110    8/1998

(Continued)

OTHER PUBLICATIONS

International Search Report dated Mar. 15, 2005 for PCT/JP2004/018978.

(Continued)

*Primary Examiner*—Matthew S. Smith
*Assistant Examiner*—Julio J. Maldonado
(74) *Attorney, Agent, or Firm*—Eric J. Robinson; Robinson Intellectual Property Law Office, P.C.

(57) ABSTRACT

An object of the present invention is to provide a method for manufacturing a semiconductor device with high reliability, at low cost, in which an element forming layer having a thin film transistor and the like provided over a substrate is peeled from the substrate, so that a semiconductor device is manufactured. According to the invention, a metal film is formed over a substrate, a plasma treatment is performed to the metal film in a dinitrogen monoxide atmosphere to form a metal oxide film over the metal film, a first insulating film is formed continuously without being exposed to the air, an element forming layer is formed over the first insulating film, and the element forming layer is peeled from the substrate, so that a semiconductor device is manufactured.

17 Claims, 32 Drawing Sheets

U.S. PATENT DOCUMENTS

| | | | |
|---|---|---|---|
| 6,982,209 B2* | 1/2006 | Chen et al. | 438/458 |
| 2001/0012667 A1* | 8/2001 | Ma et al. | 438/287 |
| 2001/0015256 A1 | 8/2001 | Yamazaki et al. | |
| 2001/0053559 A1 | 12/2001 | Nagao et al. | |
| 2002/0000629 A1* | 1/2002 | Kim et al. | 257/412 |
| 2003/0022403 A1 | 1/2003 | Shimoda et al. | |
| 2003/0024898 A1* | 2/2003 | Natsume et al. | 216/37 |
| 2003/0032210 A1 | 2/2003 | Takayama et al. | |
| 2003/0071953 A1 | 4/2003 | Yamazaki | |
| 2003/0157783 A1* | 8/2003 | Fonash et al. | 438/458 |
| 2004/0087110 A1 | 5/2004 | Takayama et al. | |
| 2004/0219762 A1 | 11/2004 | Shimoda | |
| 2004/0256618 A1 | 12/2004 | Imai et al. | |
| 2005/0070038 A1 | 3/2005 | Yamazaki | |
| 2005/0148121 A1 | 7/2005 | Yamazaki et al. | |

FOREIGN PATENT DOCUMENTS

| | | |
|---|---|---|
| EP | 1 193 759 | 4/2002 |
| EP | 1 351 308 | 10/2003 |
| JP | 08-254686 | 10/1996 |
| JP | 10-125929 | 5/1998 |
| JP | 2001-260580 | 9/2001 |
| JP | 2001-272923 | 10/2001 |
| JP | 2003-203898 | 7/2003 |
| WO | WO 03/010825 | 2/2003 |
| WO | WO 2005/057658 | 6/2005 |

OTHER PUBLICATIONS

Written Opinion dated Mar. 15, 2005 for PCT/JP2004/018978.
International Search Report dated Mar. 22, 2005 for PCT/JP2005/001541.
Written Opinion dated Mar. 22, 2005 for PCT/JP2005/001541.
*"Sense of Crisis" is a trigger, Ignited Evolution of a Sesame-Grain Sized Chip*, Leading Trends, Nikkei Electronics, Nov. 18, 2002, p. 67-76.

* cited by examiner

17

18

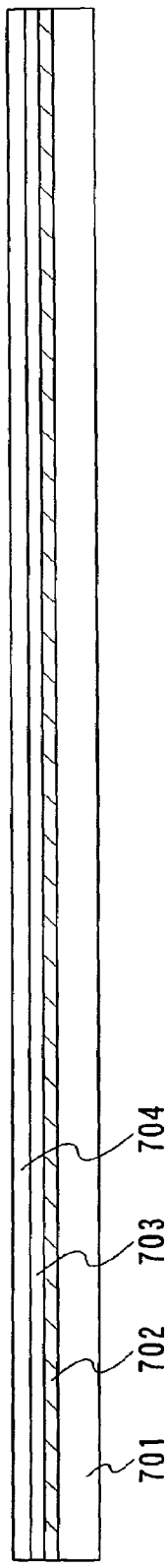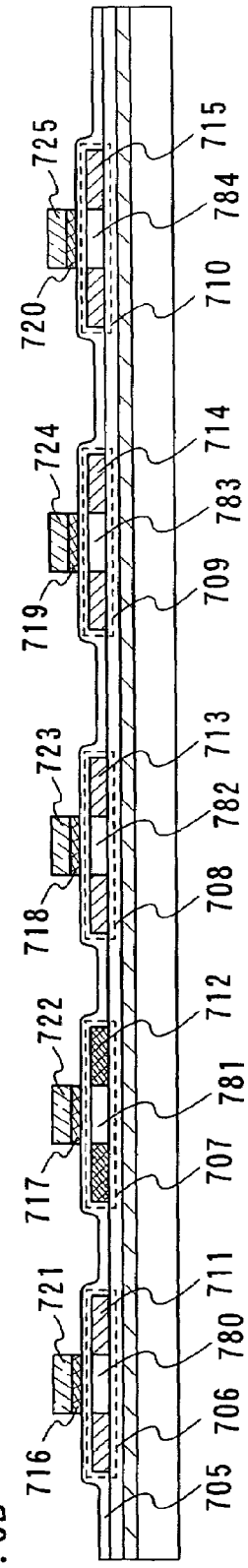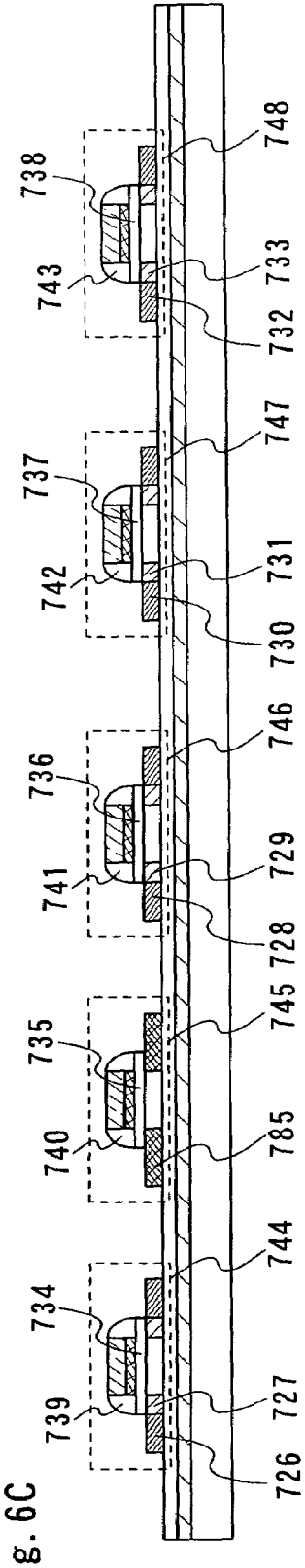

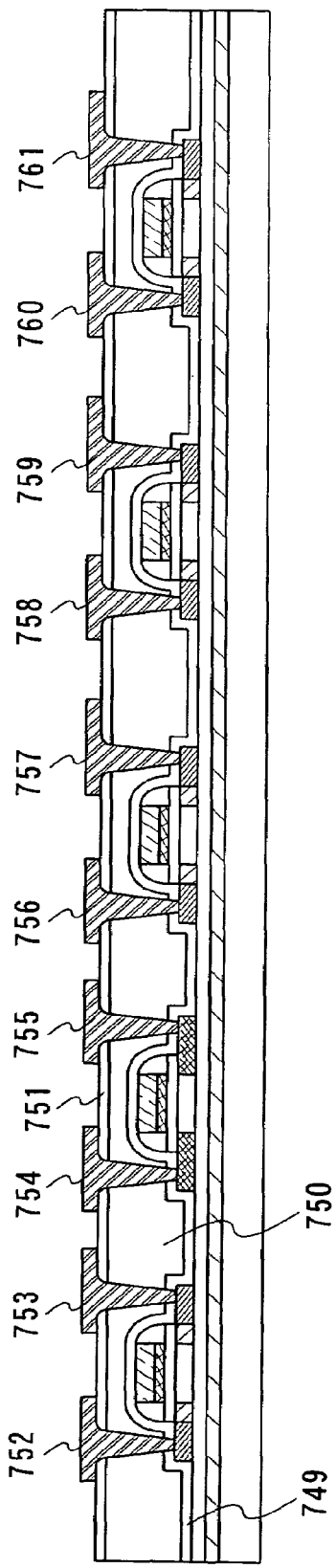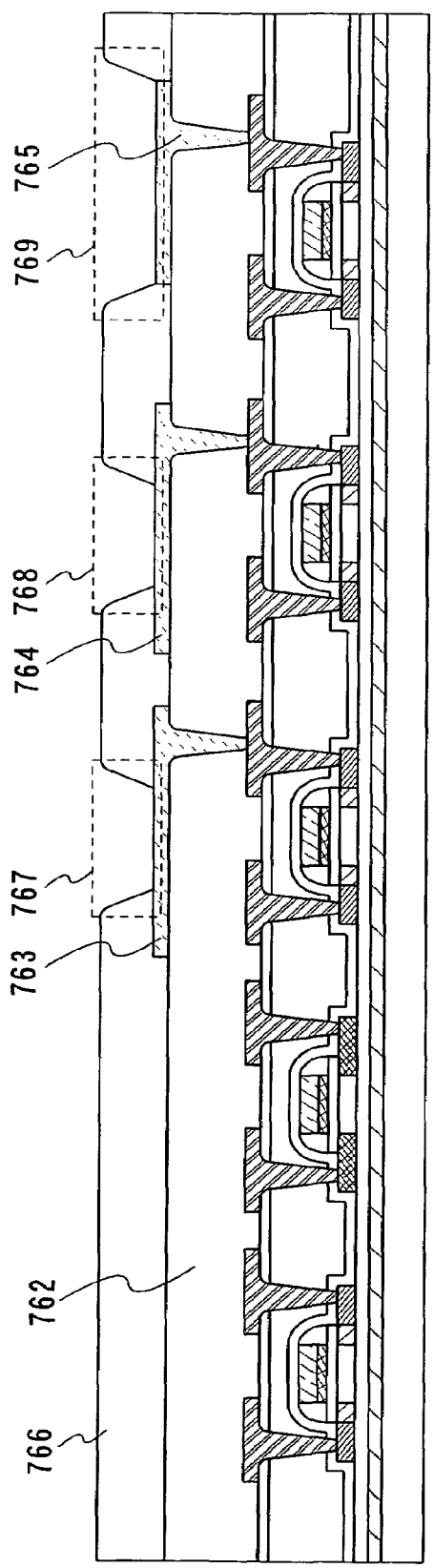
Fig.7A
Fig.7B

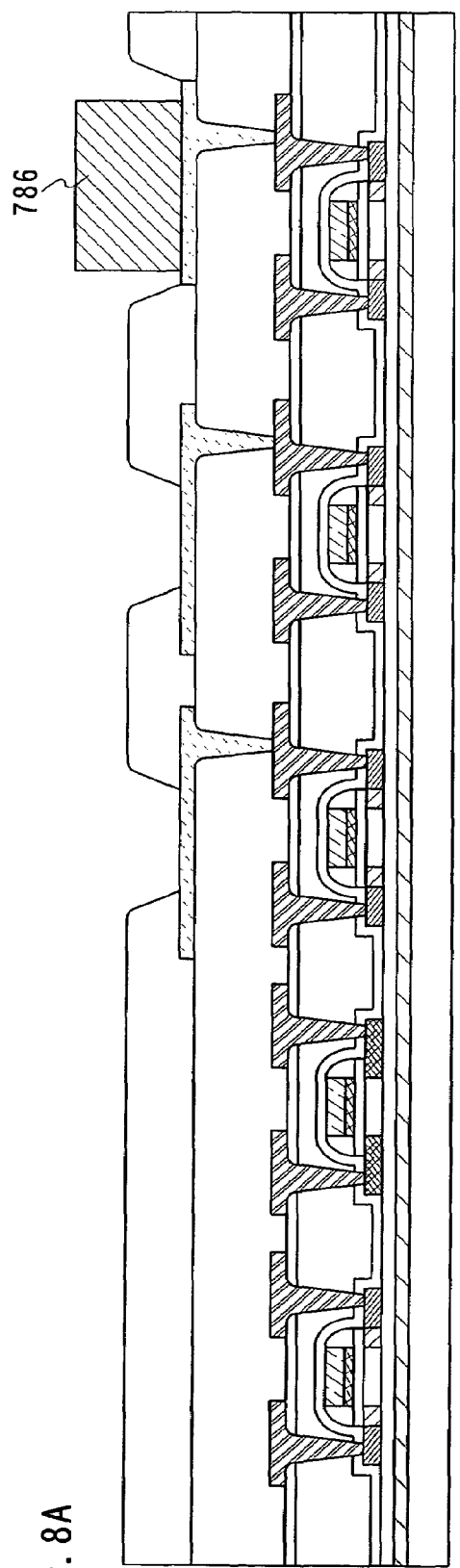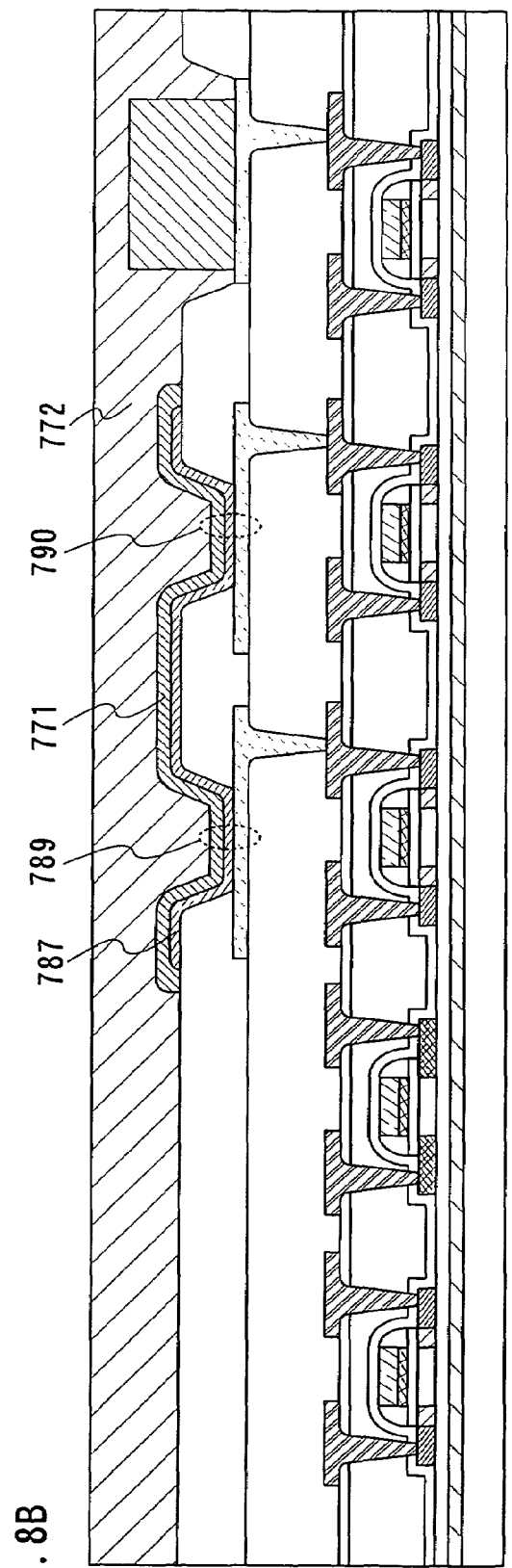
Fig. 8A
Fig. 8B

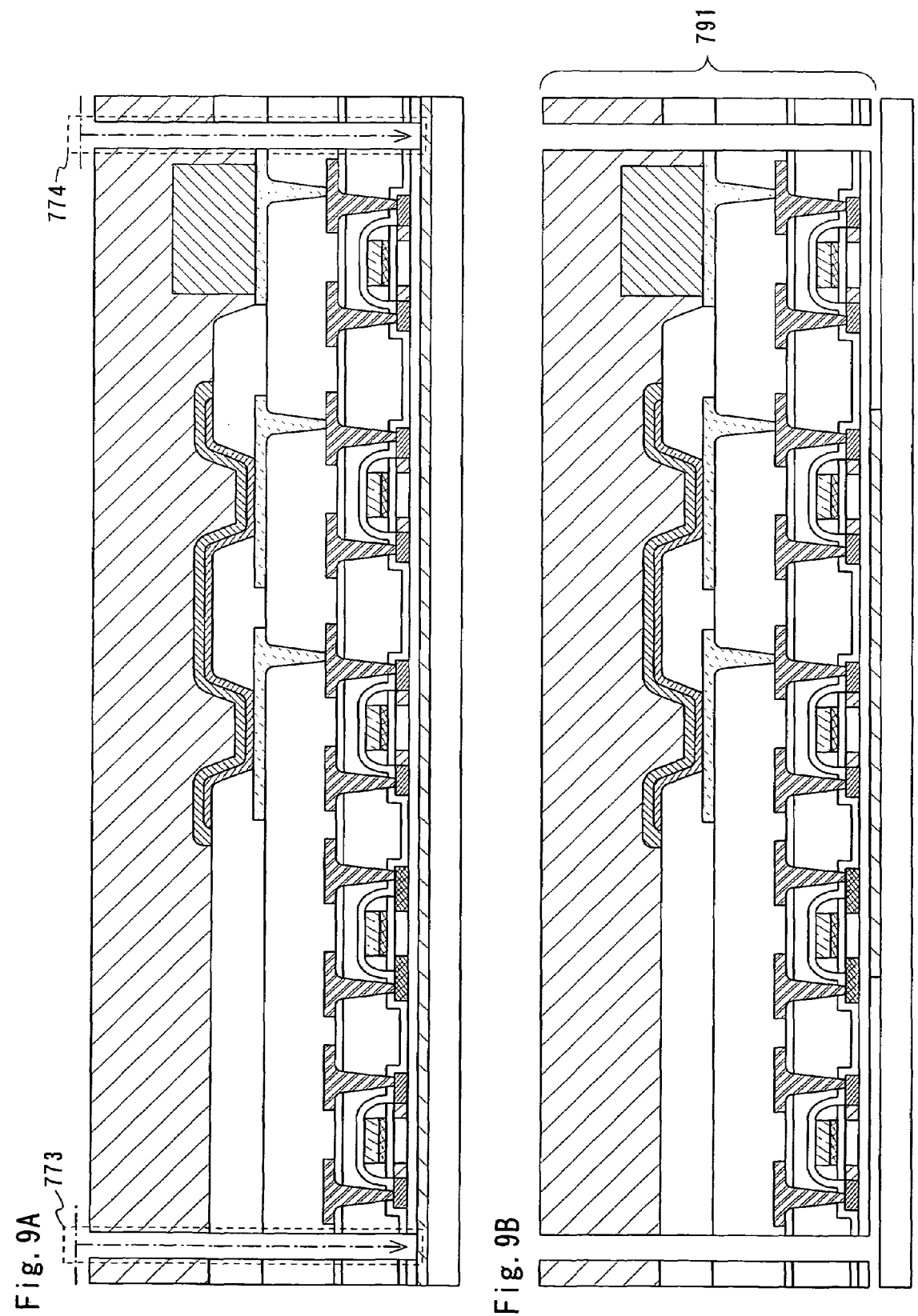

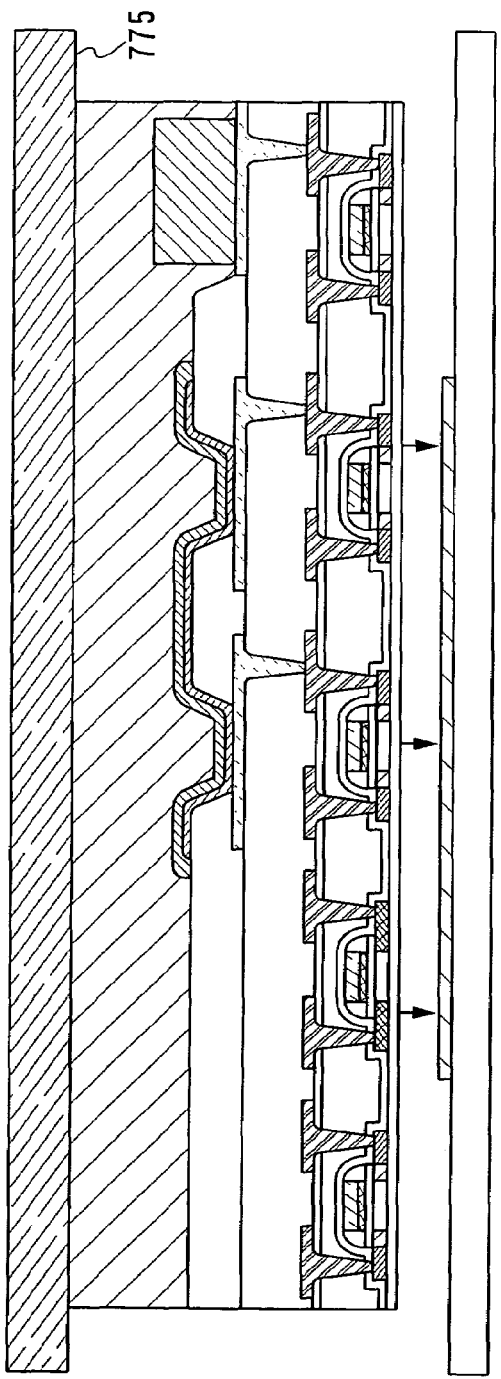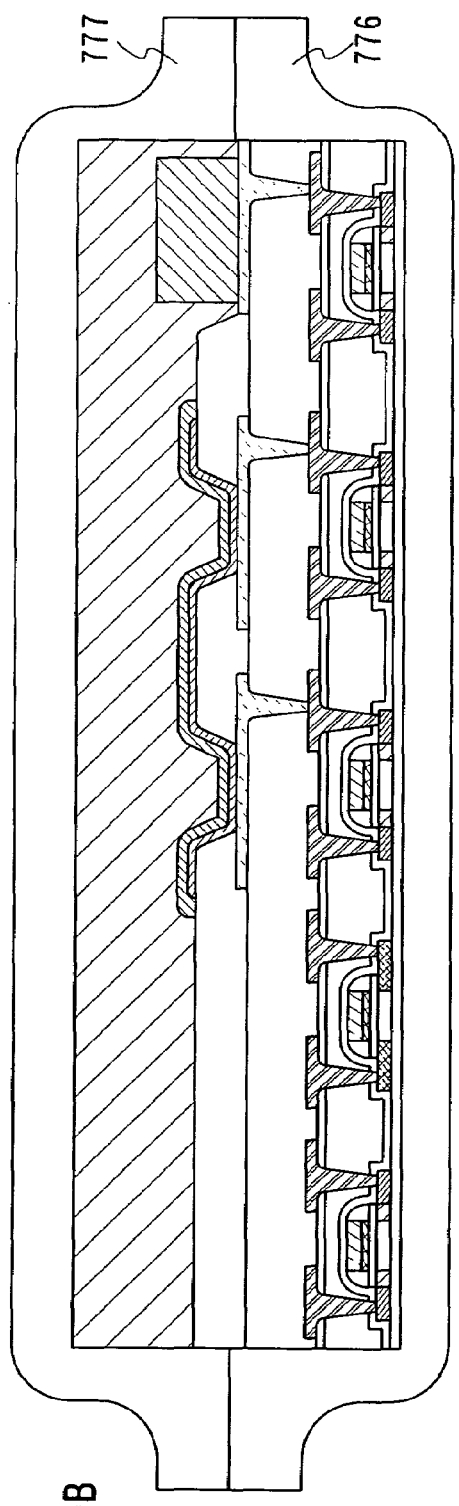
Fig. 10A
Fig. 10B

|  | press. (Pa) | power (W) | time(sec) |
|---|---|---|---|
| Condition 1 | 240 | 50 | 60 |
| Condition 2 | 240 | 1000 | 60 |
| Condition 3 | 20 | 50 | 60 |
| Condition 4 | 20 | 1000 | 60 |
| Condition 5 | 100 | 200 | 60 |
| Condiiton 6 | 100 | 200 | 180 |

| Dinitride Monooxide Plasma Condition | Condition 1 | | | Condition 2 | | | Condition 3 | | | Condition 4 | | | Condition 5 | | | Condition 6 | | |
|---|---|---|---|---|---|---|---|---|---|---|---|---|---|---|---|---|---|---|
| Pressure (Pa) | 240 | | | 240 | | | 20 | | | 20 | | | 100 | | | 100 | | |
| Electric Power (W) | 50 | | | 1000 | | | 50 | | | 1000 | | | 200 | | | 200 | | |
| Treatment Time (sec) | 60 | | | 60 | | | 60 | | | 60 | | | 60 | | | 180 | | |
| Stage Speed (m/sec) / Laser Output (W) | 0.2 | 0.35 | 0.5 | 0.2 | 0.35 | 0.5 | 0.2 | 0.35 | 0.5 | 0.2 | 0.35 | 0.5 | 0.2 | 0.35 | 0.5 | 0.2 | 0.35 | 0.5 |
| 18.4 | x | ◎ | △ | x | x | △ | x | x△ | △ | x | x | x | x | x | x | x | x | △ |
| 18 | x | ◎ | △ | x | x | △ | x | x△ | △ | x | x | x | x | x | x | x | x | △ |
| 17.5 | x | ◎ | △ | x | x | △ | x | x△ | △ | x | x | x | x | x | x | x | ◎ | △ |
| 17 | x | ◎ | △ | x | x | △ | x | x | △ | x | x | x | x | x | x | x | ◎ | △ |
| 16.5 | x | ◎ | △ | x | x | △ | ◎ | △ | △ | x | x | x | x | x | ◎ | x | △ | △ |
| 16 | x | △ | △ | x | x | △ | ◎ | △ | △ | x | x | △ | x | x | ◎ | x | △ | △ |
| 15.5 | ◎ | △ | △ | x | x | △ | ◎ | △ | △ | x | x | △x | x | x | ◎ | x | △ | △ |
| 15 | ◎ | △ | △ | x | x | △ | △ | △ | △ | x | x | △x | x | x | △ | x | △ | △ |
| 14.5 | ◎ | △ | △ | x | x | △ | △ | △ | △ | x | x | △x | x | ◎ | △ | x | △ | △ |
| 14 | ◎ | △ | △ | x | x△ | △ | △ | △ | △ | x | x | △x | x | △ | △ | x | △ | △ |
| 13.5 | ◎ | △ | △ | x | △ | △ | △ | △ | △ | x | x | △x | △ | △ | △ | x△ | △ | △ |
| 13 | ◎ | △ | △ | x△ | △ | △ | △ | △ | △ | x | △ | △x | △ | △ | △ | △ | △ | △ |
| 12.5 | △ | △ | △ | △ | △ | △ | △ | △ | △ | △ | △ | △x | △ | △ | △ | △ | △ | △ |
| Result of Tape Peeling Test | O | | | O | | | O | | | O | | | O | | | O | | | x···Film is splitted.
△···Crystallization is not enough.
◎···Crystallization is possible.

MANUFACTURING METHOD OF SEMICONDUCTOR DEVICE

BACKGROUND OF THE INVENTION

1. Field of Invention

The present invention relates to a manufacturing method of a semiconductor device, and particularly to a method for manufacturing a semiconductor device in which an element forming layer is peeled off a supporting substrate by using a peeling layer provided between the supporting substrate and the element forming layer.

2. Description of the Related Art

In recent years, the necessity of a card mounting an RFID (Radio Frequency Identification) or a tag mounting an RFID which can transmit and receive data without contact has been increased in any fields which need automatic identification such as management of valuable securities and merchandise. The card mounting an RFID reads and writes data from/to an external device via a loop antenna in the card without contact. The card mounting an RFID has larger memory capacity and higher security than a magnetic card that records data by a magnetic recording method. Hence, a mode of the card mounting an RFID applicable to various fields has been proposed recently.

In general, an RFID is constituted by an antenna and an IC chip which is formed of an element forming layer including a transistor group and the like provided over a silicon wafer. In recent years, however, even lower cost and an even thinner type are desired and technological development of an RFID using an element forming layer provided over a glass substrate or the like has been advanced. Furthermore, technological development for reducing the thickness of a substrate part of an element forming layer provided over a glass substrate, or peeling an element forming layer from a glass substrate and transferring it to another supporting substrate has been advanced. Various techniques have been contrived as a method for these.

For example, there are a method of taking out an element forming layer by making a supporting substrate thin by grinding or polishing, a method of removing a supporting substrate by chemical reaction and the like, a method of peeling an element forming layer from a supporting substrate, and the like. As a method of peeling an element forming layer provided over a supporting substrate, for example, there is a known technique that a separating layer formed of amorphous silicon (or polysilicon) is provided, and hydrogen contained in amorphous silicon is released by laser light irradiation through a substrate, thereby a space is generated to separate the supporting substrate (see Patent Document 1). In addition, there is a technique that a peeling layer containing silicon is provided between an element forming layer and a supporting substrate, and the peeling layer is removed by using a gas containing halogen fluoride to separate the element forming layer from the supporting substrate (see Patent Document 2). As described above, there are many methods for separating an element forming layer provided over a supporting substrate.

[Patent Document 1] Japanese Patent Laid-Open No. Hei 10-125929

[Patent Document 2] Japanese Patent Laid-Open No. Hei 8-254686

However, the methods of removing a supporting substrate by grinding, polishing, or dissolving cause problems like damage due to physical strength such as stress and vibration, and contamination. Furthermore, according to such methods, it is quite difficult to reuse a substrate and the cost is increased.

In the case where an element forming layer provided over a supporting substrate is separated by removing a peeling layer provided between the supporting substrate and the element forming layer, the quality of the peeling layer becomes important. That is, time required for removing the peeling layer is affected by a material used for the peeling layer and an etchant used for removing the peeling layer. In addition, in the case where an element forming layer constituted by a thin film transistor and the like is provided over a peeling layer, the property of the transistor may be affected and the reliability of a semiconductor device may be decreased depending on a material or the film quality of the peeling layer.

SUMMARY OF THE INVENTION

In view of the foregoing problem, it is an object of the present invention to provide a method for manufacturing a semiconductor device with high reliability, at low cost.

In order to solve the foregoing problem, the following means is used in the invention.

One feature of a manufacturing method of a semiconductor device of the invention is to include the steps of: forming a metal film over a substrate; performing a plasma treatment or a heat treatment on the metal film in a specific gas atmosphere to form a film made of metal oxide, metal nitride or metal nitride oxide on a surface of the metal film; forming an insulating film such as silicon nitride, silicon oxide or silicon nitride oxide over the film made of metal oxide, metal nitride or metal nitride oxide; forming an element forming layer over the insulating film; forming an insulating film over the element forming layer; forming an opening in the insulating film and the element forming layer; introducing an etchant into the opening to remove the metal film and the film made of metal oxide, metal nitride or metal nitride oxide; and peeling the element forming layer from the substrate. It is to be noted that the element forming layer in the invention includes at least a thin film transistor (TFT) group. Various kinds of integrated circuits such as a CPU (Central Processing Unit), a memory, and a microprocessor can be provided by using the thin film transistor group. In addition, the element forming layer may have a mode having an antenna in addition to the thin film transistor. For example, the element forming layer constituted by a thin film transistor group is operated by using an AC voltage generated at an antenna, and data can be transmitted to a reader/writer by modulating an AC voltage applied to the antenna. It is to be noted that the antenna may be formed together with the thin film transistor group, or may be formed separately from the thin film transistor and provided so as to be electrically connected to the thin film transistor later.

Another feature of a manufacturing method of a semiconductor device of the invention is to include the steps of: forming a metal film over a substrate; performing a plasma treatment or a heat treatment on the metal film in a specific gas atmosphere to form a film made of metal oxide, metal nitride or metal nitride oxide on a surface of the metal film; forming an insulating film such as a silicon nitride, silicon oxide or silicon nitride oxide over the film made of metal oxide, metal nitride or metal nitride oxide; forming an element forming layer over the insulating film; forming an insulating film over the element forming layer; forming an opening in the insulating film and the element forming layer; introducing an etchant into the opening to remove the metal film and the film made of metal oxide, metal nitride or metal nitride oxide so as to leave at least a part thereof; and peeling the element forming layer from the substrate by a physical means. It is to be noted that the physical means is a means recognized not by chemistry but by physics, which specifically means a dynamic means or a mechanical means having a process applicable to Law of Dynamics and a means of changing some sort of dynamic energy (mechanical energy). That is, peeling using the physical means is to peel by an external shock (stress) using a human hand, pressure of a gas emitted from a nozzle, ultrasonic waves, a load using a wedge-shaped member, or the like.

Of methods for forming a layer made of metal oxide, metal nitride or metal nitride oxide on a metal film surface, an explanation in principle of the formation using a plasma treatment will be made here, and a similar concept also applies to a heat treatment.

It is easily predicted that a metal element in the vicinity of a metal film surface reacts chemically with an element constituting plasma by applying a plasma treatment to the metal film surface in a single gas atmosphere constituted by a single element or in a mixture gas atmosphere constituted by a plurality of gases. For example, metal oxide is formed when a metal film surface is treated with plasma in a single oxygen gas atmosphere, and metal nitride is formed when a metal film surface is treated with plasma in a single nitrogen gas atmosphere. In the invention, a metal film surface is treated with plasma in a single dinitrogen monoxide gas atmosphere or in a mixture gas atmosphere of dinitrogen monoxide and argon or the like, so it is easily predicted that a metal element in the vicinity of the surface reacts chemically with a nitrogen element and an oxygen element in plasma. Because of this, it is predicted that metal oxide, metal nitride or metal nitride oxide starts to be formed over the metal film surface or in the vicinity of the surface right after a plasma treatment is started, and that a layer made of metal oxide, metal nitride or metal nitride oxide is formed as the plasma treatment time passes. A state of the layer made of metal oxide, metal nitride or metal nitride oxide in this state is referred to as a first state.

As for the first state, it is predicted that values from a macroscopic and microscopic perspective of composition, hardness, film thickness, bonding state, crystallinity, orientation condition, alignment condition, density or the like of a layer made of metal oxide, metal nitride or metal nitride oxide, and information of continuity and discontinuity of properties from a microscopic perspective change according to conditions such as energy amount for exciting plasma used for the treatment in a single gas atmosphere or in a mixture gas atmosphere, vacuum degree, gas supplying amount, treatment time, structure of a container for generating plasma. In addition, a cohesion seen from a macroscopic perspective of the layer made of metal oxide, metal nitride or metal nitride oxide in the first state is referred to as a first cohesion. Furthermore, an adhesion of the metal layer to the layer made of metal oxide, metal nitride or metal nitride oxide in the first state is referred to as a first lower interface adhesion.

In the invention, over the layer made of metal oxide, metal nitride or metal nitride oxide in the first state, an insulating film such as a silicon nitride film, a silicon oxide film or a silicon nitride oxide film is formed successively. At this time, it is predicted that an element constituting a gas species used for formation at the initial stage of formation reacts chemically with the layer made of metal oxide, metal nitride or metal nitride oxide. It is predicted that the state which is newly changed by this reaction is different from the first state, and the state of the layer made of metal oxide, metal nitride or metal nitride oxide in this state is referred to as a second state. In addition, a cohesion seen from a macroscopic perspective of the layer made of metal oxide, metal nitride or metal nitride oxide in the second state is referred to as a second cohesion. Furthermore, an adhesion of the metal layer to the layer made of metal oxide, metal nitride or metal nitride oxide in the second state is referred to as a second lower interface adhesion, and adhesion of the layer made of metal oxide, metal nitride or metal nitride oxide to the insulating film such as the silicon nitride film, the silicon oxide film or the silicon nitride oxide film is referred to as a second upper interface adhesion.

As for a formation method of the silicon nitride film, the silicon oxide film or the silicon nitride oxide film formed over the layer made of metal oxide, metal nitride or metal nitride oxide, CVD (Chemical Vapor Deposition) using a monosilane gas or a dinitrogen monoxide gas, for example, may be used. Alternatively, any thin film forming method such as a sputtering method using a dinitrogen monoxide gas alone or a mixture gas of a dinitrogen monoxide gas and an argon gas, and using silicon as a target, or the like may be used.

As an element forming layer is formed over the insulating film or processed later, the structure in the second state is expected to change, and the physical or the mechanical state is expected to change. And, the state of the layer made of metal oxide, metal nitride or metal nitride oxide when the element forming layer is peeled ultimately from the substrate by a physical means is referred to as an N-th state. Furthermore, a cohesion seen from a macroscopic perspective of the layer made of metal oxide, metal nitride or metal nitride oxide in the N-th state is referred to as an N-th cohesion. Furthermore, adhesion of the metal layer to the layer made of metal oxide, metal nitride or metal nitride oxide in the Nth state is referred to as an Nth lower interface adhesion, and adhesion of the layer made of metal oxide, metal nitride or metal nitride oxide to the insulating film such as the silicon nitride film, the silicon oxide film or the silicon nitride oxide film is referred to as an Nth upper interface adhesion.

In the case where the whole films are subjected to energy of which the amount corresponds to these changes under the influence of various processes, structure changes or the like, occurring before reaching the Nth state, it is predicted that energy relaxation occurs locally in a point where the composition is discontinuous or in the neighborhood of the point, a point where regularity of the bonding state is discontinuous or neighborhood of the point, in another example, and a point where the density is changed or the neighborhood of the point, in even another example or the like, seen from a microscopic perspective, in the layer made of metal oxide, metal nitride or metal nitride oxide. A good representative example of the phenomenon in which energy from outside is locally relaxed is an earthquake which occurs responding to crust movement or ground movement. The point where energy is relaxed is a point which is most easily changed structurally (a geotectonic line, in the case of an earthquake), and the layer made of metal oxide, metal nitride or metal nitride oxide is expected to correspond to this in this case. It is known that there is a plurality of compositions, bonding states or the like of the layer made of metal oxide, metal nitride or metal nitride oxide, so they fluctuate relatively easily.

A peeling phenomenon in the N-th state occurs when a physical or mechanical strength to cause the peeling exceeds the N-th cohesion (a physical or mechanical strength) of the layer where peeling occurs or the adhesion (a physical or mechanical strength) in the neighborhood of the layer where peeling occurs (the N-th lower interface or the N-th upper interface). Therefore, it is acceptable if the mechanical strength of the layer where peeling occurs is lower than the physical or mechanical strength to cause peeling, by the time when a physical means is used.

Explanation of a plasma treatment as a means for forming a layer made of metal oxide, metal nitride or metal nitride oxide over a metal film surface is made, and the same can be expected for a heat treatment also.

Another feature of a manufacturing method of a semiconductor device of the invention is to include the steps of: forming a metal film over a substrate; performing a plasma treatment on the metal film in a dinitrogen monoxide atmosphere to form a metal oxide film on a surface of the metal film; forming an element forming layer over the metal oxide film; forming an insulating film over the element forming layer; and peeling the element forming layer from the substrate.

Another feature of a manufacturing method of a semiconductor device of the invention is to include the steps of: forming a metal film over a substrate; performing a plasma treatment on the metal film in a mixture gas atmosphere of dinitrogen monoxide and argon to form a metal oxide film on a surface of the metal film; forming an element forming layer over the metal oxide film; forming an insulating film over the element forming layer; and peeling the element forming layer from the substrate.

Another feature of a manufacturing method of a semiconductor device of the invention is to include the steps of: forming a metal film over a substrate; performing a plasma treatment on the metal film in a dinitrogen monoxide atmosphere to form a metal oxide film on a surface of the metal film; forming a first insulating film over the metal oxide film continuously without being exposed to the air; forming an element forming layer over the first insulating film; forming a second insulating film over the element forming layer; and peeling the element forming layer from the substrate.

Another feature of a manufacturing method of a semiconductor device of the invention is to include the steps of: forming a metal film over a substrate; performing a plasma treatment on the metal film in a mixture gas atmosphere of dinitrogen monoxide and argon to form a metal oxide film on a surface of the metal film; forming a first insulating film over the metal oxide film continuously without being exposed to the air; forming an element forming layer over the first insulating film; forming a second insulating film over the element forming layer; and peeling the element forming layer from the substrate.

Another feature of a manufacturing method of a semiconductor device of the invention is to include the steps of: forming a metal film over a substrate; performing a plasma treatment on the metal film in an atmosphere including dinitrogen monoxide to form a metal oxide film on a surface of the metal film; forming a first insulating film over the metal oxide film; forming an element forming layer having a semiconductor film over the first insulating film; forming a second insulating film over the element forming layer; and peeling the element forming layer from the substrate, wherein the laminated metal oxide film, first insulating film and semiconductor film are formed continuously without being exposed to the air.

Another feature of a manufacturing method of a semiconductor device of the invention is to include the steps of: forming a metal film over a substrate; performing a plasma treatment on the metal film in a dinitrogen monoxide atmosphere to form a metal oxide film on a surface of the metal film; forming an element forming layer over the metal oxide film; forming an insulating film over the element forming layer; forming an opening in the insulating film and the element forming layer; introducing an etchant into the opening to remove the metal film and the metal oxide film; and peeling the element forming layer from the substrate.

Another feature of a manufacturing method of a semiconductor device of the invention is to include the steps of: forming a metal film over a substrate; performing a plasma treatment on the metal film in a dinitrogen monoxide atmosphere to form a metal oxide film on a surface of the metal film; forming an element forming layer over the metal oxide film; forming an insulating film over the element forming layer; forming an opening in the insulating film and the element forming layer; introducing an etchant into the opening to remove the metal film and the metal oxide film so as to leave at least a part thereof; and peeling the element forming layer from the substrate by a physical means.

Another feature of a manufacturing method of a semiconductor device of the invention is to include the steps of: forming a metal film over a substrate; performing a plasma treatment on the metal film in a mixture gas atmosphere of dinitrogen monoxide and argon to form a metal oxide film on a surface of the metal film; forming an element forming layer over the metal oxide film; forming an insulating film over the element forming layer; forming an opening in the insulating film and the element forming layer; introducing an etchant into the opening to remove the metal film and the metal oxide film; and peeling the element forming layer from the substrate.

Another feature of a manufacturing method of a semiconductor device of the invention is to include the steps of: forming a metal film over a substrate; performing a plasma treatment on the metal film in a mixture gas atmosphere of dinitrogen monoxide and argon to form a metal oxide film on a surface of the metal film; forming an element forming layer over the metal oxide film; forming an insulating film over the element forming layer; forming an opening in the insulating film and the element forming layer; introducing an etchant into the opening to remove the metal film and the metal oxide film so as to leave at least a part thereof; and peeling the element forming layer from the substrate by a physical means.

Another feature of a manufacturing method of a semiconductor device of the invention is to include the steps of: forming a metal film over a substrate; performing a plasma treatment on the metal film in an atmosphere including dinitrogen monoxide to form a metal oxide film on a surface of the metal film; forming a first insulating film over the metal oxide film continuously without being exposed to the air; forming an element forming layer over the first insulating film; forming a second insulating film over the element forming layer; forming an opening in the second insulating film and the element forming layer; introducing an etchant into the opening to remove the metal film and the metal oxide film; and peeling the element forming layer from the substrate. The metal oxide film and the first insulating film can be formed continuously without being exposed to the air, so that contaminant such as particles can be prevented from being mixed into an interface between the metal oxide film and the first insulating film. Therefore, defective film formation caused by unevenness due to particles or contaminant can be prevented, and production efficiency and reliability of a semiconductor device can be improved.

The element forming layer may have a structure having a semiconductor film. In this case, the first insulating film and the semiconductor film formed over the first insulating film can be formed continuously without being exposed to the air. Since the first insulating film and the semiconductor film can be formed by a plasma CVD apparatus, they can be formed in the same chamber. Another feature of a manufacturing method of a semiconductor device of the invention is to include the steps of: forming a metal film over a substrate; performing a plasma treatment on the metal film in an atmosphere including dinitrogen monoxide to form a metal oxide film on a surface of the metal film; forming a first insulating film over the metal oxide film; forming an element forming layer including a semiconductor film over the first insulating film; forming a second insulating film over the element forming layer; forming an opening in the second insulating film and the element forming layer; introducing an etchant into the opening to remove the metal film and the metal oxide film; and peeling the element forming layer from the substrate, wherein the laminated first insulating film and semiconductor film are formed continuously without being exposed to the air. The first insulating film and the semiconductor film can be formed continuously without being exposed to the air, so that contaminant such as particles can be prevented from being mixed into an interface between the first insulating film and the semiconductor film. Therefore, defective film formation caused by unevenness due to particles or contaminant can be prevented, and production efficiency and reliability of a semiconductor device can be improved.

Furthermore, the metal oxide film, the first insulating film and the semiconductor film formed over the first insulating film can be formed continuously without being exposed to the air. Since the metal oxide film, the first insulating film and the semiconductor film can be formed by a plasma CVD apparatus, they can be formed in the same chamber. According to another manufacturing method of a semiconductor device of the invention, a metal film is formed over a substrate, a plasma treatment is applied to the metal film in an atmosphere including dinitrogen monoxide to form a metal oxide film on a surface of the metal film, a first insulating film is formed over the metal oxide film, an element forming layer including a semiconductor film is formed over the first insulating film, a second insulating film is formed to cover the element forming layer, an opening is formed in the second insulating film and the element forming layer, the metal film and the metal oxide film are removed by introducing an etchant into the opening, the element forming layer is peeled from the substrate, and the laminated metal oxide film, first insulating film and semiconductor film are formed continuously without being exposed to the air. The metal oxide film, the first insulating film and the semiconductor film can be formed continuously without being exposed to the air, so contaminant such as particles can be prevented from being mixed into interfaces between the metal oxide film, the first insulating film and the semiconductor film. Therefore, defective film formation caused by unevenness due to particles or contaminant can be prevented, and production efficiency and reliability of a semiconductor device can be improved.

Another feature of a manufacturing method of a semiconductor device of the invention is to include the steps of: forming a metal film over a substrate; performing a plasma treatment on the metal film in a dinitrogen monoxide atmosphere to form a metal oxide film on a surface of the metal film; forming a first insulating film over the metal oxide film continuously without being exposed to the air; forming an element forming layer over the first insulating film; forming a second insulating film over the element forming layer; forming an opening in the second insulating film and the element forming layer; introducing an etchant into the opening to remove the metal film and the metal oxide film so as to leave at least a part thereof; and peeling the element forming layer from the substrate by a physical means.

Another feature of a manufacturing method of a semiconductor device of the invention is to include the steps of: forming a metal film over a substrate; performing a plasma treatment on the metal film in a mixture gas atmosphere of dinitrogen monoxide and argon to form a metal oxide film on a surface of the metal film; forming a first insulating film over the metal oxide film continuously without being exposed to the air; forming an element forming layer over the first insulating film; forming a second insulating film over the element forming layer; forming an opening in the second insulating film and the element forming layer; introducing an etchant into the opening to remove the metal film and the metal oxide film; and peeling the element forming layer from the substrate.

Another feature of a manufacturing method of a semiconductor device of the invention is to include the steps of: forming a metal film over a substrate; performing a plasma treatment on the metal film in a mixture gas atmosphere of dinitrogen monoxide and argon to form a metal oxide film on a surface of the metal film; forming a first insulating film over the metal oxide film continuously without being exposed to the air; forming an element forming layer over the first insulating film; forming a second insulating film over the element forming layer; forming an opening in the second insulating film and the element forming layer; introducing an etchant into the opening to remove the metal film and the metal oxide film so as to leave at least a part thereof; and peeling the element forming layer from the substrate by a physical means.

Effects of the Invention

According to the invention, when a semiconductor device is used as an element forming layer, a semiconductor device provided over a thin flexible substrate can be provided at low cost, ultimately. In addition, according to the manufacturing method of a semiconductor device of the invention, a semiconductor device with high reliability can be obtained.

BRIEF DESCRIPTION OF THE DRAWINGS

FIGS. 6A to 6C are diagrams showing a manufacturing method of a semiconductor device of the invention.

FIGS. 7A and 7B are diagrams showing a manufacturing method of a semiconductor device of the invention.

FIGS. 8A and 8B are diagrams showing a manufacturing method of a semiconductor device of the invention.

FIGS. 9A and 9B are diagrams showing a manufacturing method of a semiconductor device of the invention.

FIGS. 10A and 10B are diagrams showing a manufacturing method of a semiconductor device of the invention.

FIG. 17 is a diagram illustrating an embodiment of a semiconductor device of the invention.

FIG. 18 is a diagram illustrating an embodiment of a semiconductor device of the invention.

DETAILED DESCRIPTION OF THE INVENTION

Figure 1A:
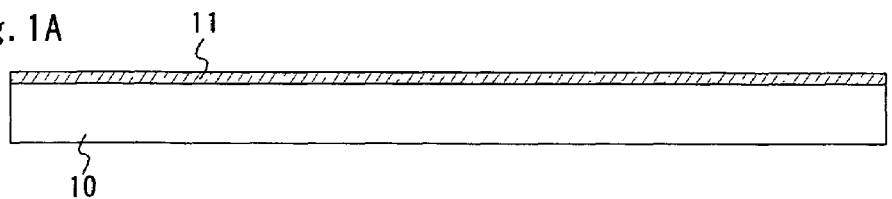
FIGS. 1A to 1E are diagrams showing a manufacturing method of a semiconductor device of the invention.

Embodiment modes and embodiments of the invention will be described hereinafter, with reference to the drawings. However, the invention is not limited to the following description, and it is easily understood by those skilled in the art that the modes and details can be changed in various ways without departing from the spirit and scope of the invention. Therefore, the invention is not interpreted as being limited to the following description. In the structure of the invention described hereinafter, reference numerals indicating the same things are used in common in different drawings.

Embodiment Mode 1

In this embodiment mode, one example of a manufacturing method of a semiconductor device of the invention is described with reference to drawings.

First, a metal film 11 is formed on a surface of a substrate 10 (FIG. 1A). The metal film 11 may be formed as a single layer or a plurality of layers laminated. For example, a tungsten (W) film is formed by a sputtering method. It is to be noted that an insulating film may be provided over the substrate 10 before the metal film 11 is formed. In particular, it is preferable to provide an insulating film between the substrate 10 and the metal film 11 when the contamination from the substrate may occur.

Figure 1B:
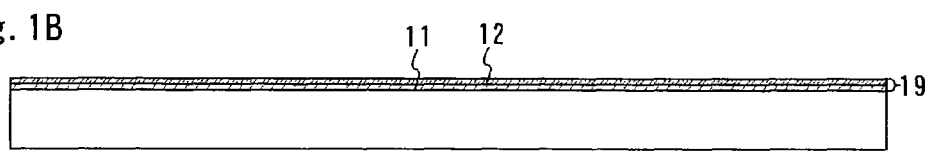

Next, a plasma treatment is applied to the metal film 11 in an atmosphere of dinitrogen monoxide alone or a mixture gas atmosphere of dinitrogen monoxide and another gas to form a film 12 made of metal oxide, metal nitride or metal nitride oxide on a surface of the metal film 11 (FIG. 1B). The film 12 made of metal oxide, metal nitride or metal nitride oxide is formed of chemical reaction product with a metal element constituting the metal film 11. For example, when a tungsten film is used as the metal film 11, a film made of tungsten oxide, tungsten nitride or tungsten nitride oxide is formed as the film 12 made of metal oxide, metal nitride or metal nitride oxide on a surface of the tungsten film by performing a plasma treatment. It is to be noted in this embodiment mode that a layer structured by the metal film 11 and the film 12 made of metal oxide, metal nitride or metal nitride oxide is called a peeling layer 19.

Figure 1C:
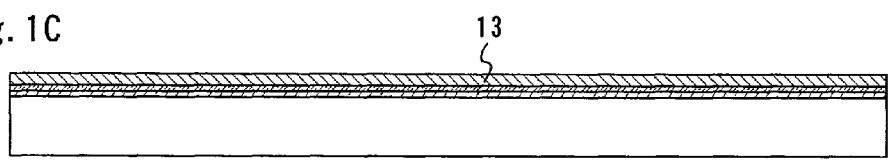

Next, an insulating film 13 is formed over the film 12 made of mental oxide, metal nitride or metal nitride oxide (FIG. 1C). The insulating film 13 may be formed as a single layer or a laminated layer of a plurality of films.

Figure 1D:
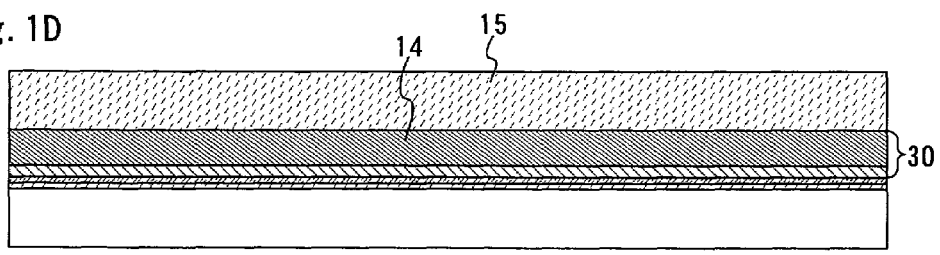

Next, a layer 14 constituted by a thin film transistor and the like (hereinafter also referred to as a TFT layer 14) is formed over the insulating film 13. It is to be noted in this embodiment mode that a layer including the insulating film 13 and the TFT layer 14 is called an element forming layer 30. Then, an insulating film 15 is formed as a protective film to cover the element forming layer 30 (FIG. 1D). The insulating film 15 is preferably formed to cover side surfaces of the element forming layer 30. In addition, although the insulating film 15 is provided over the entire surface to cover the element forming layer 30 in this embodiment mode, it is not necessarily required to be provided over the entire surface and may be provided selectively.

Figure 1E:
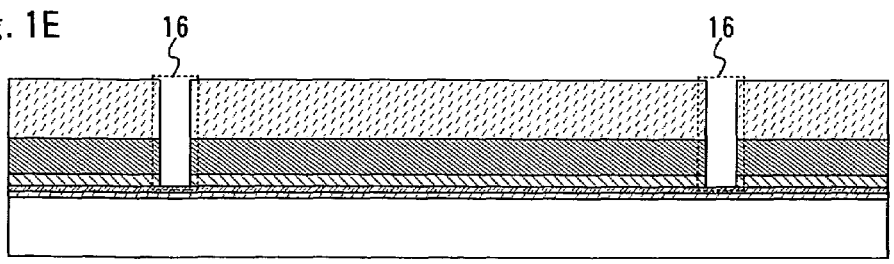

Next, an opening 16 is formed in the insulating film 15 and the element forming layer 30 to expose the peeling layer 19 (FIG. 1E). The opening 16 is preferably provided in a region where the thin film transistor or the like included in the element forming layer 30 is not provided, or in an edge of the substrate 10. It is to be noted that the opening 16 can be formed by laser light irradiation, or grinding or cutting an end surface of a sample.

Figure 2A:
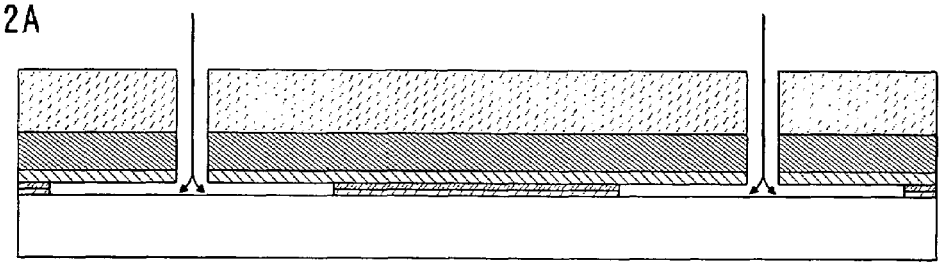
FIGS. 2A to 2D are diagrams showing a manufacturing method of a semiconductor device of the invention.

Next, an etchant is introduced into the opening 16 to selectively remove the peeling layer 19 (FIG. 2A). The peeling layer 19 may be removed entirely or may be removed so as to leave a part thereof. By leaving a part of the peeling layer 19, the element forming layer 30 can be retained at the substrate 10 after the peeling layer is removed. In addition, when the treatment is performed while leaving a part of the peeling layer 19, consumption of the etchant can be reduced and treatment time can be shortened, which leads to the cost reduction and high efficiency.

Figure 2B:
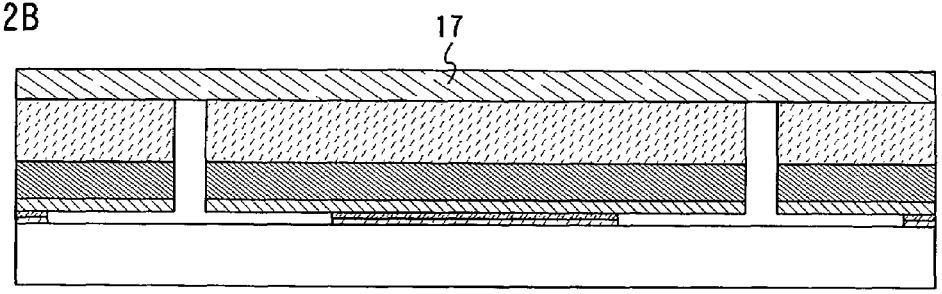

Next, a first sheet material 17 is provided over the insulating film 15 (FIG. 2B). At least one surface of the first sheet material 17 has adhesiveness, and it is bonded to the element forming layer 30.

Figure 2C:
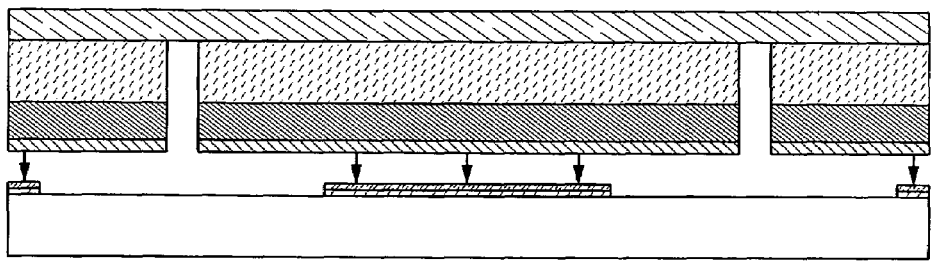

Next, the element forming layer 30 is peeled from the substrate 10 (FIG. 2C). In the case where the peeling layer 19 is partially left between the substrate 10 and the element forming layer 30, the element forming layer 30 is peeled from the substrate 10 by a physical means. In this case, since the peeling layer 19 provided by the above-described method is used, a certain degree of process has been over and the structure has been changed by the time when peeling is to be performed, so adhesion between the element forming layer 30 and the peeling layer 19 has been decreased. Therefore, the element forming layer 30 can be easily peeled from the substrate 10 even by a physical means.

Figure 2D:
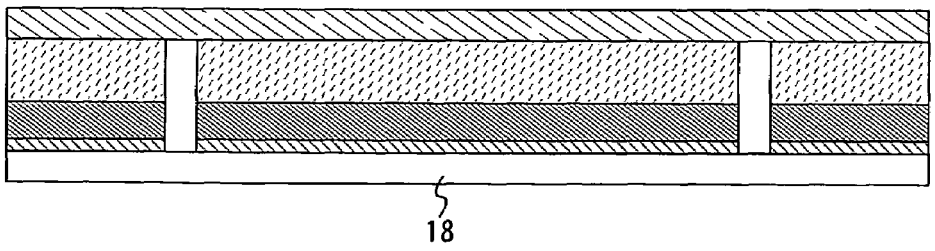

Next, a second sheet material 18 is provided on the surface of the element forming layer 30 peeled from the substrate 10 (FIG. 2D). The second sheet material 18 is provided by performing one or both of a heat treatment and a pressure treatment after being attached to the element forming layer 30. By providing the second sheet material, the strength of the element forming layer 30 is enhanced and moisture, contaminant, and the like can be prevented from entering. It is to be noted that a similar sheet material to the second sheet material may be provided on the opposite side to the side provided with the second sheet material of the element forming layer in order to seal. In this case, when manufacturing a semiconductor device thinner, the sealing is preferably performed by newly providing a sheet material after the first sheet material is removed.

As a result of the above-described steps, a flexible semiconductor device can be manufactured. Hereinafter, a material and the like in each step are described specifically.

As the substrate 10, a glass substrate, a quartz substrate, a metal substrate, a stainless steel substrate with an insulating film formed on the surface, a plastic substrate having heat resistance against the treatment temperature of this step, or the like can be used. In the case of using the above-described substrates, an area and a shape thereof are not restricted so much; therefore, by using a rectangular substrate with at least one meter on a side, for example, the productivity can be drastically improved. This merit is greatly advantageous as compared to the case of using a circular silicon substrate. In addition, since the peeled substrate 10 can be reused in this embodiment mode, a semiconductor device can be manufactured at lower cost. There is such a merit that even in the case of using a quartz substrate of which cost is high, a semiconductor device can be manufactured at low cost by using the quartz substrate repeatedly.

The metal film 11 is formed as a single layer or a laminated layer of a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), an alloy material or a compound material containing the above-described element as its main component. In addition, these materials can be formed by using a known method (a sputtering method or various kinds of CVD methods such as a plasma CVD method).

The insulating film provided between the substrate 10 and the metal film 11 can have a single layer structure or a laminated layer structure of an insulating film containing oxygen or nitrogen such as silicon oxide (SiOx), silicon nitride (SiNx), silicon oxynitride (SiOxNy) (x>y), and silicon nitride oxide (SiNxOy) (x>y). These insulating films can be formed by using a known method (a sputtering method or various kinds of CVD methods such as a plasma CVD method).

The film 12 made of metal oxide, metal nitride or metal nitride oxide is formed on a surface of the metal film 11 by applying a plasma treatment to the surface of the metal film 11 in a dinitrogen monoxide atmosphere. For example, when a tungsten film is formed as the metal film 11 by a sputtering method, tungsten oxide, tungsten nitride or tungsten nitride oxide can be formed on a surface of the tungsten film by applying a plasma treatment to the tungsten film in a dinitrogen monoxide atmosphere.

The insulating film 13 can have a single layer structure or a laminated layer structure of an insulating film containing oxygen or nitrogen such as silicon oxide (SiOx), silicon nitride (SiNx), silicon oxynitride (SiOxNy) (x>y), and silicon nitride oxide (SiNxOy) (x>y) by using a known method (a sputtering method, a plasma CVD method, or the like). In the case where the insulating film 13 employs a two-layer structure, for example, a silicon nitride oxide film and a silicon oxynitride film are preferably formed as a first layer and a second layer respectively. In the case where the insulating film 13 employs a three-layer structure, for example, a silicon oxynitride film, a silicon nitride oxide film, and a silicon oxynitride film are preferably formed as a first layer, a second layer, and a third layer respectively. Alternatively, a silicon oxide film, a silicon nitride oxide film and a silicon oxynitride film are preferably formed as a first, a second, and a third insulating film respectively.

The TFT layer 14 includes at least a thin film transistor (TFT) and the like. The TFT layer 14 can be provided with any kind of integrated circuits such as a CPU, a memory, and a microprocessor by using the thin film transistor. In addition, the TFT layer 14 may have a mode having an antenna in addition to the thin film transistor. For example, an integrated circuit constituted by the thin film transistor is operated by using an AC voltage generated at an antenna, and data can be transmitted to a reader/writer by modulating an AC voltage applied to the antenna. It is to be noted that the antenna may be formed together with the thin film transistor, or may be formed separately from the thin film transistor and provided so as to be electrically connected to the thin film transistor later.

It is to be noted that an amorphous semiconductor or a crystalline semiconductor may be used for the thin film transistor; however, if a higher-performance thin film transistor is used, the thin film transistor is preferably formed using a crystalline semiconductor. In this case, an amorphous semiconductor film is formed over the insulating film 13 by a known method (a sputtering method, an LPCVD method, a plasma CVD method, or the like), and the amorphous semiconductor film is crystallized by a known crystallization method (laser crystallization, a thermal crystallization method using RTA or an annealing furnace, a thermal crystallization method using a metal element for promoting crystallization, a method in which the laser crystallization is combined with the thermal crystallization method using a metal element for promoting crystallization, or the like) to form a crystalline semiconductor film.

In addition, a semiconductor film included in the thin film transistor may have any structure; for example, an impurity region (including a source region, a drain region, and an LDD region) may be formed. The thin film transistor may be a p-channel type, an n-channel type, or a CMOS circuit. Furthermore, an insulating film (a sidewall) may be formed so as to contact a side surface of a gate electrode provided above the semiconductor film, and a silicide layer formed of nickel, molybdenum, cobalt, or the like may be formed for one of or both of a gate electrode, and source and drain regions.

The insulating film 15 is formed of a film containing carbon such as DLC (Diamond-Like Carbon), a film containing silicon nitride, a film containing silicon nitride oxide, a film made of a resin material such as epoxy or another organic material, or the like. It is to be noted that such a film can be formed by a known method (a sputtering method, various kinds of CVD methods such as a plasma CVD method, a spin coating method, a droplet discharging method, or a printing method) as the insulating film 15.

As the etchant, a gas or a liquid containing halogen fluoride or an interhalogen compound such as a chlorine trifluoride gas may be used. Besides, $CF_4$, $SF_6$, $NF_3$, $F_2$, or the like may be used.

As the first sheet material 17, a flexible film may be used and at least one surface thereof is provided with an adhesive surface. For example, a sheet material obtained by providing an adhesive onto a base film used as a base material such as polyester can be used. As the adhesive, a resin material including an acrylic resin or the like or a material made of a synthetic rubber material can be used.

As the second sheet material 18, a flexible film can be used; for example, a film formed of polypropylene, polyester, vinyl, polyvinyl fluoride, vinyl chloride, or the like, paper made of a fibrous material, a laminated film of a base material film (polyester, polyamide, inorganic deposition film, paper, or the like) and an adhesive synthetic resin film (an acrylic synthetic resin, an epoxy synthetic resin, or the like), or the like can be used. It is to be noted that the above-described film is attached to a treatment object by performing a heat treatment and a pressure treatment, and the treatments are performed in the following manner; an adhesive layer which is provided on the outermost surface of the film or a layer (not an adhesive layer) which is provided on the outermost layer thereof is melted by a heat treatment, and then pressure is applied, thereby the film is attached. It is to be noted that the element forming layer may be sealed with the first sheet material 17 and the second sheet material 18 by using the above-described materials for the first sheet material.

In this manner, according to this embodiment mode, an element forming layer is provided over a rigid substrate such as a glass substrate, and then the element forming layer is peeled from the substrate, so that a flexible semiconductor device can be manufactured. Furthermore, by employing the method described in this embodiment mode, a peeling layer is formed and peeling is performed, so that a semiconductor device with high reliability can be manufactured at low cost.

Embodiment Mode 2

In this embodiment mode, a manufacturing method of a semiconductor device different from the above embodiment mode is described with reference to drawings.

Figure 4A:
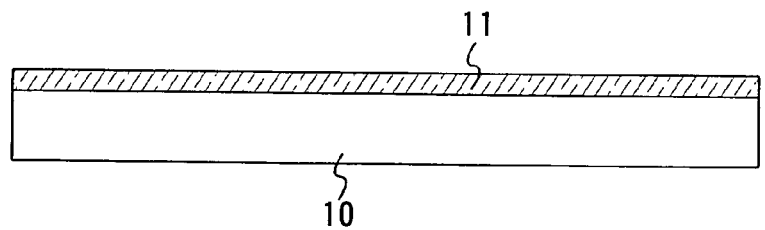
FIGS. 4A and 4B are diagrams showing a manufacturing method of a semiconductor device of the invention.

First, the metal film 11 is formed on a surface of the substrate 10 (FIG. 4A). The metal film 11 may be formed as a single layer or a plurality of layers laminated. For example, a tungsten (W) film is formed by a sputtering method. It is to be noted that an insulating film may be provided over the substrate 10 before the metal film 11 is formed. In particular, it is preferable to provide an insulating film between the substrate 10 and the metal film 11 when the contamination from the substrate may occur.

Figure 4B:
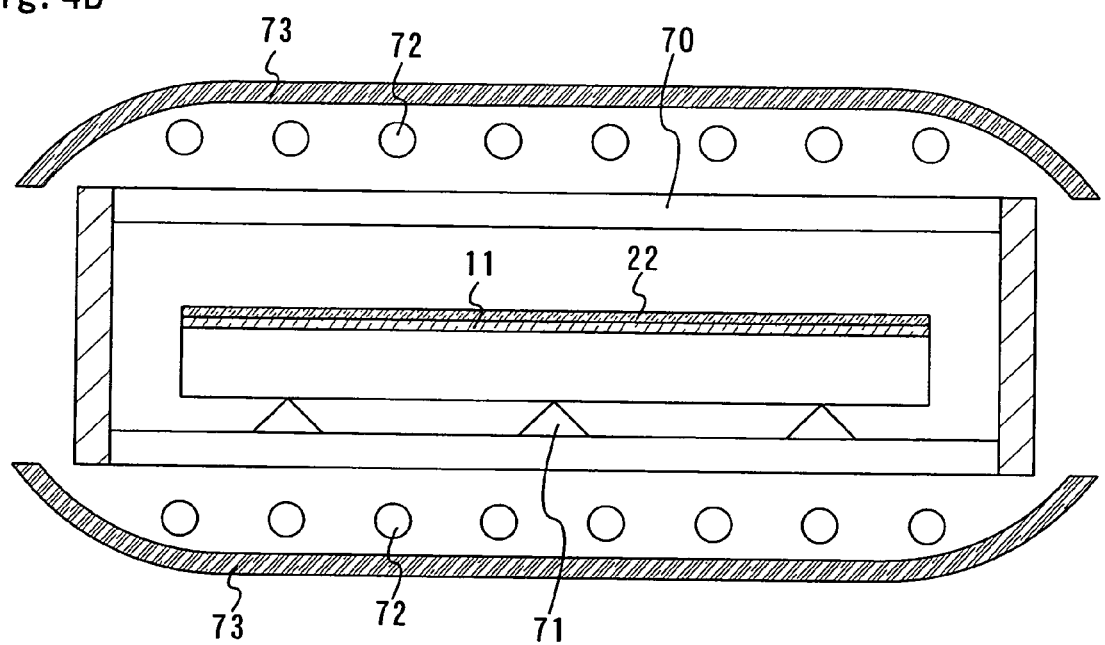

Next, in this embodiment mode, a heat treatment using RTA or an annealing furnace is performed to oxidize, nitride or nitride oxidize the metal film 11 in an atmosphere of dinitrogen monoxide alone or a mixture gas atmosphere of dinitrogen monoxide and another gas, so that a film 22 made of metal oxide, metal nitride or metal nitride oxide is formed on a surface of the metal film 11. Described here is a case where the heat treatment is performed by RTA (FIG. 4B). FIG. 4B shows an apparatus for heating a sample, which has a chamber 70, a supporting base 71, a heat source 72, a heat insulator 73, and the like. As the heat source 72, a heating wire such as a nickel chrome wire (a nichrome wire) or an iron chrome wire, or a lamp such as an infrared lamp or a halogen lamp is used.

First, the substrate 10 provided with the metal film 11 is set over the supporting base 71 in the chamber 70. Then, heat is applied using the heat source 72 to perform a heat treatment onto the metal film 11 in an atmosphere of dinitrogen monoxide alone or a mixture gas atmosphere of dinitrogen monoxide and another gas, so that the film 22 made of metal oxide, metal nitride or metal nitride oxide is formed on the surface of the metal film 11. By controlling the temperature or time of the heat treatment, the thickness of the film 22 made of metal oxide, metal nitride or metal nitride oxide can be adjusted.

It is to be noted that FIG. 4B shows only one example, and any apparatus can be employed as long as a heat treatment is applied onto a metal film formed over a substrate to form a film made of metal oxide, metal nitride or metal nitride oxide on the surface. That is, it is important in this embodiment mode that a film made of metal oxide, metal nitride or metal nitride oxide is formed on a surface of a metal film by performing a heat treatment onto the metal film formed over a substrate. In addition, the substrate may be processed one by one, or a plurality of substrates may be processed simultaneously. In particular, in the case where many substrates are to be processed all at once, a batch annealing furnace can be employed.

After that, similar steps to those described in the above embodiment mode shown in FIGS. 1C to 2D are carried out, so that a semiconductor device can be manufactured.

It is to be noted that this embodiment mode can be implemented freely combining with the above embodiment mode. That is, the materials and the forming method described in the above embodiment mode can be used by freely combining with this embodiment mode.

Embodiment Mode 3

In this embodiment mode, a manufacturing method of a semiconductor device different from the above embodiment modes is described with reference to drawings.

Figure 5A:
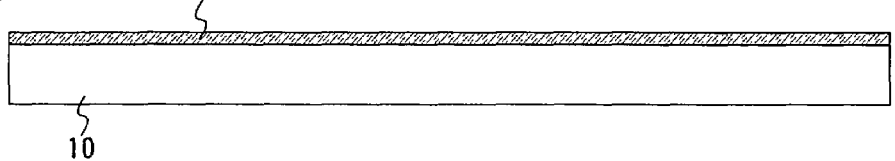
FIGS. 5A to 5E are diagrams showing a manufacturing method of a semiconductor device of the invention.

First, a film 29 made of metal oxide, metal nitride or metal nitride oxide is formed on a surface of the substrate 10 by a sputtering method in an atmosphere of dinitrogen monoxide alone or a mixture gas atmosphere of dinitrogen monoxide and another gas (FIG. 5A). For example, the sputtering is performed using tungsten as a target in an atmosphere of dinitrogen monoxide alone or a mixture gas atmosphere of dinitrogen monoxide and argon to form a film made of tungsten oxide ($WO_x$), tungsten nitride ($WN_x$) or tungsten nitride oxide ($WN_xO_y$) over the substrate 10. Besides tungsten, the film 29 made of metal oxide, metal nitride or metal nitride oxide may be formed as a single layer or a laminated layer of a film using an element selected from molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), an alloy material or a compound material containing the above-described element as its main component. Silicon (Si) may be included in the above-described materials.

Figure 5B:
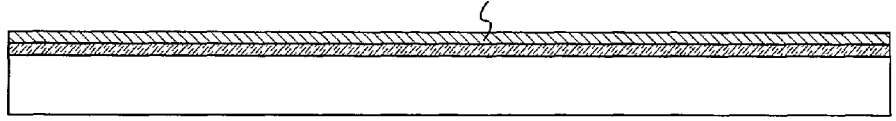

Next, the insulating film 13 is formed over the film 29 made of metal oxide, metal nitride or metal nitride oxide (FIG. 5B). The insulating film 13 may be formed as a single layer or formed of a plurality of layers laminated.

Figure 5C:
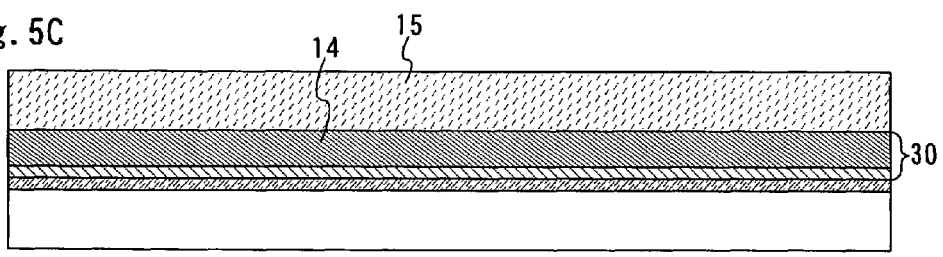

Next, the layer 14 constituted by a thin film transistor and the like (the TFT layer 14) is formed over the insulating film 13. It is to be noted in this embodiment mode that a layer structured by the insulating film 13 and the TFT layer 14 is called the element forming layer 30 for convenience. Then, the insulating film 15 is formed as a protective film to cover the element forming layer 30 (FIG. 5C). It is preferable that the insulating film 15 is formed so as to cover side surfaces of the element forming layer 30. In addition, although the insulating film 15 is provided over the entire surface to cover the element forming layer 30 in this embodiment mode, it is not necessarily provided over the entire surface and may be provided selectively.

Figure 5D:
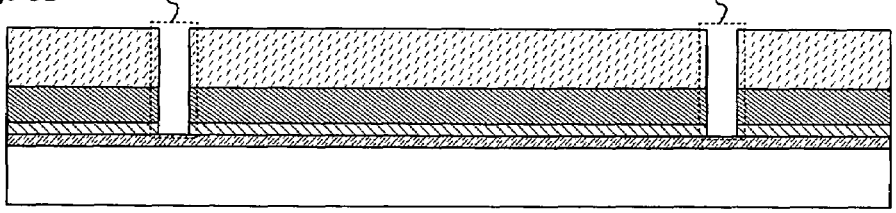

Next, the opening 16 is formed in the insulating film 15 and the element forming layer 30 to expose the film 29 made of metal oxide, metal nitride or metal nitride oxide (FIG. 5D). The opening 16 is preferably provided in a region where the thin film transistor or the like constituting the element forming layer 30 is not provided, or in an edge of the substrate 10. It is to be noted that the opening 16 can be formed by laser light irradiation, or grinding or cutting an end surface of a sample.

Figure 5E:
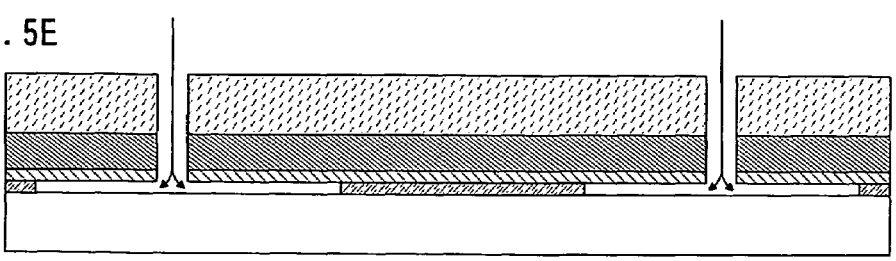

Next, an etchant that is for example halogen fluoride such as a chlorine trifluoride gas is introduced into the opening 16 to selectively remove the film 29 made of metal oxide, metal nitride or metal nitride oxide (FIG. 5E). The film 29 made of metal oxide, metal nitride or metal nitride oxide may be removed entirely or may be removed so as to leave a part thereof. By leaving a part of the film 29 made of metal oxide, metal nitride or metal nitride oxide, the element forming layer 30 can be retained at the substrate 10 after the film 29 made of metal oxide, metal nitride or metal nitride oxide is removed. In addition, when the treatment is performed while leaving a part of the film 29 made of metal oxide, metal nitride or metal nitride oxide, consumption of the etchant can be reduced and time required for the treatment can be shortened, which leads to the cost reduction and high efficiency.

After that, a first sheet material may be provided over the element forming layer 30 to separate the element forming layer 30 from the substrate 10 as described in the above embodiment mode. In this embodiment mode, the film 29 made of metal oxide, metal nitride or metal nitride oxide functions as a peeling layer.

It is to be noted that the film 29 made of metal oxide, metal nitride or metal nitride oxide is formed directly over the substrate 10 by sputtering in an atmosphere of dinitrogen monoxide alone or a mixture gas atmosphere of dinitrogen monoxide and another gas in this embodiment mode; however, a metal film may be formed over the substrate 10 in advance, and then the film 29 made of metal oxide, metal nitride or metal nitride oxide may be provided over the metal film. In this case, respective metal elements contained in the metal film and the film made of metal oxide, metal nitride or metal nitride oxide may be different.

It is to be noted that this embodiment mode can be implemented freely combining with the above embodiment modes. That is, the materials and the forming methods described in the above embodiment modes can be used by freely combining with this embodiment mode.

Embodiment Mode 4

In the above embodiment modes, an example in which a metal film, a film made of metal oxide, metal nitride or metal nitride oxide, an insulating film, and an amorphous semiconductor film of a thin film transistor included in an element forming layer are formed sequentially is described. Described in this embodiment mode with reference to drawings is a case where a conductive film, an insulating film, and a semiconductor film are formed continuously.

Figure 3A:
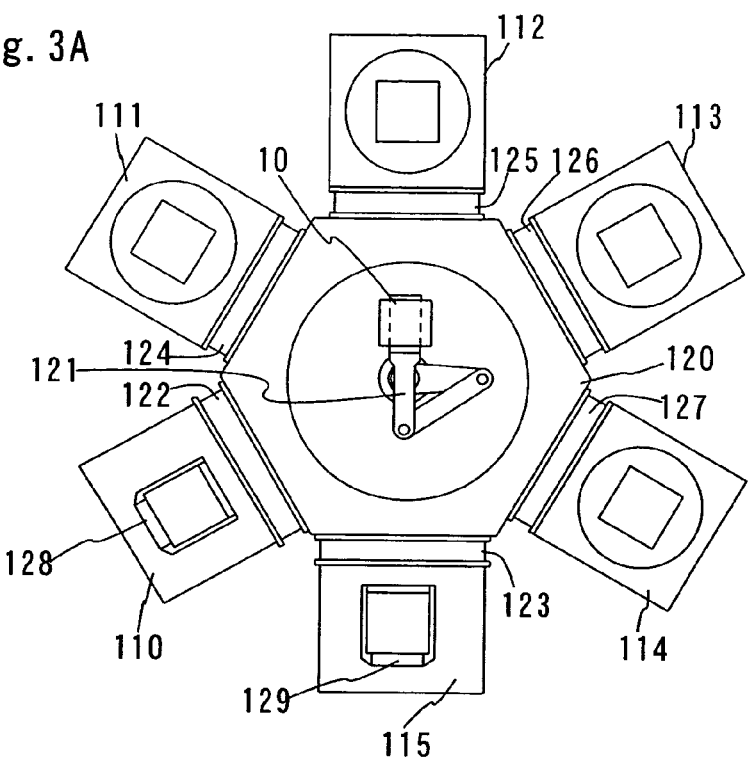
FIGS. 3A and 3B are diagrams each showing a continuous film-forming apparatus.

An example of an apparatus provided with a plurality of chambers is shown in FIG. 3A. It is to be noted that FIG. 3A is a top view of a constitution example of an apparatus (a continuous film-formation system) described in this embodiment mode.

The apparatus shown in FIG. 3A has a first chamber 111, a second chamber 112, a third chamber 113, a fourth chamber 114, load lock chambers 110 and 115, and a common chamber 120, and each chamber has airtightness. Each chamber is provided with a vacuum evacuation pump and an inert gas introduction system.

The load lock chambers 110 and 115 are chambers for carrying a sample (a substrate to be processed) into the system. The first to fourth chambers are chambers to form a conductive film, an insulating film, or a semiconductor film over the substrate 10 or to perform etching, a plasma treatment, or the like. The common chamber 120 of a sample is provided in common for the load lock chambers 110 and 115 and the first to fourth chambers. In addition, gate valves 122 to 127 are provided between the common chamber 120 and the load lock chambers 110 and 115, the first to fifth chambers 111 to 114, respectively. A robot arm 121 is provided in the common chamber 120, which transfers a substrate to be processed to each chamber.

As a specific example, described below is a case where the metal film 11 is formed over the substrate 10 in the first chamber 111, the film 12 made of metal oxide, metal nitride or metal nitride oxide is formed in the second chamber 112, the insulating film 13 is formed in the third chamber 113, and the amorphous semiconductor film is formed in the fourth chamber 114.

First, a cassette 128 storing a plurality of the substrates 10 is transferred to the load lock chamber 110. After the cassette 128 is transferred therein, a carry-in door of the load lock chamber 110 is closed. In this state, the gate valve 122 is opened to take out one substrate to be processed from the cassette 128, and then the substrate is placed in the common chamber 120 by the robot arm 121. Alignment of the substrate 10 is performed in the common chamber 120 at this time.

Then, the gate valve 122 is closed and the gate valve 124 is opened to transfer the substrate 10 to the first chamber 111. A film formation process is performed in the first chamber 111, so that the metal film 11 is formed over the substrate 10; for example, a tungsten (W) film can be formed by a plasma CVD method or a sputtering method using W as a target in the first chamber 111.

Next, after the metal film 11 is formed, the substrate 10 is taken out to the common chamber 120 by the robot arm 121, and transferred to the second chamber 112. In the second chamber 112, a plasma treatment is applied to the metal film 11 in an atmosphere of dinitrogen monoxide alone or a mixture gas atmosphere of dinitrogen monoxide and another gas, thereby the film 12 made of metal oxide, metal nitride or metal nitride oxide is formed on a surface of the metal film 11; for example, a tungsten oxide (WOx) film, a tungsten nitride (WNx) film or a tungsten nitride oxide (WNOx) film can be formed by performing a plasma treatment on the tungsten film in the second chamber 112.

Next, after the film 12 made of metal oxide, metal nitride or metal nitride oxide is formed, the substrate 10 is taken out to the common chamber 120 by the robot arm 121, and transferred to the third chamber 113. In the third chamber 113, a film formation process is performed at 150 to 300° C., thereby the insulating film 13 is formed. The insulating film 13 can be formed as a single-layer film or a laminated-layer film of an insulating film containing oxygen or nitrogen such as a silicon oxide film, a silicon nitride film, a silicon oxynitride film, or a silicon nitride oxide film. For example, in the third chamber 113, a silicon nitride oxide film may be formed as a first-layer insulating film, a silicon nitride oxide film may be formed as a second-layer insulating film, and a silicon oxynitride film may be formed as a third-layer insulating film by a plasma CVD method. It is to be noted that a sputtering method using a target may be employed as well as a plasma CVD method.

Next, after the insulating film 13 is formed, the substrate 10 is taken out to the common chamber 120 by the robot arm 121 and transferred to the fourth chamber 114. In the fourth chamber 114, a film formation process is performed at 150 to 300° C. and the amorphous semiconductor film is formed by a plasma CVD method. It is to be noted that a microcrystalline semiconductor film, an amorphous germanium film, an amorphous silicon germanium film, or a laminated layer of these films, or the like may be used as the amorphous semiconductor film. Furthermore, a heat treatment for reducing the hydrogen concentration may be omitted by setting a temperature for forming the amorphous semiconductor film at 350 to 500° C. It is to be noted that although a case of using a plasma CVD method for film formation is described here, a sputtering method using a target may be employed as well.

After the amorphous semiconductor film is formed in this manner, the substrate 10 is transferred to the load lock chamber 115 by the robot arm 121 and stored in a cassette 129.

It is to be noted that FIG. 3A illustrates only an example. For example, the number of chambers may be increased so that a conductive film or an insulating film is formed continuously after the amorphous semiconductor film is formed. Furthermore, the film 22 made of metal oxide, metal nitride or metal nitride oxide may be formed by performing a heat treatment in the second chamber 112 as described in Embodiment Mode 2. Furthermore, the film 31 made of metal oxide, metal nitride or metal nitride oxide may be formed over the substrate 10 by sputtering in an atmosphere of dinitrogen monoxide alone or a mixture gas atmosphere of dinitrogen monoxide and another gas in the first chamber 111 as described in Embodiment Mode 3. That is, the invention can be implemented by using the steps and materials described in the above-described embodiment modes and freely combining with the apparatus shown in FIG. 3A. In addition, although the case where single type chambers are employed for the first to fourth chambers 111 to 114 is shown in FIG. 3A, constitution to process a plurality of substrates all at once by employing a batch chamber may be adopted.

Next, a different constitution from that shown in FIG. 3A is described with reference to FIG. 3B. Specifically, the case where films are continuously laminated using a plurality of chambers is shown in FIG. 3A, and a case where films are continuously formed within one chamber while keeping vacuum is shown in FIG. 3B.

Figure 3B:
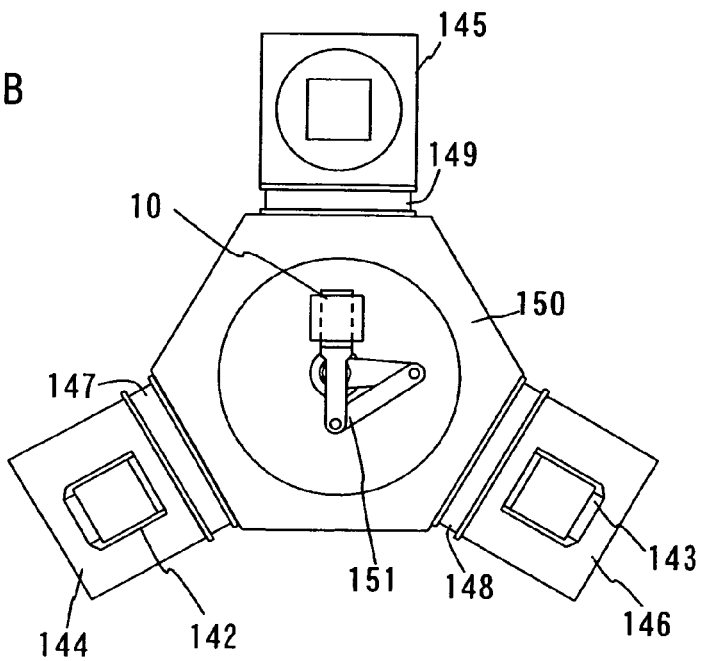

The apparatus shown in FIG. 3B has load lock chambers 144 and 146, a chamber 145, and a common chamber 150. Each chamber is provided with a vacuum evacuation pump and an inert gas introduction system. The common chamber 150 of a sample is provided in common for the load lock chambers 144 and 146 and the chamber 145. In addition, gate valves 147 to 149 are provided between the common chamber 150 and the load lock chambers 144 and 146, the chamber 145, respectively. A robot arm 151 is provided in the common chamber 150, which transfers a substrate to be processed to each chamber.

Hereinafter, as a specific example, a case where the metal film 11, the film 12 made of metal oxide, metal nitride or metal nitride oxide, the insulating film 13, and the amorphous semiconductor film are formed over the substrate 10 is described.

First, a cassette 142 storing a plurality of the substrates 10 is transferred to the load lock chamber 144. After the cassette 142 is transferred therein, a carry-in door of the load lock chamber 144 is closed. In this state, the gate valve 147 is opened to take out one substrate to be processed from the cassette 142, and then the substrate is placed in the common chamber 150 by the robot arm 151. Alignment of the substrate 10 is performed in the common chamber 150 at this time.

Next, the gate valve 147 is closed, and the gate valve 149 is opened to transfer the substrate 10 to the chamber 145 by the robot arm 151. The chamber 145 is provided with a plurality of targets, and reaction gases are changed sequentially so that the metal film 11, the film 12 made of metal oxide, metal nitride or metal nitride oxide, the insulating film 13, and the amorphous semiconductor film can be continuously laminated over the substrate 10.

After that, the substrate 10 is transferred to the load lock chamber 146 by the robot arm 151 and stored in a cassette 143.

It is to be noted that FIG. 3B illustrates only an example. For example, a conductive film or an insulating film may be formed continuously after the amorphous semiconductor film is formed. Furthermore, the film 22 made of metal oxide, metal nitride or metal nitride oxide may be formed by performing a heat treatment as described in Embodiment Mode 2. Furthermore, the film 31 made of metal oxide, metal nitride or metal nitride oxide may be formed over the substrate 10 by sputtering in an atmosphere of dinitrogen monoxide alone or a mixture gas atmosphere of dinitrogen monoxide and another gas as described in Embodiment Mode 3. That is, the invention can be implemented by using the steps and materials described in the above-described embodiment modes and freely combining with the apparatus shown in FIG. 3B. In addition, although an example in which a single type chamber is employed for the chamber 145 is shown in FIG. 3B, constitution to process a plurality of substrates all at once by employing a batch chamber may be adopted.

By employing the apparatus shown in FIG. 3B, films are continuously formed within the same chamber, thereby contamination during transfer of the substrate can be prevented.

By employing the apparatus described in this embodiment mode, a conductive film, an insulating film and a semiconductor film can be continuously formed without being exposed to the air. Therefore, contaminant can be prevented from being mixed and the manufacturing efficiency can be improved.

Embodiment Mode 5

In this embodiment mode, a manufacturing method of a semiconductor device of the invention which includes a thin film transistor, a memory element, and an antenna is described with reference to drawings.

First, a peeling layer 702 is formed over one surface of a substrate 701 (FIG. 6A). As the substrate 701, a glass substrate, a quartz substrate, a metal substrate, a stainless steel substrate with an insulating film formed over one surface thereof, a plastic substrate having heat resistance against the treatment temperature of this step, or the like may be used. In the case of the above-described substrates, an area and a shape thereof are not particularly restricted; therefore, by using a rectangular substrate with at least one meter on a side, for example, the productivity can be drastically improved. This merit is greatly advantageous as compared to the case of using a circular silicon substrate. It is to be noted that, the peeling layer 702 is formed over an entire surface of the substrate 701 in this step; however, the peeling layer 702 may be selectively provided as needed by processing by a photolithography method after the peeling layer is formed over the entire surface of the substrate 701. It is to be noted that the peeling layer 702 is formed to contact the substrate 701; however, an insulating film may be formed as a base film to contact the substrate 701 as needed and the peeling layer 702 may be formed to contact the insulating film.

The peeling layer 702 is formed of a metal film and a film made of metal oxide, metal nitride or metal nitride oxide. The metal film is formed as a single layer or a laminated layer of a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material containing the above-described element as its main component, by using a known method (a sputtering method, a plasma CVD method, or the like). The film made of metal oxide, metal nitride or metal nitride oxide is formed on a surface of the metal film by applying a plasma treatment to the metal film in a dinitrogen monoxide atmosphere, or by applying a heat treatment to the metal film in a dinitrogen monoxide atmosphere.

In the case where the metal film employs a single layer structure, a tungsten layer, a molybdenum layer, or a layer containing a mixture of tungsten and molybdenum is formed for example. Then, a layer containing oxide, nitride or nitride oxide of tungsten, a layer containing oxide, nitride or nitride oxide of molybdenum, or a layer containing oxide, nitride or nitride oxide of a mixture of tungsten and molybdenum is formed on a surface of the metal film. It is to be noted that a mixture of tungsten and molybdenum corresponds to, for example, an alloy of tungsten and molybdenum.

Alternatively, after forming a metal film over the substrate 701, as the peeling layer 702, a film made of metal oxide, metal nitride or metal nitride oxide may be formed by a sputtering method using the above-mentioned materials of the metal film as a target in a dinitrogen monoxide atmosphere. In this case, the metal film and the film made of metal oxide, metal nitride or metal nitride oxide may be formed using different metal elements from each other as well. It is to be noted that a film made of metal oxide, metal nitride or metal nitride oxide may be directly formed over the substrate 701 and used as the peeling layer 702.

Next, a base insulating film 703 is formed to cover the peeling layer 702. As the insulating film 703, a single layer or a laminated layer of a film containing oxide of silicon or nitride of silicon is formed by a known method (a sputtering method or a plasma CVD method). In the case where the base insulating film employs a two-layer structure, a silicon nitride oxide film may be formed as a first layer, and a silicon oxynitride film may be formed as a second layer, for example. In the case where the base insulating film employs a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as a first insulating film, a second insulating film, and a third insulating film, respectively. The base insulating film functions as a blocking film for preventing the entry of impurities from the substrate 701.

Next, an amorphous semiconductor film 704 (e.g., a film containing amorphous silicon) is formed over the insulating film 703. The amorphous semiconductor film 704 is formed with a thickness of 25 to 200 nm (preferably 30 to 150 nm) by a known method (a sputtering method, an LPCVD method, a plasma CVD method, or the like). Then, the amorphous semiconductor film 704 is crystallized by a known crystallization method (a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor film. After that, the obtained crystalline semiconductor film is processed into a desired shape, thereby crystalline semiconductor films 706 to 710 are formed (FIG. 6B). It is to be noted that the peeling layer 702, the insulating film 703, and the amorphous semiconductor film 704 can be formed continuously as shown in FIGS. 3A and 3B.

Hereinafter, an example of a manufacturing step of the crystalline semiconductor films 706 to 710 is described briefly. First, an amorphous semiconductor film is formed with a thickness of 66 nm by a plasma CVD method. Next, a solution containing nickel that is a metal element for promoting crystallization is applied onto the amorphous semiconductor film, and a dehydrogenation treatment (at 500° C., for one hour) and a thermal crystallization treatment (at 550° C., for four hours) are performed on the amorphous semiconductor film, thereby a crystalline semiconductor film is formed. After that, the crystalline semiconductor film is irradiated with laser light as needed, and processing treatment using a photolithography method is performed to form the crystalline semiconductor films 706 to 710.

In the case where the laser crystallization method is employed for forming the crystalline semiconductor film, a continuous wave or pulsed gas laser or solid-state laser is used. As the gas laser, an excimer laser, a YAG laser, a $YVO_4$ laser, a YLF laser, a $YAlO_3$ laser, a glass laser, a ruby laser, a Ti: sapphire laser or the like is used. As the solid-state laser, a laser using a crystal such as YAG, $YVO_4$, YLF or $YAlO_3$ doped with Cr, Nd, Er, Ho, Ce, Co, Ti, or Tm is used. In particular, by irradiating with a fundamental wave of the continuous wave laser, or laser light of second to fourth harmonics of the fundamental wave, large grain crystals can be obtained. For example, a second harmonic (532 nm) or a third harmonic (355 nm) of a Nd: $YVO_4$ laser (a fundamental wave of 1064 nm) can be used. It is to be noted that continuous wave laser light of a fundamental wave and continuous wave laser light of a harmonic may be irradiated, or continuous wave laser light of a fundamental wave and pulsed laser light of a harmonic may be irradiated. By irradiating with a plurality of kinds of laser light, energy can be compensated. In addition, if a pulsed laser oscillates the laser beam with a repetition rate for irradiating the next pulsed laser light until a semiconductor film which has been melted by the previous laser light is solidified, crystal grains grown continuously in the scanning direction can be obtained. That is, a pulsed laser with a lower limit of repetition rate set so that the pulse repetition period is shorter than a period for solidifying completely the semiconductor film which has been melted can be used. As such a laser, pulsed laser light having a repetition rate of 10 MHz or more may be used.

In addition, when the crystallization of the amorphous semiconductor film is performed by using the metal element for promoting crystallization, it is advantageous in that the crystallization can be performed at low temperature in short time, and that the direction of crystals becomes uniform. On the other hand, there is a problem that the property is not stable because the off current is increased due to the remaining metal element in the crystalline semiconductor film. Therefore, it is preferable to form an amorphous semiconductor film functioning as a gettering site over the crystalline semiconductor film. In order to form a gettering site, the amorphous semiconductor film is required to contain an impurity element such as phosphorus or argon, and therefore, it is preferably formed by a sputtering method by which argon can be contained at a high concentration. After that, a heat treatment (an RTA method, thermal annealing using an annealing furnace, or the like) is performed to diffuse the metal element into the amorphous semiconductor film, and the amorphous semiconductor film containing the metal element is removed. In this manner, the content of the metal element in the crystalline semiconductor film can be reduced or removed.

Next, a gate insulating film 705 is formed to cover the crystalline semiconductor films 706 to 710. As the gate insulating film 705, a single layer or a laminated layer of a film containing oxide of silicon or nitride of silicon is formed by a known method (a plasma CVD method or a sputtering method). Specifically, a film containing silicon oxide, a film containing silicon oxynitride, or a film containing silicon nitride oxide is formed as a single layer or a laminated layer.

Alternatively, after each of a substrate, an insulating film, a semiconductor film, a gate insulating film, an interlayer insulating film, another insulating film included in a semiconductor device, or the like is formed, each surface of the substrate, the insulating film, the semiconductor film, the gate insulating film and the interlayer insulating film may be oxidized or nitrided respectively using a plasma treatment. When a semiconductor film or an insulating film is oxidized or nitrided by using a plasma treatment, a surface of the semiconductor film or the insulating film is modified, and a denser insulating film than an insulating film formed by CVD or a sputtering method can be obtained. Therefore, characteristics or the like of the semiconductor device can be improved, restraining a defect such as a pinhole. Furthermore, the plasma treatment described above can be applied to a conductive film such as a gate electrode film, a source wiring or a drain wiring, and a nitride film or an oxide film can be formed by performing nitriding or oxidation.

In this embodiment mode, after the gate insulating film 705 is formed, a plasma treatment is performed to oxidize or nitride the gate insulating film 705. By the plasma treatment, an oxide film or a nitride film is formed over the gate insulating film 705, though not shown in the figure. In the case where silicon oxide (SiOx) or silicon oxynitride (SiOxNy) (x>y) is used for the gate insulating film 705, by performing a plasma treatment in an oxygen atmosphere so as to oxidize the gate insulating film 705, a dense film with fewer defects such as a pinhole can be formed on a surface of the gate insulating film, compared to a gate insulating film formed by a CVD method, a sputtering method or the like. On the other hand, in the case where a plasma treatment is performed in a nitrogen atmosphere so as to nitride the gate insulating film 705, silicon nitride oxide (SiNxOy) (x>y) can be provided as an insulating film over the gate insulating film 705. Alternatively, the gate insulating film 705 may be oxidized by performing a plasma treatment in an oxygen atmosphere once, and then nitrided by performing a plasma treatment in a nitrogen atmosphere.

In the case where a film is oxidized by a plasma treatment, the plasma treatment is performed in an oxygen atmosphere (an atmosphere of oxygen ($O_2$) and a rare gas (including at least one of He, Ne, Ar, Kr and Xe), an atmosphere of oxygen, hydrogen ($H_2$) and a rare gas, or an atmosphere of dinitrogen monoxide and a rare gas). On the other hand, in the case where a film is nitrided by a plasma treatment, the plasma treatment is performed in a nitrogen atmosphere (an atmosphere of nitrogen ($N_2$) and a rare gas (including at least one of He, Ne, Ar, Kr and Xe), an atmosphere of nitrogen, hydrogen and a rare gas, or an atmosphere of $NH_3$ and a rare gas). Ar can be used as a rare gas, for example. Alternatively, a gas in which Ar and Kr are mixed can be used. Therefore, the insulating film formed by the plasma treatment includes the rare gas (including at least one of He, Ne, Ar, Kr and Xe) used for the plasma treatment, and the insulating film includes Ar in the case where Ar is used.

The plasma treatment is performed in the above-described gas atmosphere with an electron density of $1\times10^{11}$ $cm^{-3}$ or more and an plasma electron temperature of 1.5 eV or less. More specifically, the plasma treatment is performed with an electron density of in a range of $1\times10^{11}$ $cm^{-3}$ to $1\times10^{13}$ $cm^{-3}$, and a plasma electron temperature of in a range of 0.5 eV to 1.5 eV. Since the plasma electron density is high and the electron temperature around a substance to be treated (the gate insulating film 705, here) formed over the substrate is low, a damage by plasma on the substance to be treated can be prevented. In addition, since the plasma electron density is as high as $1\times10^{11}$ $cm^{-3}$ or more, an oxide film or a nitride film formed by oxidizing or nitriding a substance to be treated using the plasma treatment has better uniformity of the thickness and the like and is denser, than that of a film formed by a CVD method, a sputtering method or the like. Furthermore, since the plasma electron temperature is as low as 1.5 eV or less, an oxidation or nitriding treatment can be performed at lower temperature than a conventional plasma treatment or thermal oxidation method. For example, even when a plasma treatment is performed at a temperature lower than distortion point of a glass substrate by 100° C. or more, the oxidation or nitriding treatment can be performed sufficiently. As for frequency for generating plasma, a high frequency wave such as a microwave (2.45 GHz) can be used. It is to be noted that the above-described conditions are used for a plasma treatment, if not otherwise specified hereinafter.

As described above, by performing a plasma treatment before forming a gate electrode film, even when a coating defect of a gate insulating film occurs at an edge of a semiconductor film, the semiconductor film which is exposed because of the coating defect can be oxidized or nitrided. Therefore, short-circuiting of a gate electrode film and a semiconductor film due to the coating defect of the gate insulating film at an edge of the semiconductor film, or the like can be prevented.

Next, a first conductive film and a second conductive film are laminated over the gate insulating film 705. The first conductive film is formed with a thickness of 20 to 100 nm by a known method (a plasma CVD method or a sputtering method). The second conductive film is formed with a thickness of 100 to 400 nm by a known method. The first conductive film and the second conductive film are formed by using an element selected from tantalum (Ta), tungsten (W), titanium (Ti), molybdenum (Mo), aluminum (Al), copper (Cu), chromium (Cr), niobium (Nb), and the like, an alloy material or a compound material containing the above-described element as its main component. Alternatively, a semiconductor material, typified by polycrystalline silicon doped with an impurity element such as phosphorus, may be used. As a combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, or the like can be used, for example. Since tungsten and tantalum nitride have high heat resistance, a heat treatment for thermal activation can be performed after the first conductive film and the second conductive film are formed. Alternatively, in the case of employing a three-layer structure instead of a two-layer structure, a laminated layer structure of a molybdenum film, an aluminum film, and a molybdenum film may be employed.

Next, a resist mask is formed by a photolithography method, and an etching treatment for forming a gate electrode and a gate line is performed, thereby conductive films (also referred to as gate electrodes) 716 to 725 each functioning as a gate electrode are formed.

Next, a resist mask is formed by a photolithography method. Then, an impurity element imparting n-type conductivity is added into the crystalline semiconductor films 706, and 708 to 710 at a low concentration by an ion doping method or an ion implantation method to form n-type impurity regions 711, and 713 to 715 and channel forming regions 780, and 782 to 784. An element belonging to group 15 of the Periodic Table may be used as the impurity element imparting n-type conductivity and, for example, phosphorus (P) or arsenic (As) is used.

Next, a resist mask is formed by a photolithography method. Then, an impurity element imparting p-type conductivity is added into the crystalline semiconductor film 707 to form a p-type impurity region 712 and a channel forming region 781. For example, boron (B) is used as the impurity element imparting p-type conductivity.

Next, an insulating film is formed so as to cover the gate insulating film 705 and the conductive films 716 to 725. As the insulating film, a single layer or a laminated layer of a film containing an inorganic material such as silicon, oxide of silicon, or nitride of silicon, or a film containing an organic material such as an organic resin is formed by a known method (a plasma CVD method or a sputtering method). Next, the insulating film is selectively etched by anisotropic etching which is mainly in a perpendicular direction, thereby insulating films (also referred to as sidewalls) 739 to 743 in contact with the side surfaces of the conductive films 716 to 725 are formed (FIG. 6C). Simultaneously with the formation of the insulating films 739 to 743, insulating films 734 to 738 are formed by etching the gate insulating film 705. The insulating films 739 to 743 are used as masks for doping when forming an LDD (Lightly Doped Drain) region later.

Next, using a resist mask formed by a photolithography method and the insulating films 739 to 743 as masks, an impurity element imparting n-type conductivity is added into the crystalline semiconductor films 706, and 708 to 710, so that first n-type impurity regions (also referred to as LDD regions) 727, 729, 731 and 733 and second n-type impurity regions 726, 728, 730 and 732 are formed. The concentration of the impurity element in the first n-type impurity regions 727, 729, 731 and 733 is lower than the concentration of the impurity element in the second n-type impurity regions 726, 728, 730 and 732. As a result of the above-described steps, n-type thin film transistors 744, and 746 to 748 and a p-type thin film transistor 745 are completed.

It is to be noted that there are the following two methods for forming the LDD region. In one method, a gate electrode is formed in a laminated layer structure having two or more layers, and etching which makes the edge have a tapered shape and anisotropic etching is performed to the gate electrode and a conductive film of the lower layer forming the gate electrode is used as a mask. In the other method, a sidewall insulating film is used as a mask. A thin film transistor that is formed by the former method has a structure in which an LDD region is overlapped with a gate electrode with a gate insulating film interposed therebetween; however, this structure which utilizes etching which makes the edge have a tapered shape and anisotropic etching of the gate electrode is difficult to control the width of the LDD region, and the LDD region sometimes cannot be formed if the etching step is not performed preferably. On the other hand, the latter method which uses a sidewall insulating film as a mask is, as compared to the former method, easy to control the width of the LDD region, and the LDD region can be formed certainly.

Then, an insulating film is formed as a single layer or a laminated layer so as to cover the thin film transistors 744 to 748 (FIG. 7A). The insulating film covering the thin film transistors 744 to 748 is formed as a single layer or a laminated layer using an inorganic material such as oxide of silicon and nitride of silicon, an organic material such as polyimide, polyamide, benzocyclobutene, acrylic, epoxy resin, and siloxane, or the like by a known method (an SOG method, a droplet discharging method, or the like). A siloxane-based material corresponds to a material of which the skeleton structure is constituted by the bond of silicon and oxygen and of which the substituent includes at least hydrogen, or a material of which the skeleton structure is constituted by the bond of silicon and oxygen and of which the substituent includes at least one of fluorine, an alkyl group and aromatic hydrocarbon, for example. For example, in the case where the insulating film covering the thin film transistors 744 to 748 employs a three-layer structure, a film containing silicon oxide may be formed as a first-layer insulating film 749, a film containing a resin may be formed as a second-layer insulating film 750, and a film containing silicon nitride may be formed as a third-layer insulating film 751.

It is to be noted that before the insulating films 749 to 751 are formed or after one or a plurality of thin films of the insulating films 749 to 751 are formed, a heat treatment for recovering the crystallinity of the semiconductor film, for activating the impurity element which has been added into the semiconductor film, or for hydrogenating the semiconductor film is preferably performed. For the heat treatment, a thermal annealing method, a laser annealing method, an RTA method, or the like is preferably adopted.

Next, the insulating films 749 to 751 are etched by a photolithography method, thereby contact holes are formed to expose the n-type impurity regions 726, and 728 to 732 and the p-type impurity region 785. Subsequently, a conductive film is formed so as to fill the contact holes and patterned to form conductive films 752 to 761 each functioning as a source or drain wiring.

The conductive films 752 to 761 are formed as a single layer or a laminated layer using an element selected from titanium (Ti), aluminum (Al), and neodymium (Nd), an alloy material or a compound material containing the above-described element as its main component by a known method (a plasma CVD method or a sputtering method). An alloy material containing aluminum as its main component corresponds to a material containing nickel whose main component is aluminum or an alloy material containing nickel and one or both of carbon and silicon whose main component is aluminum, for example. Each of the conductive films 752 to 761 preferably employs, for example, a laminated layer structure of a barrier film, an aluminum-silicon (Al—Si) film, and a barrier film, or a laminated layer structure of a barrier film, an aluminum-silicon (Al—Si) film, a titanium nitride (TiN) film and a barrier film. It is to be noted that a barrier film corresponds to a thin film formed by using titanium, nitride of titanium, molybdenum, or nitride of molybdenum. Aluminum and aluminum silicon which have the low resistance and are inexpensive are optimal materials for forming the conductive films 752 to 761. In addition, generation of a hillock of aluminum or aluminum silicon can be prevented when upper and lower barrier layers are provided. Furthermore, when the barrier film is formed by using titanium that is a highly-reducible element, even if a thin natural oxide film is formed over the crystalline semiconductor film, the natural oxide film is reduced so that preferable contact with the crystalline semiconductor film can be obtained.

Next, an insulating film 762 is formed so as to cover the conductive films 752 to 761 (FIG. 7B). The insulating film 762 is formed as a single layer or a laminated layer using an inorganic material or an organic material by a known method (an SOG method, a droplet discharging method, or the like). The insulating film 762 is preferably formed with a thickness of 0.75 to 3 μm.

Subsequently, the insulating film 762 is etched by a photolithography method, so that contact holes to expose the conductive films 757, 759, and 761 are formed. Then, a conductive film is formed so as to fill the contact holes. The conductive film is formed by a known method (a plasma CVD method or a sputtering method) by using a conductive material. Then, the conductive film is patterned to form conductive films 763 to 765. It is to be noted that the conductive films 763 to 765 each correspond to one conductive film of a pair of conductive films included in a memory element. Therefore, the conductive films 763 to 765 are preferably formed as a single layer or a laminated layer using titanium, or an alloy material or a compound material containing titanium as its main component. Titanium which has low resistance leads to size reduction of the memory element, thereby higher integration can be realized. In addition, in the photolithography step for forming the conductive films 763 to 765, it is preferable to perform wet etching in order to prevent damage to the thin film transistors 744 to 748 in lower layers; hydrogen fluoride (HF) or a solution constituted by ammonia and hydrogen peroxide solution is preferably used as the etchant.

Next, an insulating film 766 is formed so as to cover the conductive films 763 to 765. The insulating film 766 is formed of a single layer or a laminated layer using an inorganic material or an organic material by a known method (an SOG method, a droplet discharging method, or the like). In addition, the insulating film 762 is preferably formed with a thickness of 0.75 to 3 μm. The insulating film 766 is then etched by a photolithography method, so that contact holes 767 to 769 are formed to expose the conductive films 763 to 765 respectively.

Subsequently, a conductive film 786 functioning as an antenna is formed in contact with the conductive film 765 (FIG. 8A). The conductive film 786 is formed using a conductive material by a known method (a plasma CVD method, a sputtering method, a printing method, or a droplet discharging method). Preferably, the conductive film 786 is formed as a single layer or a laminated layer using an element selected from aluminum (Al), titanium (Ti), silver (Ag), or copper (Cu), or an alloy material or a compound material containing the above-described element as its main component. Specifically, screen printing is performed using paste containing silver and then a heat treatment at 50 to 350° C. is performed to form the conductive film 786. Alternatively, an aluminum film is formed by a sputtering method, and is patterned to form the conductive film 786. The patterning of the aluminum film is preferably performed by wet etching, and a heat treatment at 200 to 300° C. is preferably performed after the wet etching.

Then, an organic compound layer 787 is formed in contact with the conductive films 763 and 764 (FIG. 8B). The organic compound layer 787 is formed by a known method (a droplet discharging method, a vapor deposition method, or the like). Subsequently, a conductive film 771 is formed in contact with the organic compound layer 787; it is formed by a known method (a sputtering method or a vapor deposition method).

As a result of the above-described steps, a memory element portion 789 including the conductive film 763, the organic compound layer 787 and the conductive film 771, and a memory element portion 790 including the conductive film 764, the organic compound layer 787 and the conductive film 771 are completed.

It is to be noted that according to the manufacturing step described above, a step for forming the organic compound layer 787 is carried out after a step for forming the conductive film 786 functioning as an antenna, because the heat resistance of the organic compound layer 787 is not high.

Next, an insulating film 772 functioning as a protective film is formed by a known method (an SOG method, a droplet discharging method, or the like) so as to cover the memory element portions 789 and 790 and the conductive film 786 functioning as an antenna. The insulating film 772 is formed of a film containing carbon such as DLC (Diamond-Like Carbon), a film containing silicon nitride, a film containing silicon nitride oxide, or an organic material, and preferably formed of an epoxy resin.

The insulating film is then etched by a photolithography method or laser light irradiation to expose the peeling layer 702, thereby openings 773 and 774 are formed (FIG. 9A).

Next, the peeling layer 702 is removed by introducing an etchant into the openings 773 and 774 (FIG. 9B). As the etchant, a gas or a liquid containing halogen fluoride or an interhalogen compound is used; for example, chlorine trifluoride ($ClF_3$) is used as a gas containing halogen fluoride. Accordingly, an element forming layer 791 is peeled from the substrate 701. It is to be noted herein that the element forming layer 791 includes an element group including the thin film transistors 744 to 748 and the memory element portions 789 and 790, and the conductive film 786 functioning as an antenna. The peeling layer 702 may be partially left without being removed entirely. By leaving a part of the peeling layer 702, consumption of the etchant can be reduced and time for removing the peeling layer can be shortened. In addition, the element forming layer 791 can be retained at the substrate 701 even after the peeling layer 702 is removed.

It is preferable to reuse the substrate 701 after the element forming layer 791 is peeled off, in order to reduce the cost. In addition, the insulating film 722 is formed to prevent the element forming layer 791 from scattering after the peeling layer 702 is removed. The element forming layer 791 which is small, thin, and light easily scatters after the peeling layer 702 is removed, since it is not attached firmly to the substrate 701. However, by forming the insulating film 772 over the element forming layer 791, the element forming layer 791 is weighted and scattering from the substrate 701 can be prevented. In addition, by forming the insulating film 772, the element forming layer 791 which is in itself thin and light is prevented from being rolled by stress or the like after being peeled from the substrate 701, and the strength thereof can be ensured to some degree.

Next, one surface of the element forming layer 791 is attached to a first sheet material 775, and the element forming layer 791 is completely peeled from the substrate 701 (FIG. 10A). In the case where the peeling layer 702 is left partially without being removed completely, the element forming layer is peeled from the substrate 701 by a physical means. Then, a second sheet material 776 is provided over the other surface of the element forming layer 791, and one or both of a heat treatment and a pressure treatment are performed to attach the second sheet material 776. Simultaneously with or after providing the second sheet material 776, the first sheet material 775 is peeled and a third sheet material 777 is provided instead. Then, one or both of a heat treatment and a pressure treatment are performed to attach the third sheet material 777. Accordingly, a semiconductor device which is sealed with the second sheet material 776 and the third sheet material 777 is completed (FIG. 10B).

It is to be noted that the sealing may be performed with the first sheet material 775 and the second sheet material 776; however, in the case where a sheet material used for peeling the element forming layer 791 from the substrate 701 is different from a sheet material used for sealing the element forming layer 791, the element forming layer 791 is sealed with the second sheet material 776 and the third sheet material 777 as described above. This is effective in the case where a sheet material having low adhesion is required to be used, such as the case where the first sheet material 775 may adhere to the substrate 701 not only to the element forming layer 791 when the element forming layer 791 is peeled from the substrate 701.

As the second sheet material 776 and the third sheet material 777 used for sealing, a film formed by using polypropylene, polyester, vinyl, polyvinyl fluoride, polyvinyl chloride, or the like, paper of a fibrous material, a laminated film of a base film (polyester, polyamide, an inorganic vapor deposition film, paper, or the like) and an adhesive synthetic resin film (an acrylic-based synthetic resin, an epoxy-based synthetic resin, or the like), or the like can be used. It is to be noted that the above-described film is attached to a treatment object by performing a heat treatment and a pressure treatment, and the treatments are performed in the following manner; an adhesive layer which is provided on the outermost surface of the film or a layer (not an adhesive layer) which is provided on the outermost layer thereof is melted by the heat treatment, and then pressure is applied, thereby the film is attached. It is to be noted that an adhesive layer may be provided on a surface of the second sheet material 776 or the third sheet material 777, but is not necessarily provided. The adhesive layer corresponds to a layer containing an adhesive such as a heat curable resin, an ultraviolet-curable resin, an epoxy resin-based adhesive and a resin additive. In addition, it is preferable to perform silica coating to the sheet material used for sealing in order to prevent moisture and the like from entering inside after the sealing; for example, a sheet material in which an adhesive layer, a film of polyester or the like, and a silica coat are laminated can be used.

It is to be noted that this embodiment mode can be implemented combining freely with the above-described embodiment modes. That is, the materials and the forming methods described in the above-described embodiment modes can also be used in this embodiment mode while the materials and the forming methods described in this embodiment mode can also be used in the above-described embodiment modes.

Embodiment Mode 6

An example in which a static RAM (SRAM) is formed as an element of a semiconductor device of the invention is explained with reference to FIGS. 19A to 21B.

Figure 19A:
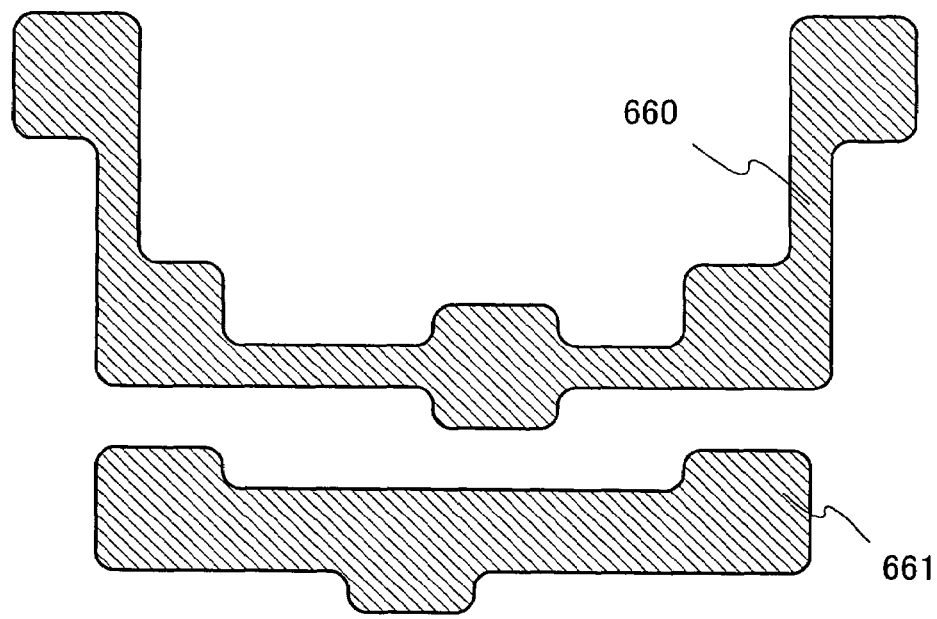
FIGS. 19A and 19B are diagrams showing a manufacturing method of a semiconductor device of the invention.

Semiconductor films 660 and 661 shown in FIG. 19A are preferably formed of silicon or crystalline semiconductor containing silicon as its main component. For example, a polycrystalline silicon or single crystalline silicon which is formed by crystallizing a silicon film by laser annealing or the like can be applied. Besides, a metal oxide semiconductor, amorphous silicon, or an organic semiconductor which shows a semiconductor characteristic can be applied.

In any case, a semiconductor film which is formed first is formed over the entire surface or a part (a region which is larger than a region defined as a semiconductor region in a transistor) of a substrate having an insulating surface. Then, a mask pattern is formed over the semiconductor film by photolithography. The semiconductor film is etched using the mask pattern to form island-shaped semiconductor films 660 and 661 each with a predetermined shape including source and drain regions and a channel formation region of the TFT. The semiconductor films 660 and 661 are formed in consideration of adequacy of layout thereof.

Figure 19B:
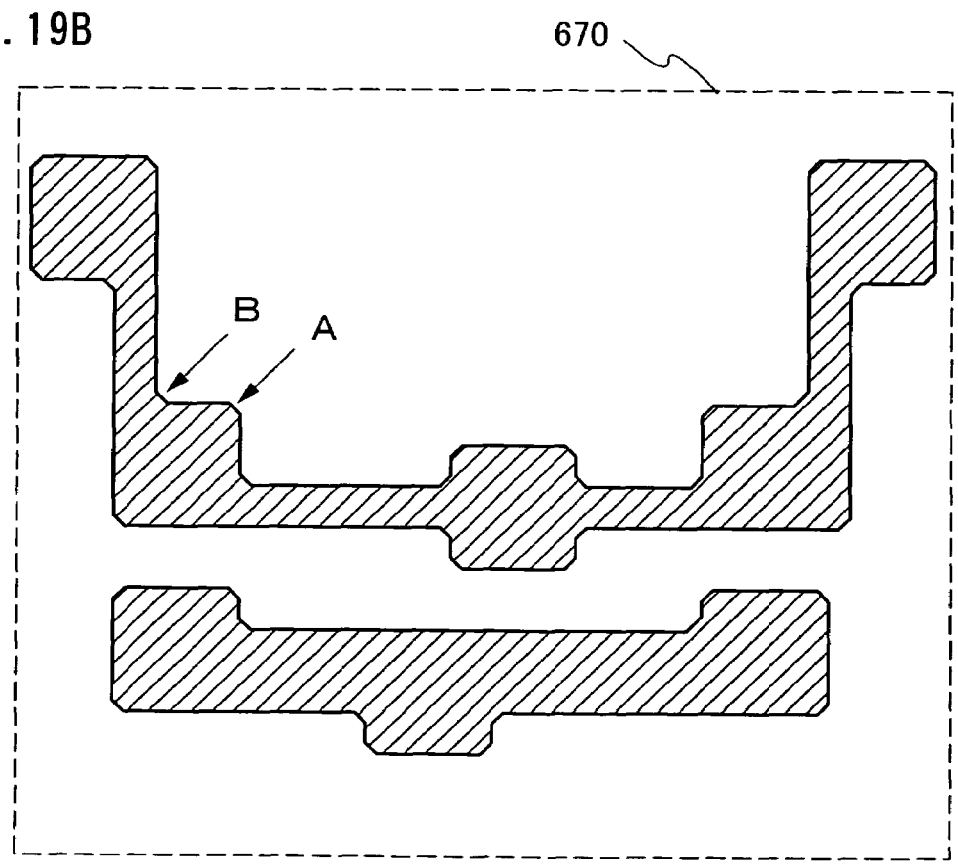

The photo mask for forming the semiconductor films 660 and 661 shown in FIG. 19A has a mask pattern 670 shown in FIG. 19B. The mask pattern 670 is formed depending whether the resist used in the photolithography process is a positive type or a negative type. When a positive type resist is used, the mask pattern 670 shown in FIG. 19B is made as a light shielding portion. The mask pattern 670 has a polygon shape in which apex A is removed. In addition, in the inside of the corner B, the corner bends a plurality of times so as not to make a right angle. As for this photo mask pattern, the angular parts are removed.

The shape of the mask pattern 670 shown in FIG. 19B is reflected in the semiconductor films 660 and 661 shown in FIG. 19A. In that case, the shape which is similar to the mask pattern 670 may be transferred. Alternatively, the shape may be transferred so that the transferred pattern has a rounder angular part than the mask pattern 670. That is, the transferred pattern may have a rounded portion where the pattern shape is smoother than the mask pattern 670.

Figure 20A:
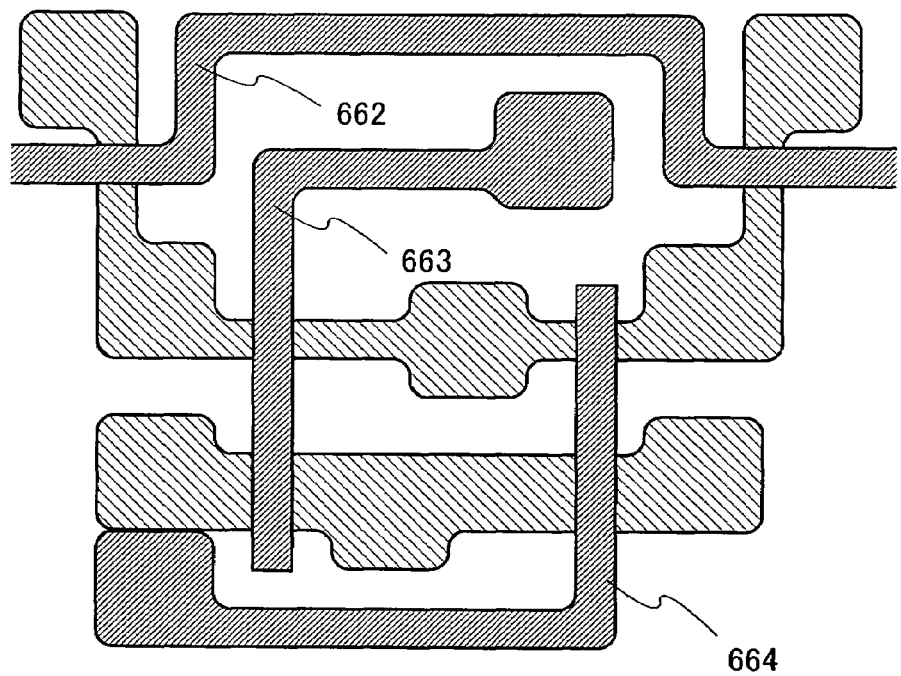
FIGS. 20A and 20B are diagrams showing a manufacturing method of a semiconductor device of the invention.

An insulating layer including silicon oxide or silicon nitride in at least one part thereof is formed over the semiconductor films 660 and 661. One purpose of forming the insulating layer is to use as a gate insulating film. As shown in FIG. 20A, gate wirings 662 to 664 are formed to overlap the semiconductor film partially. The gate wiring 662 is formed corresponding to the semiconductor film 660, while the gate wiring 663 is formed corresponding to the semiconductor films 660 and 661. Furthermore, the gate wiring 664 is formed corresponding to the semiconductor films 660 and 661. The gate wiring is formed by shaping a metal film or a semiconductor film with high conductivity formed over the insulating film, by photolithography.

Figure 20B:
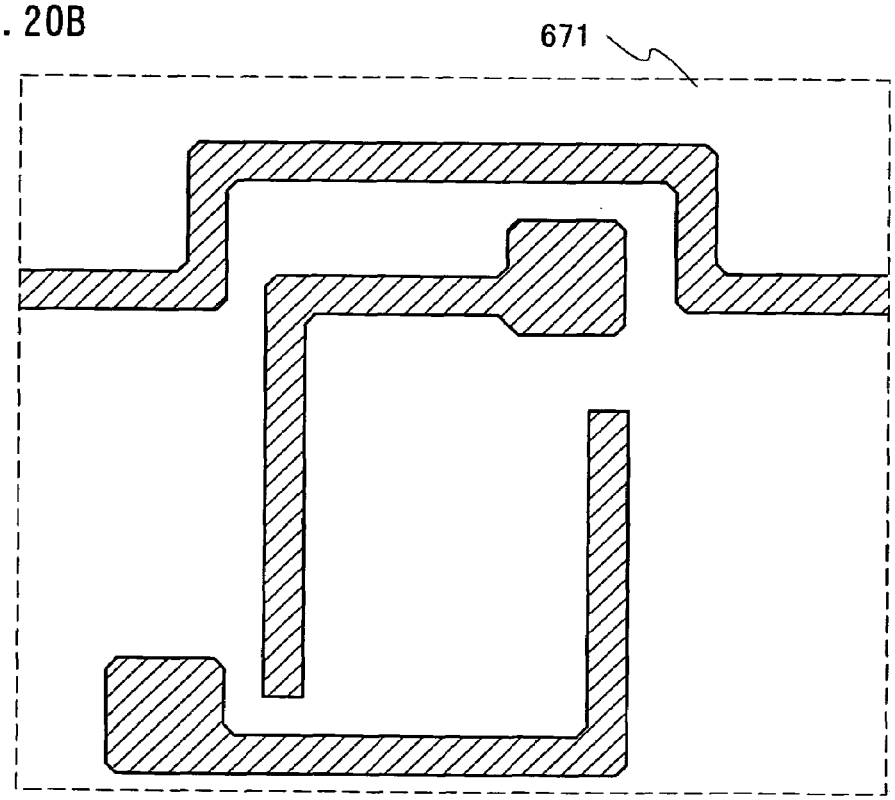

A photo mask used for forming the gate wiring has a mask pattern 671 shown in FIG. 20B. The angular parts of the mask pattern 671 are removed so that the removed parts are right triangles in which one side is in a range of one-fifth of the width of the wiring to half of the width. The shape of the mask pattern 671 shown in FIG. 20B is reflected to the gate wirings 662 to 664 shown in FIG. 20A. In that case, the shape which is similar to the mask pattern 671 may be transferred. Alternatively, the shape may be transferred so that the transferred pattern has a rounder angular part than the mask pattern 671. That is, the gate wirings 662 to 664 may have a rounded portion where the pattern shape is smoother than the mask pattern 671. The outside of the corner part of the gate wirings 662 to 664 suppresses generation of powder due to abnormal electrical discharge when dry etching by plasma is performed, and even when the powder is generated, the inside of the corner part makes it possible to wash away the powder which tends to gather around the angle, when cleaning. As a result, there is an effect that yield can be significantly improved.

An interlayer insulating film is formed after forming the gate wirings 662 to 664. The interlayer insulating film is formed using an inorganic insulating material such as silicon oxide or an organic insulating material using polyimide, an acrylic resin or the like. An insulating film of silicon nitride, silicon nitride oxide, or the like may be formed between the interlayer insulating film and the gate wirings 662 to 664. In addition, an insulating film such as silicon nitride or silicon nitride oxide may also be formed over the interlayer insulating film. The insulating film can prevent contamination of the semiconductor film and a gate insulating film due to exogenous metal ions and moisture, which are not preferable to a TFT.

Figures 21A, 21B:
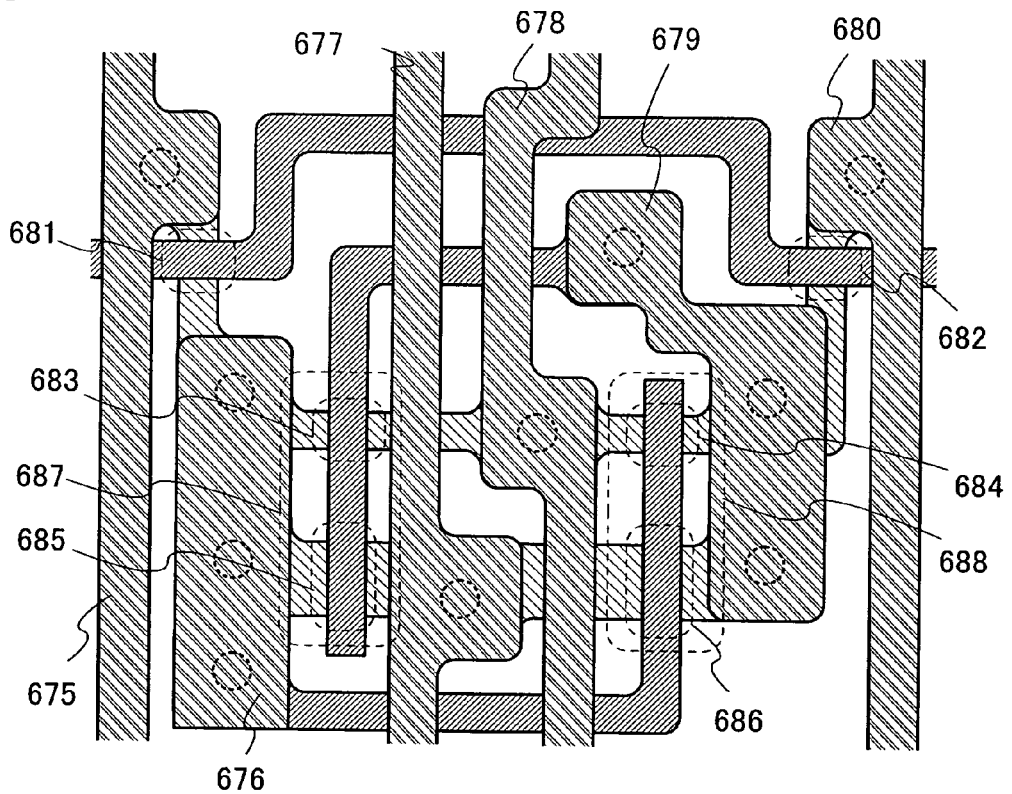
FIGS. 21A and 21B are diagrams showing a manufacturing method of a semiconductor device of the invention.

In the interlayer insulating film, an opening is formed in a predetermined position. For example, the opening is formed corresponding to the gate wirings and the semiconductor film placed blow. A wiring layer formed of a single layer or a plurality of layers of metal or a metal compound is formed by forming a mask pattern by photolithography and by forming a predetermined pattern through etching. Then, as shown in FIG. 21A, wirings 675 to 680 are formed to overlap the semiconductor film partially. The wiring connects specific elements. The wiring does not connect a specific element to another element linearly, and the wiring bends due to restriction of the layout. In addition, the width of the wiring changes in a contact portion or another region. In the contact portion, the width of the wiring is increased in the contact portion in the case where the contact hole is equal to or wider than the width of the wiring.

A photo mask used for forming the gate wirings 675 to 680 has a mask pattern 672 shown in FIG. 21B. As shown in FIG. 21A, the angular parts of the wiring layers are removed, in each corner part where the wiring bends in L-shape, so that the removed part is a right triangle in which one side is 10 µm or less, or in a range of one-fifth of the width of the wiring to half of the width, thereby the pattern has rounded corner part. That is, outer circumference of the corner part of the wiring layer makes a curving line, seen from the top face. Specifically, a part of the wiring layer, which corresponds to a right-angled isosceles triangle formed with two lines perpendicular to each other (referred to as first straight lines) making the corner part and a line at approximately 45 degrees to the two first straight lines (referred to as a second straight line), is removed, in order to round the outer circumference of the corner part. When the right-angled isosceles triangle is removed, a part with two obtuse angles is newly formed in the wiring layer, and it is preferable that the wiring layer is etched setting a mask design and the etching conditions arbitrarily, so that curving line which contacts both of the first straight lines and the second straight line is made in each obtuse angle part. The length of the two sides equal to each other of the right-angled isosceles triangle is in a range of one-fifth of the width of the wiring to half of the width. In addition, internal circumference is also rounded along the outer circumference of the corner part. Because of the structure described above, the outside of the corner part of the wirings 675 to 680 suppresses generation of powder due to abnormal electrical discharge when dry etching by plasma is performed, and even when the powder is generated, the inside of the corner part makes it possible to wash away the powder which tends to gather around the angle, when cleaning. As a result, there is an effect that yield can be significantly improved. In addition, since angular parts of the wirings are round, electrical conduction can be expected. Also, it is very advantageous for washing particles away in the case of a plurality of wirings placed in parallel.

In FIG. 21A, n-channel transistors 681 to 684, p-channel transistors 685 and 686 are formed. The n-channel transistor 683 and the p-channel transistor 685, and the n-channel transistor 684 and the p-channel transistor 686 form inverters, respectively. A circuit including the foregoing 6 transistors forms an SRAM. An insulating film of silicon nitride, silicon oxide, or the like may be formed over the transistors.

It is to be noted that this embodiment mode can be implemented combining freely with the above-described embodiment modes. That is, the materials and the forming methods described in the above-described embodiment modes can also be used in this embodiment mode while the materials and the forming methods described in this embodiment mode can also be used in the above-described embodiment modes.

Embodiment Mode 7

In this embodiment mode, a processing method of a shape which can be used when a semiconductor device of the invention is manufactured is described.

In this embodiment mode, when a thin film transistor, a capacitor, a wiring and the like used in an integrated circuit of a semiconductor device are formed, a resist pattern for which the resist is processed by etching using an exposure mask is used.

A light exposure mask provided with a diffraction grating pattern or a subsidiary pattern having a light intensity reduction function, formed of a semi-transparent film, is described using FIGS. 22A to 22D.

Figure 22A:
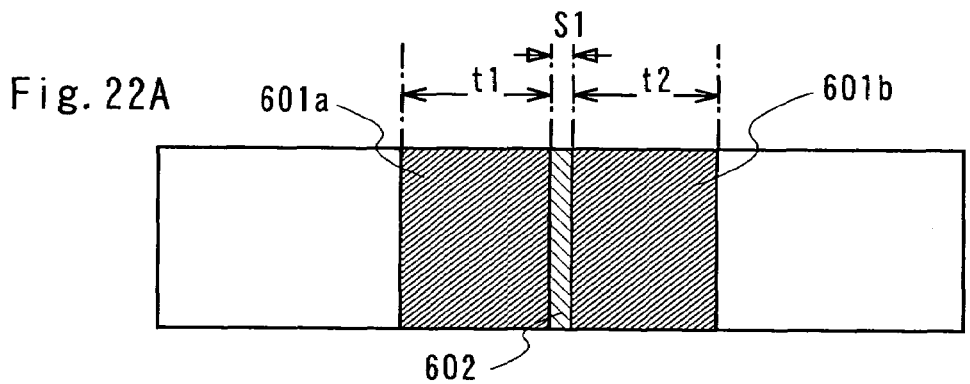
FIGS. 22A to 22D are diagrams showing a manufacturing method of a semiconductor device of the invention.
Figure 22B:
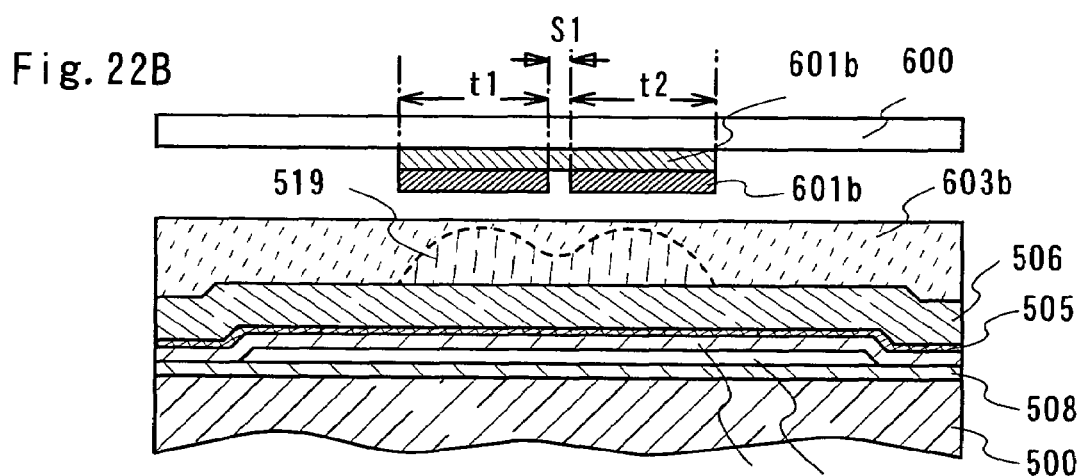

FIG. 22A is an enlarged top view of a part of a light exposure mask. A cross-sectional view of a part of the exposure mask corresponding to FIG. 22A is shown in FIG. 22B. In FIG. 22B, a light exposure mask and a substrate where a resist is applied over the entire surface are shown, corresponding to each other.

Figure 22C:
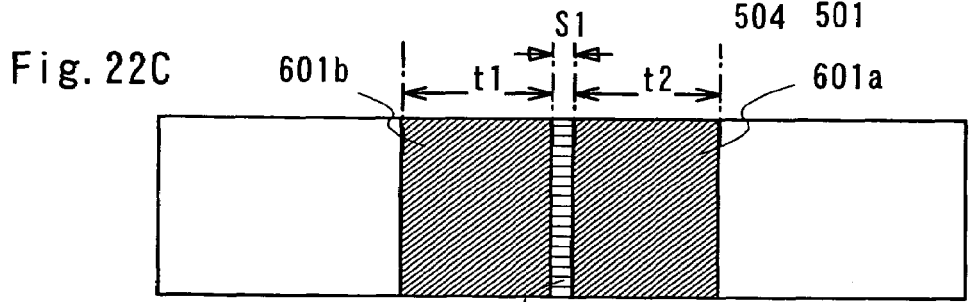
Figure 22D:
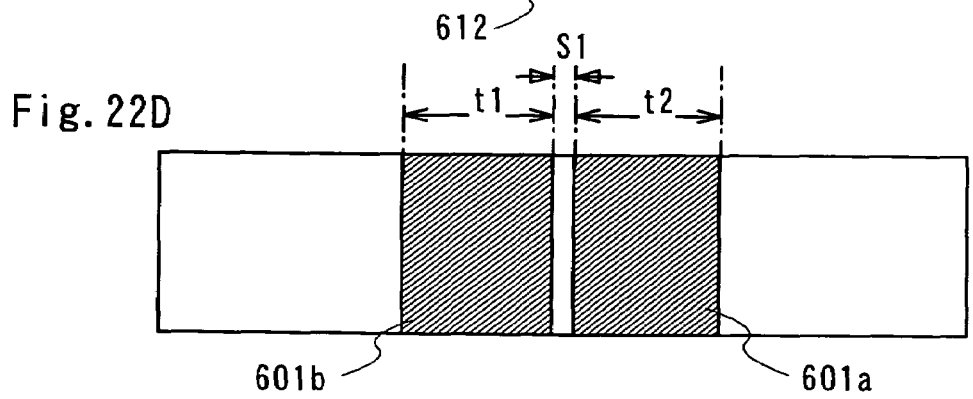
Figure 23A:
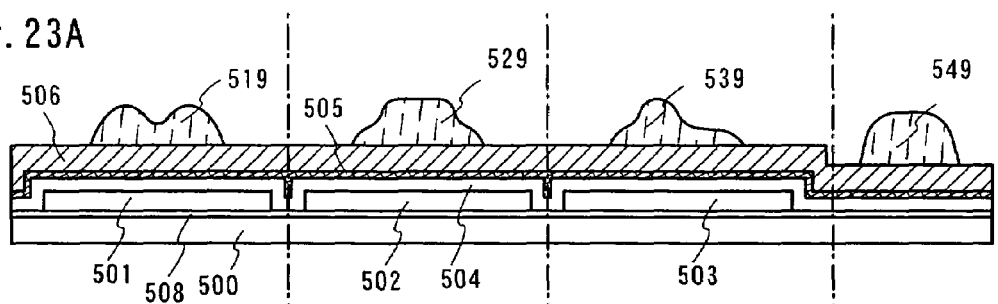
FIGS. 23A to 23C are diagrams showing a manufacturing method of a semiconductor device of the invention.
Figure 23B:
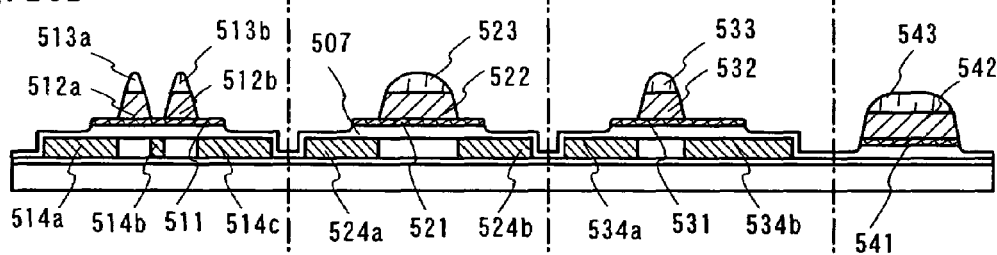
Figure 23C:
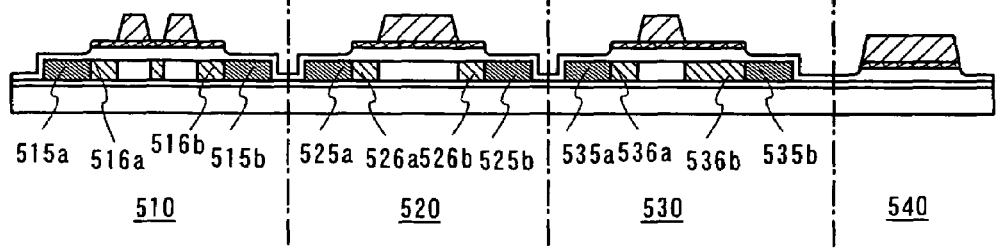

Furthermore, FIGS. 22A to 22D corresponds to FIG. 23, and a resist pattern 519 manufactured in FIG. 22 is used for manufacturing a double gate TFT 510 in FIGS. 23A to 23C.

In FIG. 22A, the exposure mask is provided with shading parts 601a and 601b formed of a metal film such as Cr, and a part with a semi-transparent film 602 as a subsidiary pattern. The width of the shading part 601a is t1, and the width of the shading part 601b is t2. The width of the part with the semi-transparent film 602 is S1, which also means the distance between the shading part 601a and the shading part 601b is S1.

In FIG. 22B, the exposure mask has a semi-transparent film 602 formed of MoSiN over a light-transmitting supporting substrate 600 and shading parts 601a and 601b formed of metal films such as Cr laminated over the semi-transparent film 602. The semi-transparent film 602 can be formed by using MoSi, MoSiO, MoSiON, CrSi or the like, also.

When the resist film is exposed to light using the light exposure mask shown in FIG. 22A and FIG. 22B, a non-light-exposed region 603a and a light-exposed region 603b are formed. When the light exposure is performed, light goes around the shading parts and goes through the semi-transparent film so that the light-exposed region 603b shown in FIG. 22B is formed.

Then, when development is performed, the light-exposed region 603b is removed and a resist pattern 519 shown in FIG. 23A is obtained.

As another example of an exposure mask, a top view of a light exposure mask provided with a diffraction grating pattern 612 having a plurality of slits, between the shading part 601a and the shading part 601b is shown in FIG. 22C. When the light exposure mask shown in FIG. 22C is used, the resist pattern 519 shown in FIG. 23A is obtained in the same way.

As another example of an exposure mask, a top view of a light exposure mask with a distance between the shading part 601a and the shading part 601b less than or equal to exposure limit is shown in FIG. 22D. For example, light exposure is performed under the optimal light exposure condition using a light exposure mask with t1: 6 µm, t2: 6 µm, and S1: 1 µm, and then the manufacturing process of Embodiment Mode 1 is followed, so that a TFT with a double gate structure in which the distance between two channel forming regions is less than 2 µm can be manufactured. When the light exposure mask shown in FIG. 22D is used, the resist pattern 519 shown in FIG. 23A is obtained in the same way.

As described above, when a resist film is processed by the method shown in FIGS. 22A to 22D, minute processing can be selectively performed without increasing steps, and various resist patterns are obtained. An example in which a double gate TFT 510, a single gate TFT 520, a capacitor 530 and a wiring 540 are manufactured by using such a resist pattern is shown in FIGS. 23A to 23C.

In FIG. 23A, an insulating film 508 is formed over a substrate 500, and a semiconductor film 501, a semiconductor film 502 and a semiconductor film 503 are formed over the insulating film 508. A gate insulating film 504, a first conductive film 505 and a second conductive film 506 are formed to cover the semiconductor films 501 to 503, and a resist pattern 519, a resist pattern 529, a resist pattern 539 and a resist pattern 549 with different shapes manufactured as shown in FIGS. 22A to 22D are formed.

The resist pattern 519 has a shape with two projecting parts, the resist pattern 529 has a shape with gentle steps on the edge, the resist pattern 539 has a shape with a projecting part off to the side of the center, and the resist pattern 549 has neither step, nor depressing or projecting part.

Processing by an etching treatment using the resist patterns 519, 529, 539 and 549 is performed so as to form a first gate electrode 511, a second gate electrode 512a, a second gate electrode 512b, a first gate electrode 521, a second gate electrode 522, a first gate electrode 531, a second gate electrode 532, a first wiring 541 and a second wiring 542. Using the second gate electrode 512a, the second gate electrode 512b, the second gate electrode 522 and the second gate electrode 532 as masks, an impurity element having one conductivity type is added to the semiconductor films 501 to 503 so as to form a low concentration impurity region 514a, a low concentration impurity region 514b, a low concentration impurity region 514c, a low concentration impurity region 524a, a low concentration impurity region 524b, a low concentration impurity region 534a and a low concentration impurity region 534b (FIG. 23B).

Furthermore, using the first gate electrode 511, the second gate electrode 512a, the second gate electrode 512b, the first gate electrode 521, the second gate electrode 522, the first gate electrode 531 and the second gate electrode 532 as masks, an impurity element having one conductivity type is added to the semiconductor films 501 to 503 so as to form a high concentration impurity region 515a, a high concentration impurity region 515b, a low concentration impurity region 516a, a low concentration impurity region 516b, a high concentration impurity region 525a, a high concentration impurity region 525b, a low concentration impurity region 526a, a low concentration impurity region 526b, a high concentration impurity region 535a, a high concentration impurity region 535b, a low concentration impurity region 536a, and a low concentration impurity region 536b. In addition, the resist patterns 513a, 513b, 523, 533 and 543 are removed so as to manufacture the double gate TFT 510, the single gate TFT 520, the capacitor 530 and the wiring 540 (FIG. 23C).

When an impurity element imparting n-type conductivity (phosphorus (P), for example) is used as the impurity element added to impart one conductivity type, an n-channel TFT having an n-type impurity region can be manufactured, and when an impurity element imparting p-type conductivity (boron (B), for example) is used as the impurity element added to impart one conductivity type, a p-channel TFT having a p-type impurity region can be manufactured.

Alternatively, by controlling the doping condition for adding an impurity element imparting one conductivity type, or the like, all the impurity regions can be formed as high concentration impurity regions without forming a low concentration impurity region. An example in which impurity elements imparting one conductivity type are added using two stages so as to form impurity regions with different concentrations is shown in this embodiment mode. However, a TFT and a capacitor each having low concentration impurity regions and high concentration impurity regions as shown in FIG. 23C can be manufactured by adopting a step in which an impurity element imparting one conductivity type is added once.

By the same step, two kinds of TFTs, the double gate TFT 510 and the single gate TFT 520, can be manufactured. The double gate TFT 510 has second gate electrodes 512a and 512b adjacent to each other over the first gate electrode 511. Since the distance between the second gate electrode 512a and the second gate electrode 512b can be shortened, the width of the low concentration impurity region 514b can be decreased, and also the size of the TFT can be reduced. Therefore, miniaturization becomes possible, and a more precise and lighter semiconductor device with higher performance can be realized.

As for the capacitor 530, the first gate electrode 531 can be formed to have a wider shape than the second gate electrode, so that a region of the low concentration impurity region 536b can be formed widely. Since capacitance formed between the low concentration impurity region and the gate electrode is larger than capacitance formed between a region 537 to which an impurity element is not added and the gate electrode, large capacitance can be obtained when the low concentration impurity region 536b below the first gate electrode 531 is formed widely.

As for the wiring 540, a first wiring 541 and a second wiring 542 can be formed and laminated with roughly the same width, without narrowing the width as the other gate electrodes, so that a wiring with low resistance can be manufactured. In addition, a minute wiring can be manufactured.

As described above, when this embodiment mode is used, conductive films and insulating films can be processed so as to have different shapes each suitable for a desired performance, by the same step. Therefore, different kinds of TFTs, wirings with different sizes or the like can be manufactured without increasing steps. This embodiment mode can be freely combined with each of the above-described Embodiment Modes 1 to 7.

Embodiment Mode 8

In this embodiment mode, one embodiment mode of a case where a semiconductor device of the invention is used as an RFID which is capable of transmitting and receiving data without contact is described with reference to FIGS. 11A to 11C.

Figure 11A:
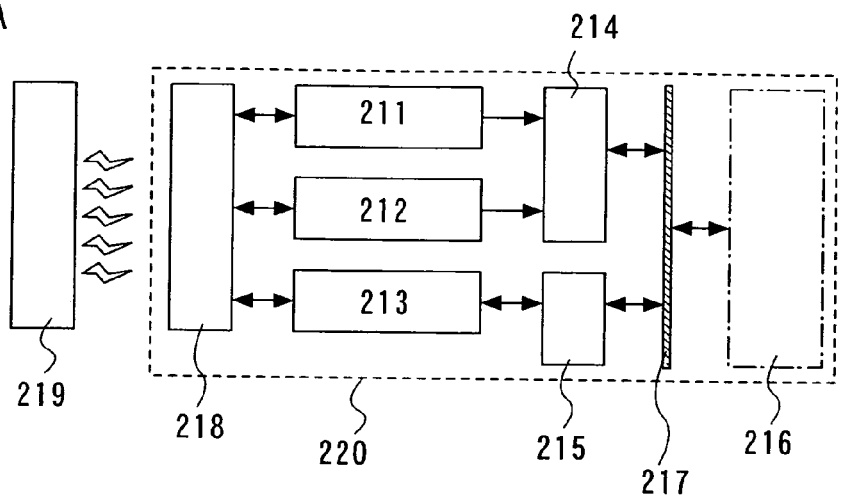
FIGS. 11A to 11C are diagrams each illustrating a usage mode of a semiconductor device of the invention.
Figure 11B:
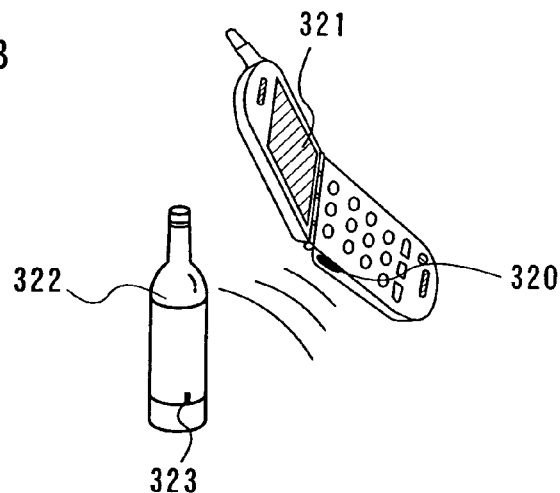
Figure 11C:
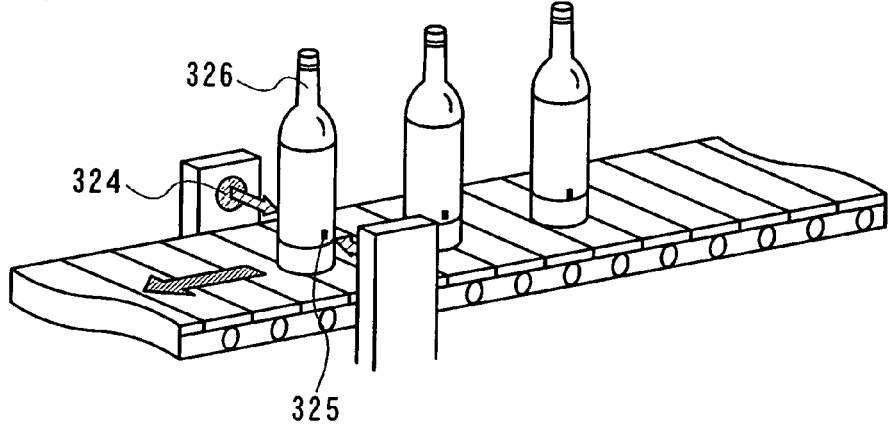

An RFID 220 has a function of communicating data without contact, which includes a power source circuit 211, a clock generating circuit 212, a data demodulation/modulation circuit 213, a control circuit 214 for controlling other circuit, an interface circuit 215, a memory 216, a data bus 217, and an antenna (an antenna coil) 218 (FIG. 11A).

The power source circuit 211 functions to generate power sources supplied for respective circuits in the semiconductor device based on AC signals input from the antenna 218. The clock generating circuit 212 functions to generate clock signals supplied for respective circuits in the semiconductor device based on AC signals input from the antenna 218. The data demodulation/modulation circuit 213 functions to demodulate and modulate data for communicating with a reader/writer 219. The control circuit 214 functions to control the memory 216. The antenna 218 functions to transmit and receive an electromagnetic wave and radio waves. The reader/writer 219 controls the semiconductor device, communication with the semiconductor device, and processing of data thereof. It is to be noted that the RFID is not limited to this constitution; for example, another component such as a limiter circuit of power source voltage and hardware dedicated to cryptanalysis may be additionally provided.

In addition, the RFID may be a type in which power source voltage is supplied to each circuit by radio waves without mounting a power source (a battery), a type in which power source voltage is supplied to each circuit by a power source (a battery) mounted instead of an antenna, or a type in which power source voltage is supplied by radio waves and a power source.

In the case of applying the semiconductor device of the invention to an RFID or the like, it is advantageous in that: non-contact communication is possible; multiple reading is possible; data writing is possible; transformation into various shapes is possible; directivity is wide and a wide recognition range is provided depending on the selected frequency; and the like. An RFID can be applied to an IC tag which can identify individual information of a person or an object by non-contact radio communication, an adhesive label which can be attached to an object by label processing, a wristband for an event or amusement, or the like. In addition, an RFID may be processed with a resin material and it may be directly fixed to a metal obstructing wireless radio communication. Further, an RFID can be utilized for an operation of a system such as an entrance management system and a checkout system.

Next, one mode of the practical use of the RFID applying the semiconductor device of the invention is described below. A reader/writer 320 is disposed on a side of a portable terminal including a display portion 321, and an RFID 323 is disposed on a side of merchandise 322 (FIG. 11B). When the reader/writer 320 is held up against the RFID 323 of the merchandise 322, information relating to merchandise, such as a raw material and a place of origin of the merchandise, a test result per production process, a record of distribution process, and besides, description of the merchandise is displayed in the display portion 321. In addition, merchandise 326 can be inspected by using a reader/writer 324 and an RFID 325 disposed in the merchandise 326, when the merchandise 326 is transported by a belt conveyor (FIG. 11C). In this manner, information can be easily obtained, and a high function and a high added value are realized by utilizing an RFID for a system.

It is to be noted that this embodiment mode can be implemented combining freely with the above-described embodiment modes.

Embodiment Mode 9

Figure 12:
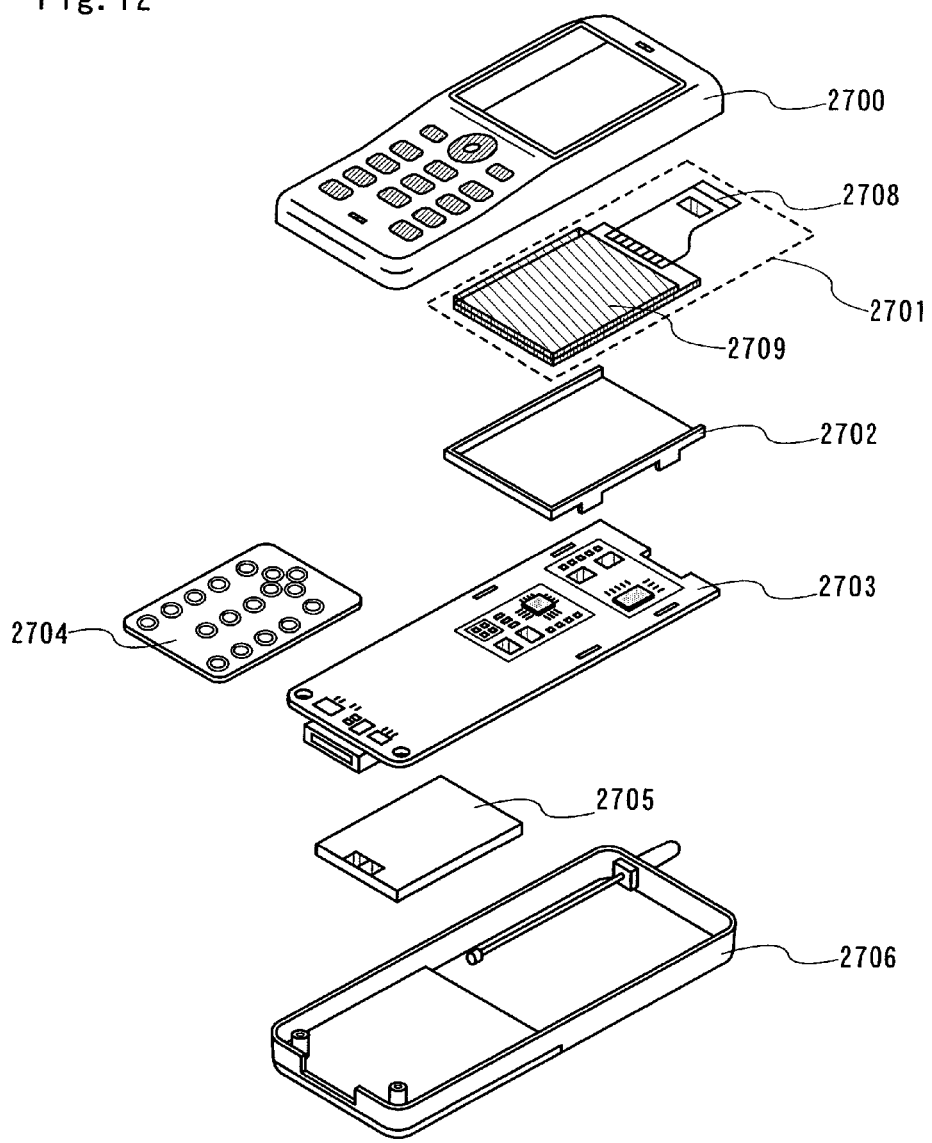
FIG. 12 is a diagram illustrating a usage mode of a semiconductor device of the invention.

A semiconductor device of the invention can be applied in a wide field. For example, it can be applied to electronic apparatuses. Electronic apparatuses to which a semiconductor device of the invention can be applied include a TV receiver, a computer, a portable information terminal such as a mobile phone, a camera such as a digital camera and a video camera, a navigation system, and the like. The case where a semiconductor device of the invention is applied to a mobile phone is described with reference to FIG. 12.

A mobile phone includes housings 2700 and 2706, a panel 2701, a housing 2702, a printed circuit board 2703, an operating button 2704, and a battery 2705. The housing 2702 incorporating the panel 2701 so as to be detachable is set to the printed circuit board 2703. The form and size of the housing 2702 are appropriately changed in accordance with an electronic apparatus incorporating the panel 2701. A plurality of packaged semiconductor devices is mounted onto the printed circuit board 2703, and the semiconductor device of the invention can be used as one of the semiconductor devices. Each of the plurality of semiconductor devices mounted onto the printed circuit board 2703 has any function of a controller, a central processing unit (CPU), a memory, a power source circuit, an audio processing circuit, a transmitting/receiving circuit, and the like.

The panel 2701 is combined with the printed circuit board 2703 via a connecting film 2708. The panel 2701, the housing 2702, and the printed circuit board 2703 described above are contained inside the housings 2700 and 2706 together with the operating button 2704 and the battery 2705. A pixel region 2709 included in the panel 2701 is disposed so as to be seen from a window provided in the housing 2700.

The semiconductor device of the invention is compact, thin, and light. Accordingly, the semiconductor device can utilize limited space inside the housings 2700 and 2706 of the electronic apparatus effectively.

Moreover, a semiconductor device of the invention can be used as an RFID, for example, in paper money, coins, valuable securities, certificates, bearer bonds, packing containers, books, recording media, personal items, vehicles, food items, clothes, healthcare items, livingwares, medicals, electronic apparatuses, or the like. Examples thereof are described with reference to FIGS. 13A to 13H.

Figure 13A:
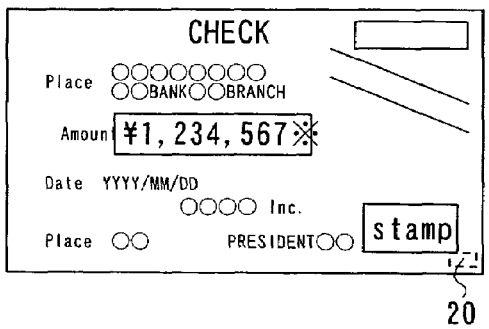
FIGS. 13A to 13H are diagrams each illustrating a usage mode of a semiconductor device of the invention.
Figure 13B:
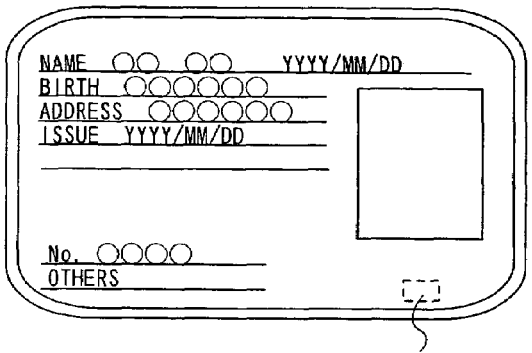
Figure 13C:
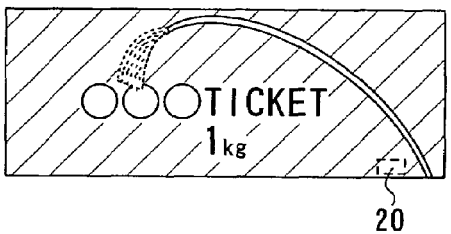
Figure 13D:
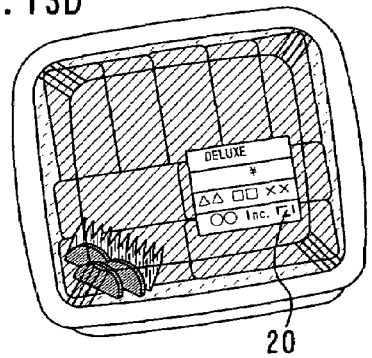
Figure 13E:
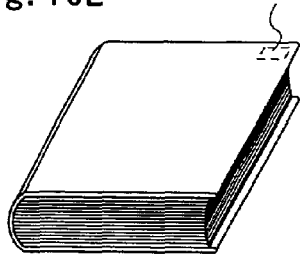
Figure 13F:
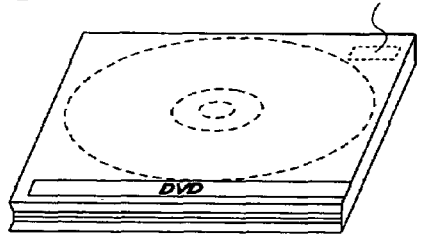
Figure 13G:
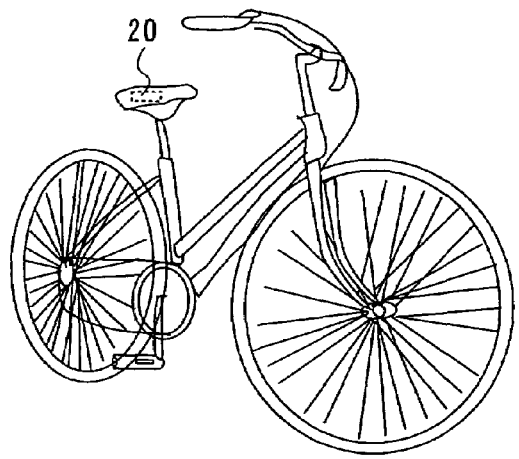
Figure 13H:
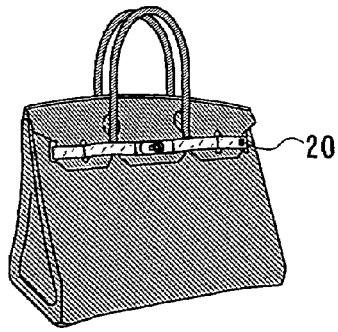

The paper money and the coins mean currency in the market, which include a note (a cash voucher) that is a currency in a specific area, memorial coins and the like. The valuable securities mean a check, a stock certificate, a promissory note, and the like (FIG. 13A). The certificates mean a driver's license, a resident card and the like (FIG. 13B). The bearer bonds mean a stamp, a rice coupon, various gift coupons and the like (FIG. 13C). The packing containers mean a wrapping paper for a lunch box or the like, a plastic bottle and the like (FIG. 13D). The books mean a book, a volume and the like (FIG. 13E). The recording media mean DVD software, a video tape and the like (FIG. 13F). The vehicles mean a wheeled vehicle such as a bicycle, a vessel and the like (FIG. 13G). The personal items mean a bag, glasses and the like (FIG. 13H). The food items mean groceries, beverages and the like. The clothes mean wear, footwear and the like. The healthcare items mean a medical instrument, a health appliance and the like. The livingwares mean furniture, a lighting apparatus and the like. The medicals mean a medicine, an agrichemical and the like. The electronic apparatuses mean a liquid crystal display device, an EL display device, a television apparatus (a TV receiver and a thin TV receiver), a mobile phone and the like.

By providing an RFID for paper money, coins, valuable securities, certificates, bearer bonds and the like, counterfeiting thereof can be prevented. Moreover, by providing an RFID for packing containers, books, recording media, personal items, food items, livingwares, electronic apparatuses and the like, the efficiency of the inspection system, the rental system and the like can be improved. By providing an RFID for vehicles, healthcare items, medicals and the like, counterfeiting and theft thereof can be prevented and the medicines can be prevented from being taken by mistake. The RFID may be attached to a surface of an object or embedded in an object. For example, the RFID may be embedded in paper of a book, or embedded in an organic resin of a package.

In this manner, by providing an RFID for packing containers, recording media, personal items, food items, clothes, livingwares, electronic apparatuses and the like, efficiency of the inspection system, the rental system and the like can be improved. By providing an RFID for vehicles, counterfeiting or theft thereof can be prevented. In addition, by embedding an RFID in a creature such as an animal, each creature can be easily identified; for example, by embedding an RFID in a creature such as a domestic animal, the first year of life, sex, breed or the like thereof can be easily identified.

As described hereinabove, the semiconductor device of the invention can be provided for any object to use. It is to be noted that this embodiment mode can be implemented freely combining with the above-described embodiment modes.

Embodiment 1

In this embodiment, configurations of a power source circuit and a delay circuit included in the semiconductor device of the invention, and calculation results of operations of the circuits are described with reference to FIGS. 14 to 15C.

Figure 14:
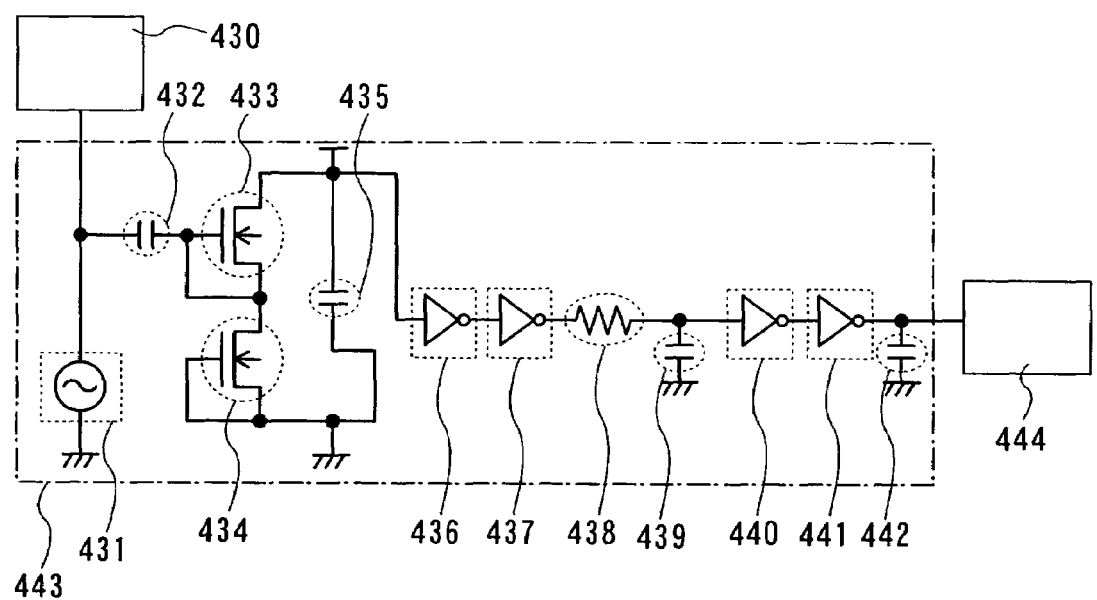
FIG. 14 is a diagram illustrating constitution of a semiconductor device of the invention.
Figure 15A:
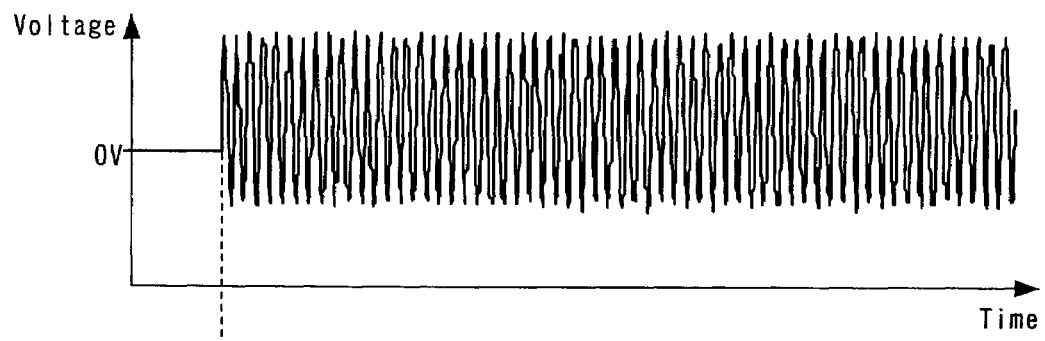
FIGS. 15A to 15C are diagrams showing calculation results.
Figure 15B:
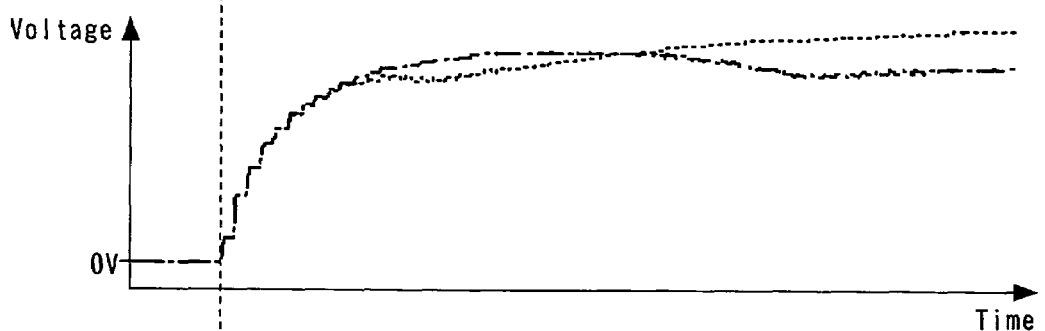
Figure 15C:
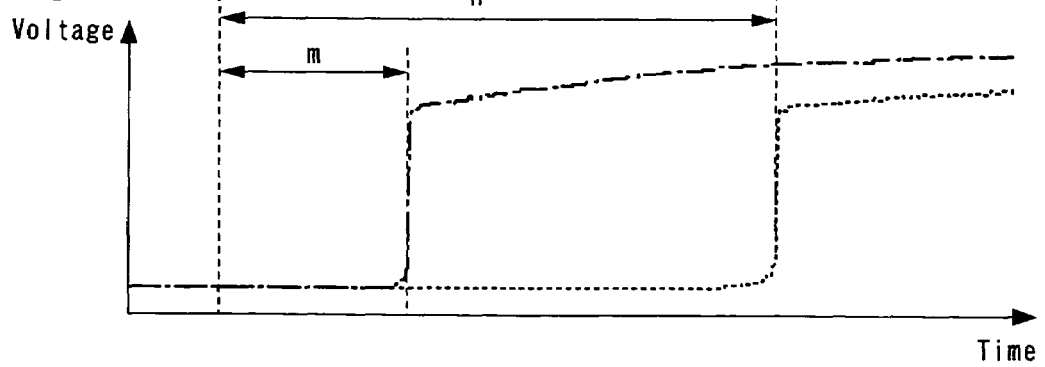

The semiconductor device of the invention includes at least a power source circuit 430 and a delay circuit 443 (FIG. 14).

The power source circuit 430 includes a rectifier circuit for generating a signal (FIG. 15B) by rectifying and smoothing a received carrier wave (FIG. 15A), and a capacitor for holding the signal generated by the rectifier circuit. The signal generated by the rectifier circuit is supplied to the delay circuit 443.

The delay circuit 443 includes an alternating power source 431, a capacitor 432, n-type transistors 433 and 434, a capacitor 435, inverters 436 and 437, a resistor 438, a capacitor 439, inverters 440 and 441, and a capacitor 442. The capacitors 432, 435, 439 and 442 and the resistor 438 are formed of a conductive film, a semiconductor film, a semiconductor film doped with an impurity such as phosphorus and boron, or the like.

The delay circuit 443 generates a reset signal (FIG. 15C) by using the signal (FIG. 15B) input from the power source circuit 430, and besides, supplies the generated reset signal to each circuit. The reset signal generated by the delay circuit 443 is supplied to a circuit 444 during a writing operation or a reading operation. Furthermore, the circuit 444 to which the reset signal is supplied is each circuit included in the semiconductor device, which is a clock signal generating circuit, a correction circuit, a judgment circuit, a controller circuit, an encoding circuit, or the like.

If the reset signal is generated too early by the delay circuit 443, power source supply to each circuit becomes unstable and each circuit may not perform the reset operation. On the other hand, if the reset signal is generated too late by the delay circuit 443, each circuit may start the next operation without the reset operation. As described above, each circuit may not operate normally when the delay circuit 443 does not generate a reset signal at a desired timing. Therefore, the delay circuit 443 is required to generate a reset signal at a desired timing.

Timing for generating a reset signal by the delay circuit 443 depends on the resistance and the capacitance of the delay circuit 443; specifically, depends on the resistance of the resistor 438 and the capacitance of the capacitor 439. In view of this, according to the invention, a reset signal is generated at a desired timing by optimizing the resistance of the resistor 438 and the capacitance of the capacitor 439.

More specifically, since there was a problem in that the timing for generating a reset signal is too early, the resistance of the resistor 438 is optimized from 100 to 400 kO. Consequently, time required for a carrier wave to be input into the semiconductor device until a reset signal is generated can be delayed to n seconds (n>0, see a waveform shown by a dotted line in FIG. 15C), which was m seconds (m>0, see a waveform shown by a chain line in FIG. 15C). In this manner, a reset signal is supplied to each circuit at a desired timing by delaying the timing for generating a reset signal, so that a semiconductor device can be operated normally.

Embodiment 2

Experimental results regarding crystallization condition and peel property of an element forming layer at the time of manufacturing a semiconductor device of the invention are described using FIGS. 16A to 16D, FIG. 17 and FIG. 18.

A metal film 1601 is formed over a substrate 1600. For the substrate 1600, an AN-100 substrate (126.6 mm×126.6 mm, 0.7 mmt) manufactured by Asahi Glass, Co., Ltd. was used.

Figure 16A:
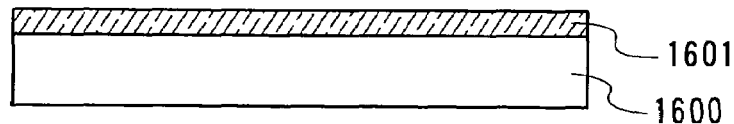
FIGS. 16A to 16D are diagrams illustrating an embodiment of a semiconductor device of the invention.

As the metal film 1601, a tungsten film was formed by a sputtering apparatus (FIG. 16A). The tungsten film was formed by introducing an Ar gas 0.02 SLM, under the conditions of pressure 0.2 Pa, electric power 1 kW and a substrate temperature 200° C., so as to be 30 nm thick. It is to be noted that 1 SLM is 1000 sccm, that is, 0.06 m$^3$/h.

Figure 16B:
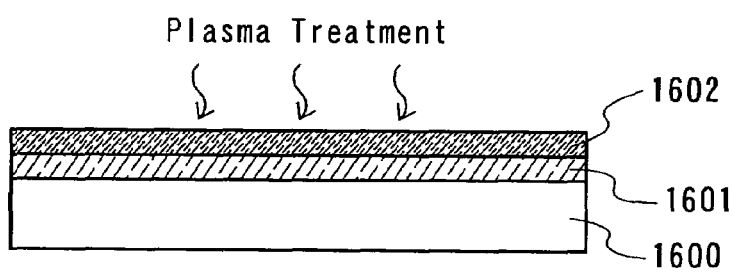

Then, a plasma treatment was applied to a surface of the metal film 1601 in a dinitrogen monoxide atmosphere, so as to form a film 1602 made of metal oxide, metal nitride or metal nitride oxide (FIG. 16B). The plasma treatment was performed by a PE-CVD apparatus, under the conditions of a substrate temperature of 345° C., dinitrogen monoxide gas flow rate of 0.4 SLM, pressure 240 Pa and electric power 50 W, for 60 sec. Other than this, the plasma treatment was tested in a dinitrogen monoxide atmosphere, under the conditions shown in FIG. 17. This time, the dinitrogen monoxide gas flow rate was 0.4 SLM and the substrate temperature was 345° C., in any case.

Subsequently, an insulating film 1603 was formed over the film 1602 made of metal oxide, metal nitride or metal nitride oxide. A silicon nitride oxide film was formed as the insulating film 1603 by a PE-CVD apparatus. As for the film formation conditions, RF frequency was 13.56 MHz, the substrate temperature was 345° C., a mono-silane gas of 0.015 SLM, a hydrogen gas of 1.2 SLM, an ammonia gas of 0.15 SLM and a dinitrogen monoxide gas of 0.02 SLM were used, electric power was 250 W, pressure was 40 Pa, the film forming rate was 13 nm/min, and the film was formed to have a thickness of 50 nm.

Subsequently, an insulating film 1604 was formed over the insulating film 1603. A silicon oxynitride film was formed as the insulating film 1604 by a PE-CVD apparatus. As for the film formation conditions, RF frequency was 13.56 MHz, a substrate temperature was 345° C., a mono-silane gas of 0.03 SLM and a dinitrogen monoxide gas of 1.2 SLM were used, electric power was 50 W, pressure was 40 Pa, the film forming rate was 44 nm/min, and the film was formed to have a thickness of 100 nm.

Figure 16C:
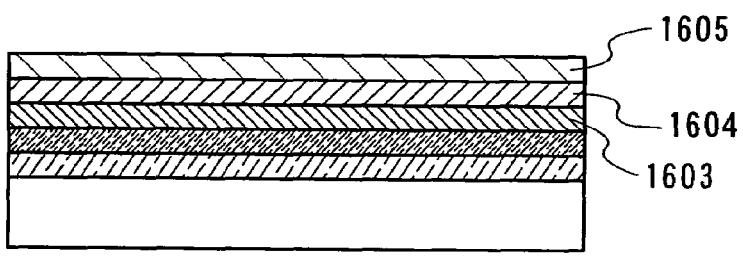

Subsequently, an amorphous silicon film 1605 was formed over the insulating film 1604 (FIG. 16C). The amorphous silicon film 1605 was formed under conditions of RF frequency of 13.56 MHz and a substrate temperature of 345° C., using a mono-silane gas of 0.28 SLM and a hydrogen gas of 0.3 SLM, with electric power of 60 W and pressure of 170 Pa, to have a thickness of 66 nm.

After that, cleaning was performed for the purpose of removing particles on a surface of the amorphous silicon film 1605, and then GRTA (Gas Rapid Thermal Annealing) treatment was performed at 650° C. for 75 sec so as to release hydrogen elements contained in the amorphous silicon film, though not shown in the figure.

After that, in order to remove a silicon oxide film formed by the GRTA treatment, it was treated with an HF water solution of 0.5% for 90 sec.

Figure 16D:
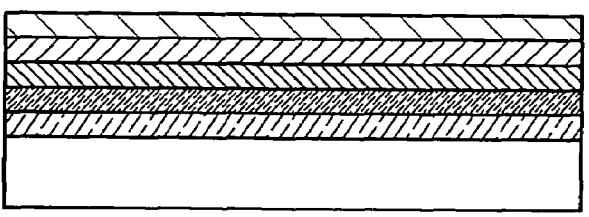

After that, crystallization of the amorphous silicon film was performed (FIG. 16D). As for the crystallization, the treatment was performed by scanning the amorphous silicon film with a laser under 13 conditions from a laser output of 12.5 W to 18.0 W by 0.5 W and 18.4 W was added further, and with the stage speed of 0.2 m/sec, 0.35 m/sec and 0.5 m/sec. The used laser is a solid ($YVO_4$) pulsed laser of which the wavelength is 532 nm, the repetition rate is 80 MHz, and the pulse width is 15 psec.

Then, whether the insulating film 1603, the insulating film 1604 and the crystalline silicon film can be peeled off or not is evaluated by a tape peeling test. The conditions of crystallization and the result of the tape peeling test are shown in FIG. 18 together.

In FIG. 18, the phrase "the film is splitted" means that the silicon film is broken off when it is irradiated with a laser as a crystallization treatment of an amorphous silicon film, "crystallization is possible" means that the whole area irradiated with a laser is changed in quality to be a crystalline silicon film having large particle size, and "lack of crystallization" means that not the whole area irradiated with a laser is changed in quality to be a crystalline silicon film having large particle size. The circle mark in the tape peeling test means that the peeling is possible at least once.

Embodiment 3

In this embodiment, a peeling layer used in a manufacturing process of a semiconductor device of the invention will be described, using experimental data.

As a sample, a metal film 801 was formed over a substrate 800, and a plasma treatment was applied to a surface of the metal film 801 in a dinitrogen monoxide atmosphere so as to form a peeling layer (a film made of metal oxide, metal nitride or metal nitride oxide). Three layers of insulating films were formed over the peeling layer (the film made of metal oxide, metal nitride or metal nitride oxide) 802 by CVD, and a semiconductor film was formed over the insulating films. After that, a heating treatment was applied to the sample at 450° C. for 30 minutes in the air. In this embodiment, the film made of metal oxide, metal nitride or metal nitride oxide is referred to as a peeling layer (a film made of metal oxide, metal nitride or metal nitride oxide) 802.

A tungsten film with a thickness of 30 nm was formed as the metal film 801 by a sputtering method, and a film made of tungsten oxide, tungsten nitride or tungsten nitride oxide was formed as the peeling layer (the film made of metal oxide, metal nitride or metal nitride oxide) 802 by a plasma treatment in a dinitrogen monoxide atmosphere, a silicon oxynitride film with a thickness of 180 nm, a tungsten nitride film with a thickness of 75 nm and a tungsten nitride oxide film with a thickness of 75 nm were laminated as an insulating film 803, and an amorphous silicon film with a thickness of 66 nm was formed as the semiconductor film. The insulating film and the semiconductor film were formed continuously by a CVD method. In this embodiment, the insulating film and the semiconductor film are to be an element.

Figure 25:
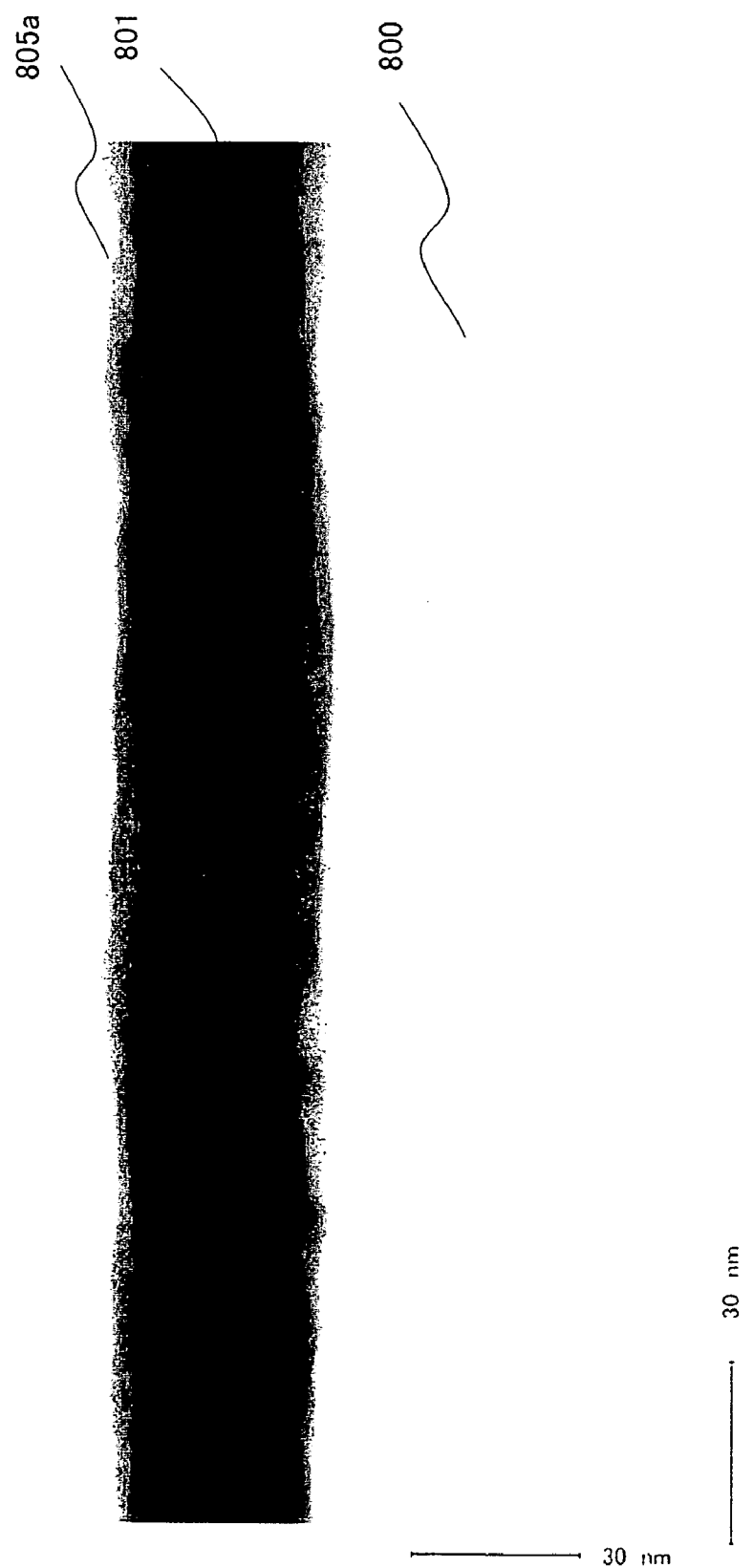
FIG. 25 is a diagram showing experimental data of Embodiment 3.
Figure 26:
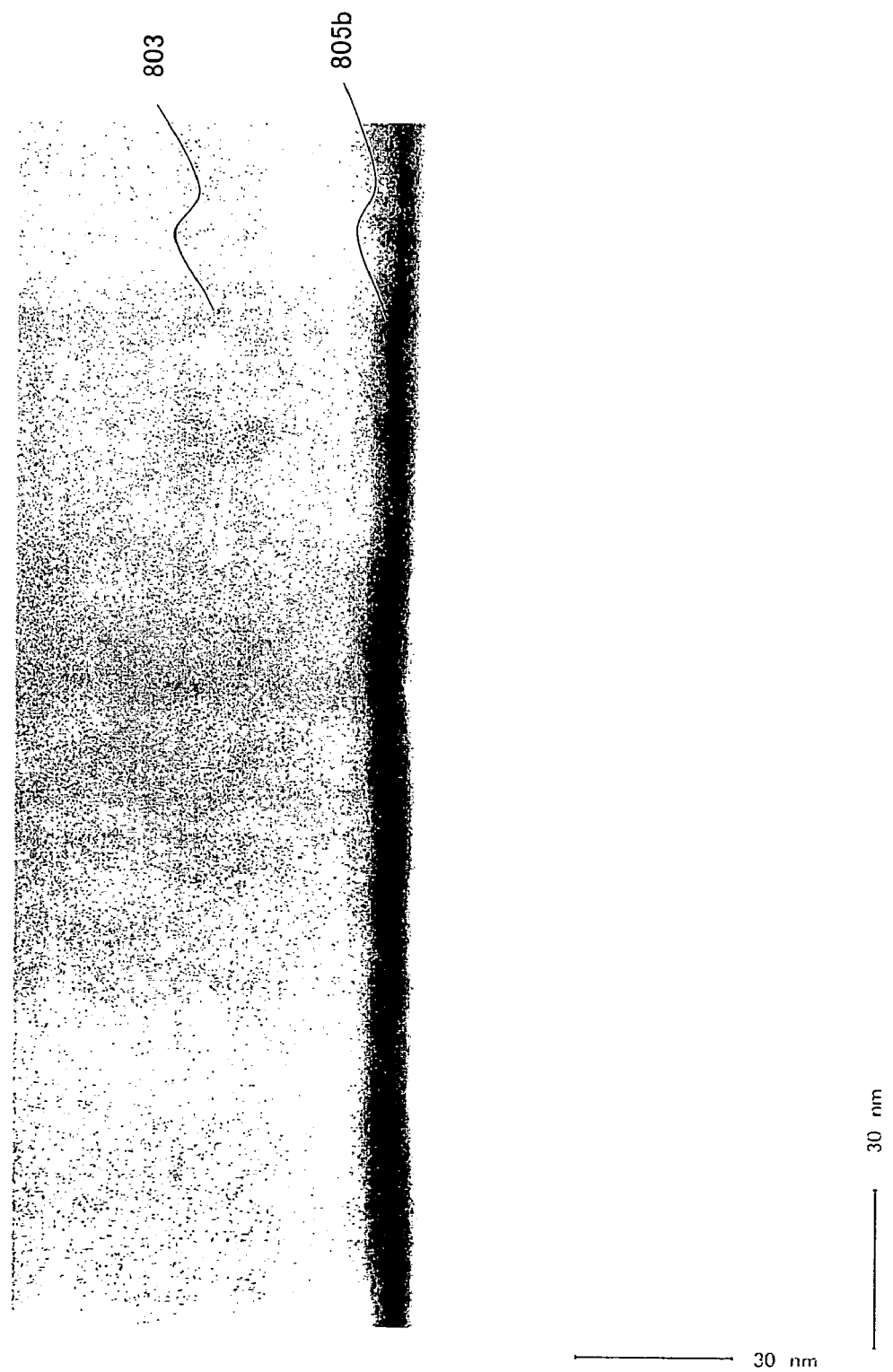
FIG. 26 is a diagram showing experimental data of Embodiment 3.

An adhesive was formed over the semiconductor film of the sample after the heat treatment with a thickness of several dozen μm, and a glass substrate to be an opposing substrate was bonded. Then, the insulating film and the semiconductor film as an element were peeled from the substrate 800 to the opposing substrate side. Cross-sectional photographs of the sample before peeling, the sample on the substrate side after peeling and the sample on the element side after peeling, by a transmission electron microscope (hereinafter also referred to as TEM), are shown in FIG. 24, FIG. 25 and FIG. 26, respectively.

Figure 24:
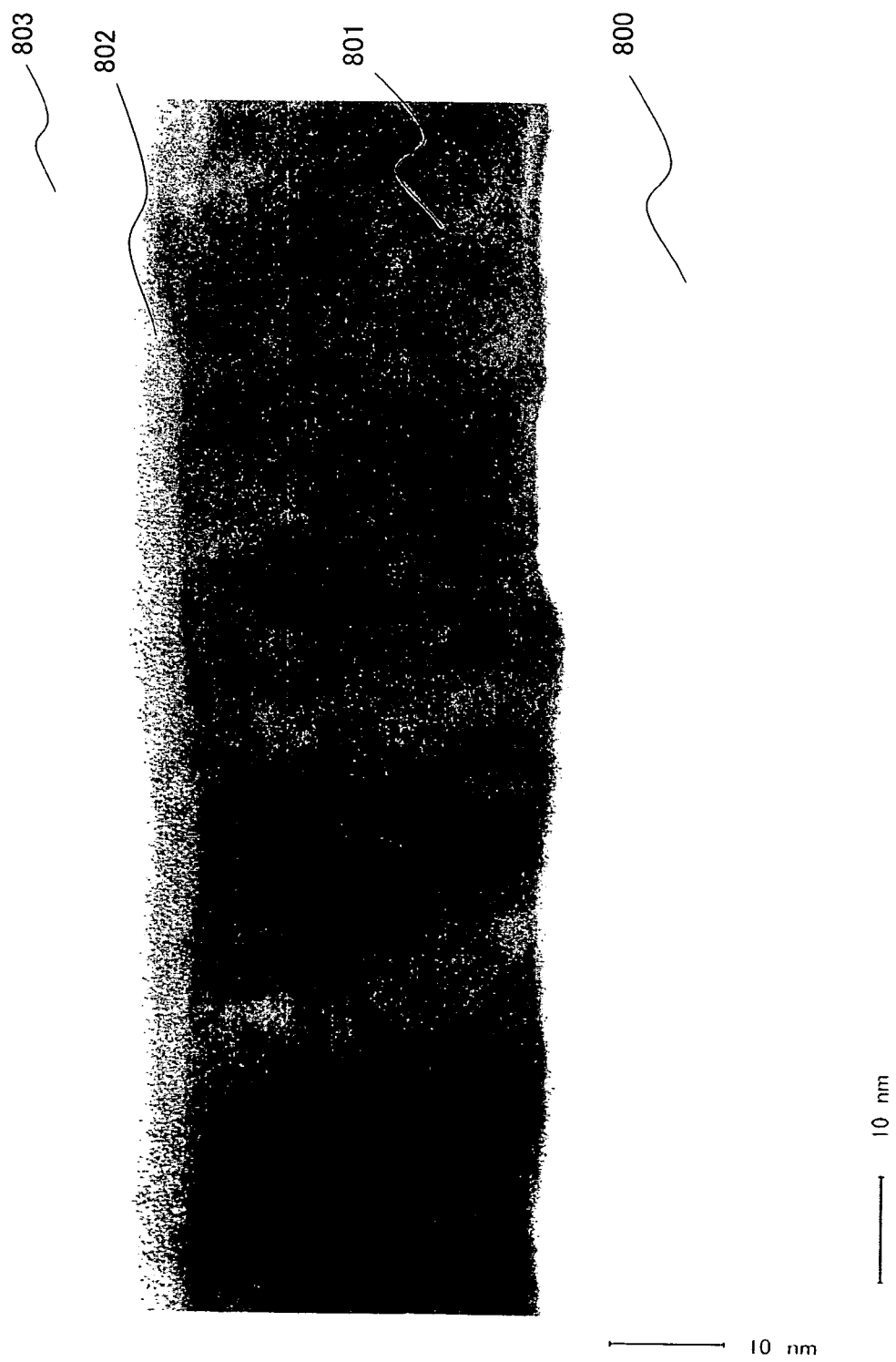
FIG. 24 is a diagram showing experimental data of Embodiment 3.

As shown in FIG. 24, a metal film 801, a peeling layer (a film made of metal oxide, metal nitride or metal nitride oxide) 802 and an insulating film 803 are laminated over a substrate 800. The metal film 801 is dark gray close to black, and the peeling layer (the film made of metal oxide, metal nitride or metal nitride oxide) 802 over the metal film 801 is light gray. FIG. 25 shows the substrate side after peeling, in which the metal film 801 is laminated over the substrate 800 and a peeling layer (a film made of metal oxide, metal nitride or metal nitride oxide) 805a divided by the peeling process remains over the metal film 801. On the other hand, FIG. 26 shows the element side after peeling, in which a peeling layer (a film made of metal oxide, metal nitride or metal nitride oxide) 805b divided by the peeling process is remained over the insulating film 803. As shown in FIG. 25 and FIG. 26, the peeling layer (the film made of metal oxide, metal nitride or metal nitride oxide) 802 is divided into the substrate side and the element side by the peeling process, and the peeling layer (the film made of metal oxide, metal nitride or metal nitride oxide) remaining over the substrate 800 side is thicker than that remaining over the element side.

An X-ray reflectivity (XRR) measurement of the peeling layer (the film made of metal oxide, metal nitride or metal nitride oxide) before peeling 802, the peeling layer (the film made of metal oxide, metal nitride or metal nitride oxide) after peeling 805a and the peeling layer (the film made of metal oxide, metal nitride or metal nitride oxide) after peeling 805b is conducted, and density, film thickness and surface roughness of each were obtained. The result is shown in Table 1.

TABLE 1

| Sample | Density (g/cm$^3$) | Thickness (nm) | Roughness (nm) |
| --- | --- | --- | --- |
| Peeling Layer on Substrate Side after Peeling | 10.14 | 1.437 | 0.78 |
| Peeling Layer on Element Side after Peeling | 6.9 | 3.75 | 1.14 |
| Peeling Layer before Peeling | 10.3 | 5.2 | 4 |

As shown in Table 1, a thickness of the peeling layer on the substrate side after peeling is thicker than a thickness of the peeling layer on the element side after peeling. The total film thickness of the peeling layer on the substrate side and the peeling layer on the element side is almost equal to a thickness of the peeling layer before peeling, so that it can be seen that the peeling layer before peeling is divided into the substrate side and the element side. In addition, a density of the peeling layer on the substrate side after peeling and a density of the peeling layer before peeling are almost the same value.

Figure 27A:
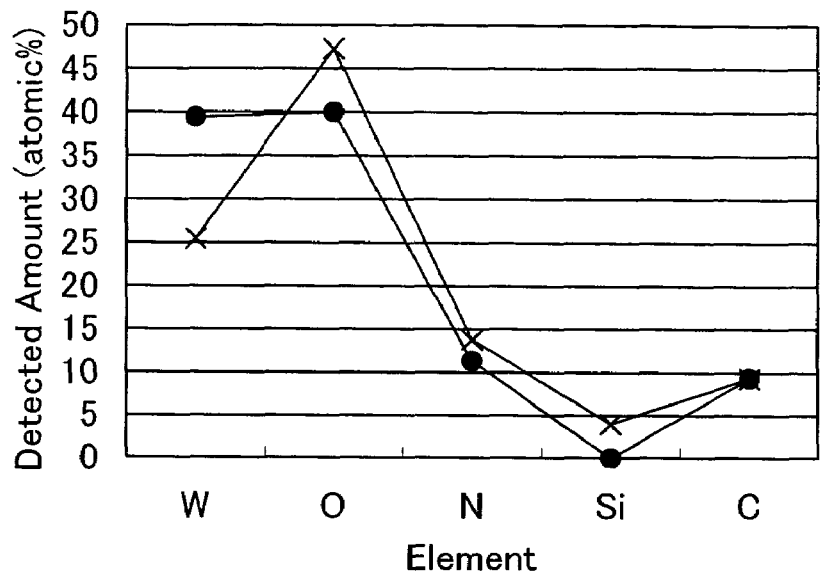
FIGS. 27A to 27C are diagrams showing experimental data of Embodiment 3.
Figure 27B:
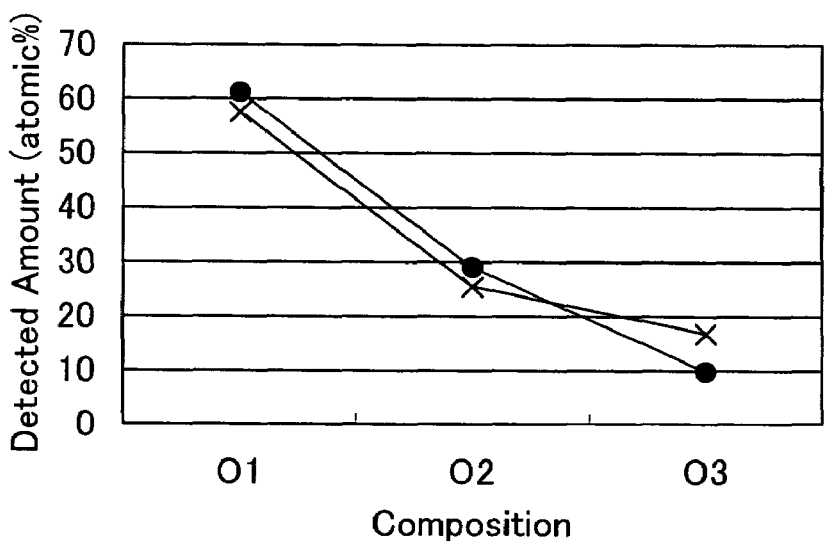
Figure 27C:
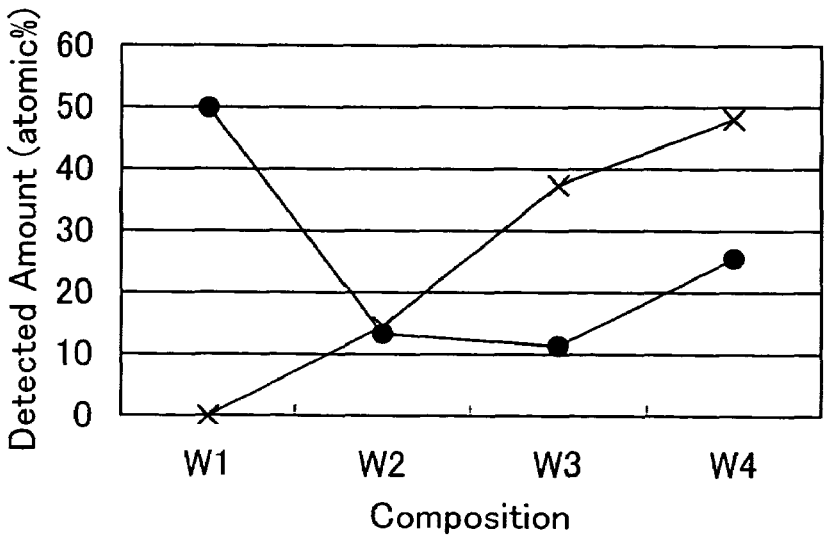

Next, an X-ray photoelectron spectroscopy (ECSA: Electron Spectroscopy for Chemical Analysis, XPS: X-ray Photoelectron Spectroscopy) measurement of the peeling layer on the substrate side after peeling and the peeling layer on the element side after peeling is conducted, and quantitative ratio of elements contained in each layer is obtained. The result is shown in Table 2 and FIG. 27A to FIG. 27C. FIG. 27A shows a relation between elements contained in the peeling layer and the quantitative ratio, FIG. 27B shows a relation between compositions of oxygen in the peeling layer and the quantitative ratio, and FIG. 27C shows a relation between compositions of tungsten in the peeling layer and the quantitative ratio. In FIG. 27A to FIG. 27C, a black dot shows a detected amount in the peeling layer on the substrate side, and an x-mark shows a detected amount in the peeling layer on the element side, respectively.

TABLE 2

| Sample | W (atomic %) | | | | O (atomic %) | | | N (atomic %) | Si (atomic %) | C (atomic %) |
|---|---|---|---|---|---|---|---|---|---|---|
| | W1 | W2 | W3 | W4 | O1 | O2 | O3 | | | |
| Peeling Layer on Substrate Side after Peeling | 49.9 | 39.4 / 13.3 | 11.3 | 25.5 | 61.2 | 40 / 29 | 9.8 | 11.3 | 0 | 9.3 |
| Peeling Layer on Element Side after Peeling | 0 | 25.5 / 14.5 | 37.4 | 48.1 | 57.6 | 47.3 / 25.5 | 16.9 | 13.8 | 4 | 9.3 |

W1: Metal W,
W2: $WO_2$, $WNx$,
W3: $WO_{2-3}$, $WN_xO_y$,
W4: $WO_3$ etc.
O1: $WO_x$,
O2: $W(OHx)$, $WO_xNy$,
O3; C=O, O—C—O, Si—O etc.

As for an analysis method of Table 2, binding energy W4f for tungsten (W) and binding energy O1s for oxygen (O) are applied to the following compositions. In Table 2, W1 is metal W, W2 is $WO_2$ or $WN_x$, W3 is $WO_{2\ to\ 3}$ or $WN_xO_y$, and W4 is $WO_3$ or the like, O1 is $WO_x$, O2 is $W_{(OHx)}$ or $WO_xN_y$, O3 is C=O, O—C—O, Si—O or the like. In Table 2, a composition ratio of elements in each sample is shown, and W, O, N, Si and C make approximately 100%. In addition, as for W and O, ratios of composition in W and O respectively is shown, and W1 to W4 make approximately 100% with respect to W, and O1 to O3 make approximately 100% with respect to O.

Quantitative ratios of elements contained in the peeling layer (the film made of metal oxide, metal nitride or metal nitride oxide) right after the peeling layer is formed by performing a plasma treatment in a dinitrogen monoxide atmosphere on a surface of a metal film formed over a substrate are as follows: tungsten (W) is 22.7% (W1 is 2.9%, W2 is 0.1%, W3 is 6.7%, and W4 is 90.2%), oxygen (O) is 62.6% (O1 is 68.5%, O2 is 24.4%, and O3 is 7.2%), nitrogen (N) is 1.7%, silicon (Si) is 1.3% and carbon (C) is 11.7%.

Contained amounts of nitrogen are increased in the peeling layer on the substrate side and the peeling layer on the element side after a heat treatment. Furthermore, a density of the peeling layer on the substrate side and a density of the peeling layer on the element side are different from each other, as shown in Table 1, and also, ratio of each composition in the peeling layer on the substrate side and that in the peeling layer on the element side after peeling are different from each other, as shown in FIG. 27C.

Figure 28:
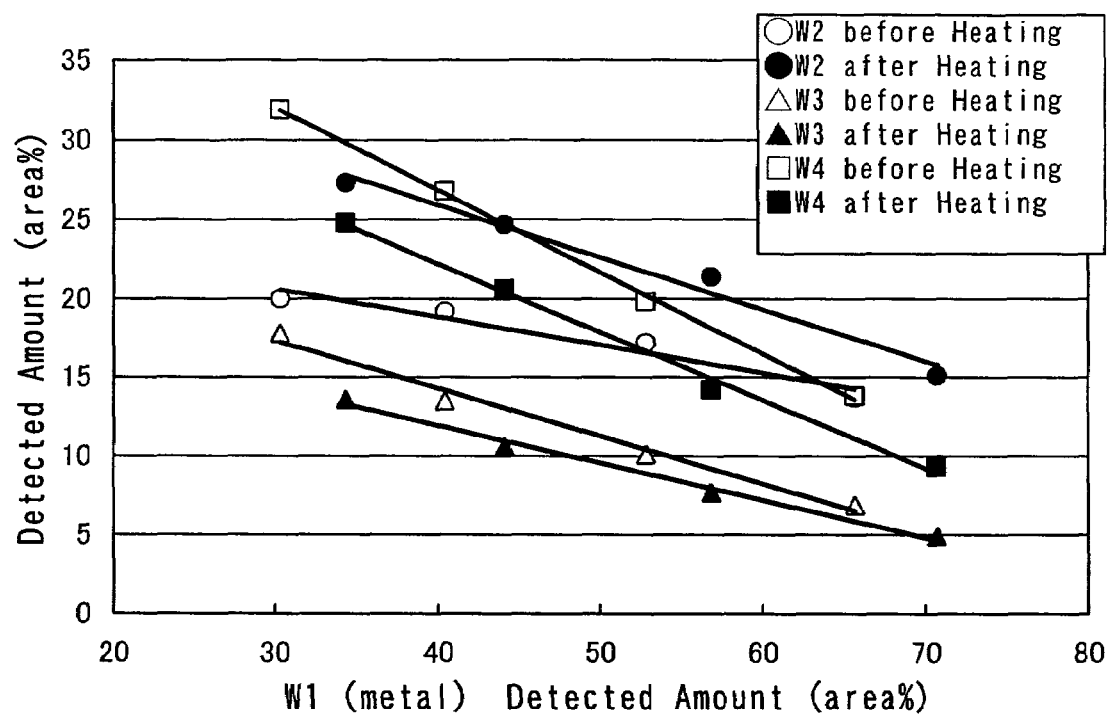
FIG. 28 is a diagram showing experimental data of Embodiment 3.
Figure 29:
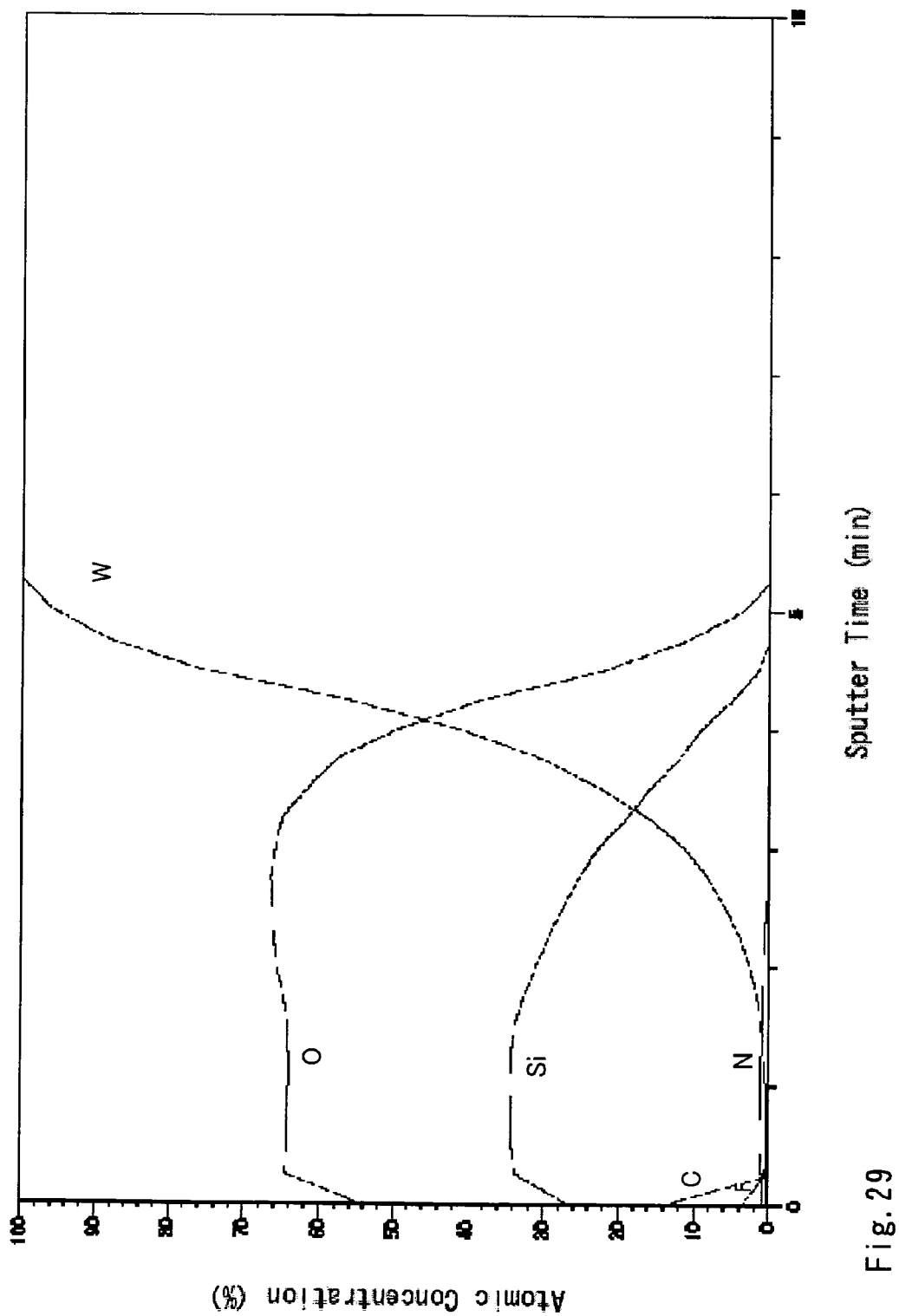
FIG. 29 is a diagram showing experimental data of Embodiment 3.
Figure 30:
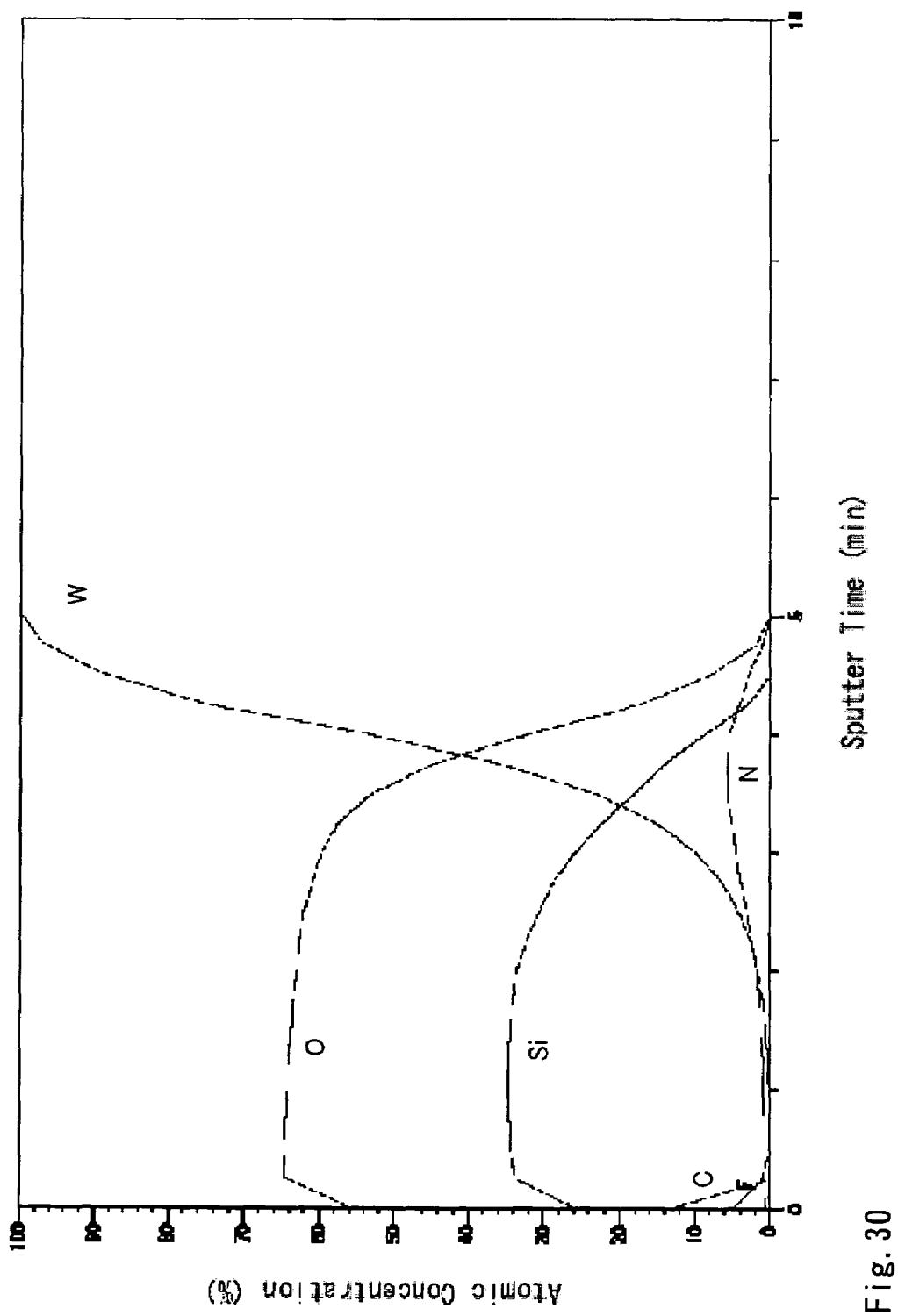
FIG. 30 is a diagram showing experimental data of Embodiment 3.
Figure 31:
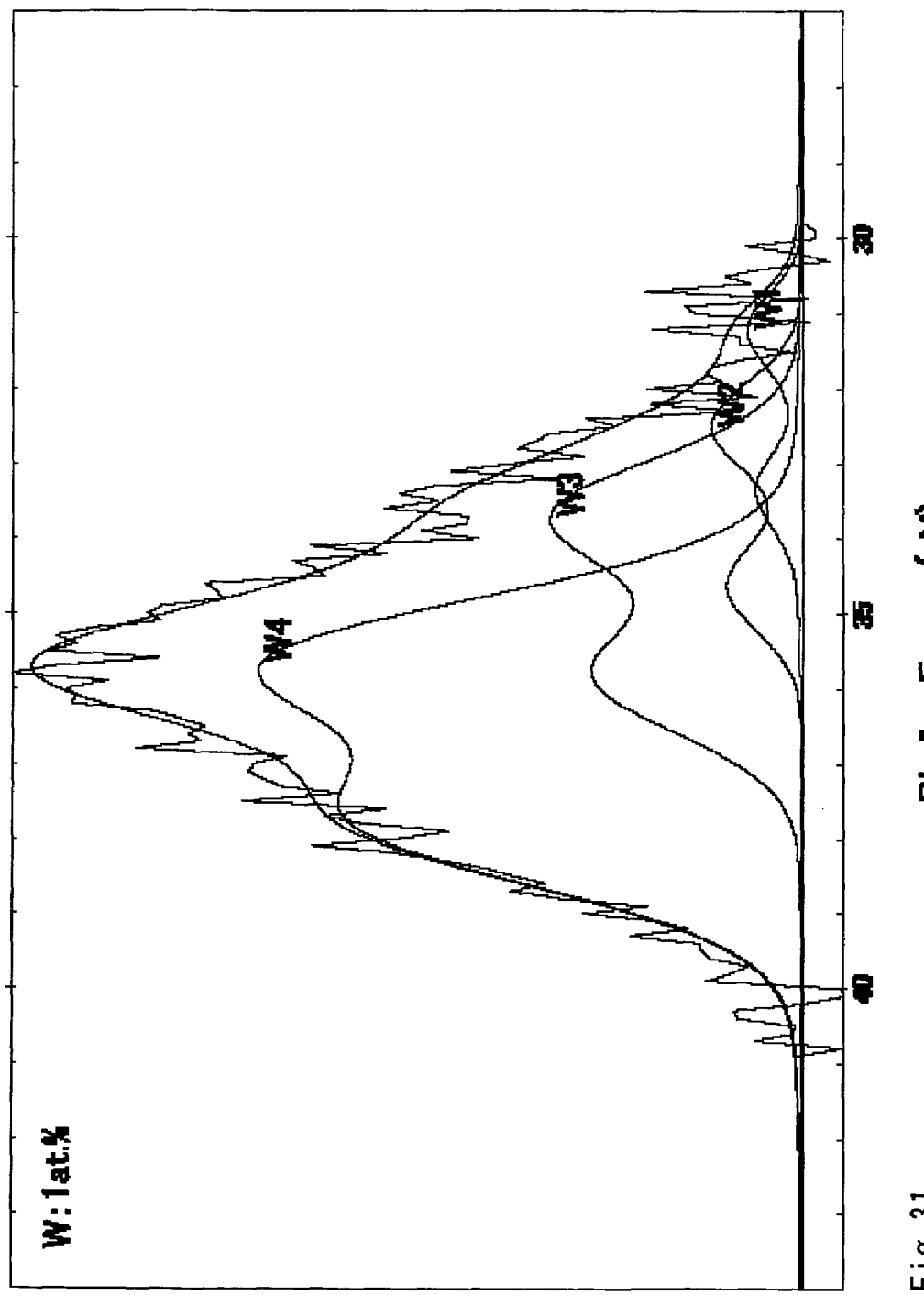
FIG. 31 is a diagram showing experimental data of Embodiment 3.
Figure 32:
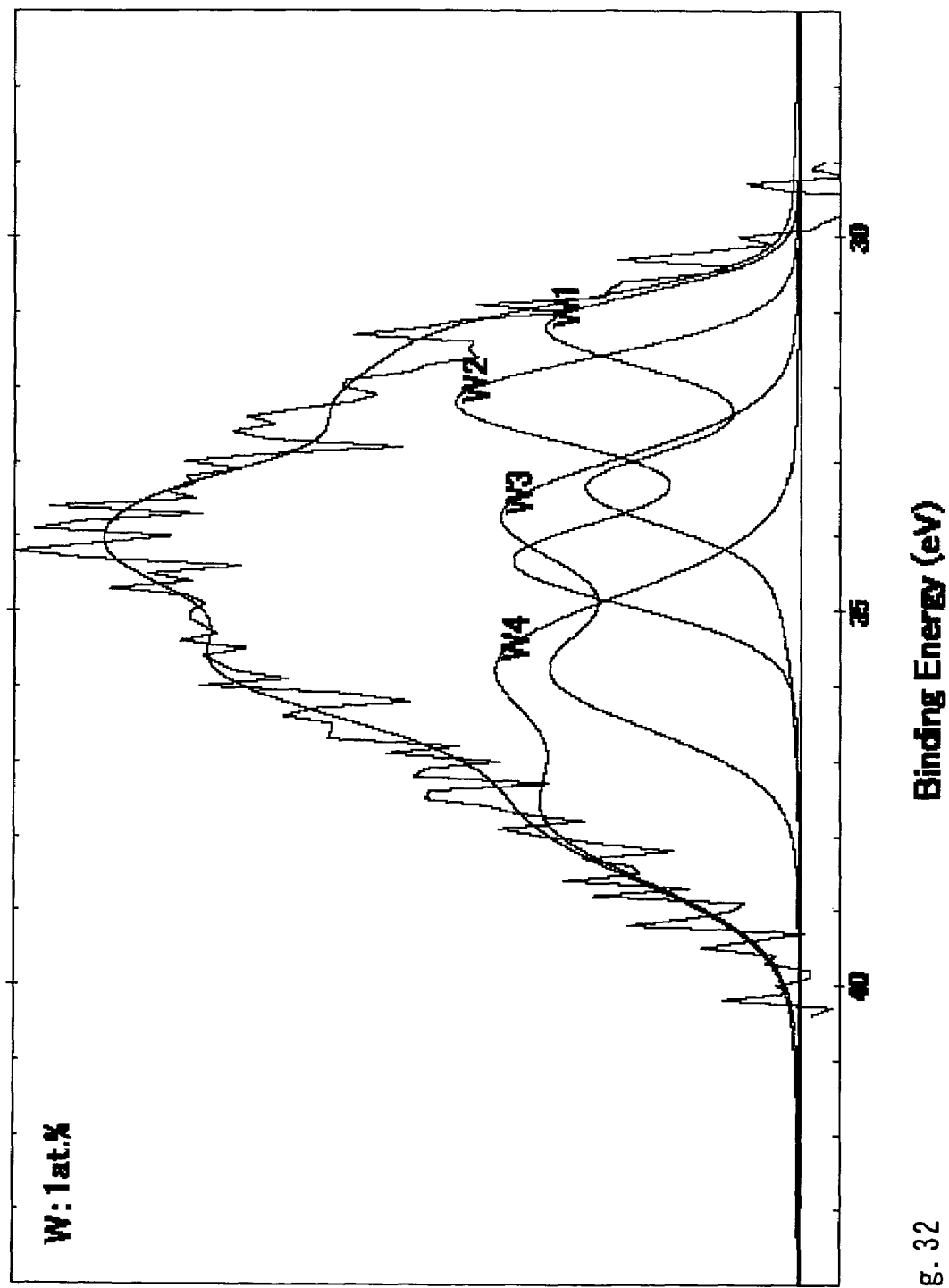
FIG. 32 is a diagram showing experimental data of Embodiment 3.

A quantitative ratio of compositions of elements contained in each layer in the film thickness direction in the peeling layer before and after a heat treatment is measured by X-ray photoelectron spectroscopy, and the composition change in the peeling layer before and after the heat treatment is examined. The result is shown in FIG. 28 to FIG. 32. FIG. 29 and FIG. 31 are spectrums showing contained amounts of elements in the peeling layer before the heat treatment, and FIG. 30 and FIG. 32 are spectrums showing those in the peeling layer after the heat treatment. FIG. 31 shows spectrum showing contained amount of tungsten composition in the peeling layer before the heat treatment, and FIG. 32 shows spectrum showing that in the peeling layer after the heat treatment. Changes of W2, W3 and W4 with respect to W1, derived by analyzing data in FIG. 29 and FIG. 31 are shown in FIG. 28.

W1 in the peeling layer increases as it gets closer to a tungsten film, which means the change of W1 is proportional to a depth in the film thickness direction, so that W1 is set to be a criterion. In FIG. 28, an open circle dot shows W2 in the peeling layer before heating, a black dot shows W2 in the peeling layer after heating, an open triangle dot shows W3 in the peeling layer before heating, black triangle dot shows W3 in the peeling layer after heating, an open quadrangle dot shows W4 in the peeling layer before heating, and a black square dot shows W4 in the peeling layer after heating. As for W3 and W4, the contained amounts are decreased in the peeling layer after heating. However, as for only W2, the contained amount is increased in the peeling layer after heating. W2 is a peak attributable to WN, so it means that WN composition is increased by performing a heat treatment on the peeling layer.

As described above, a change in property in the peeling layer on the substrate side and the peeling layer on the element side after peeling, and a change in composition of the peeling layer before and after heating could be examined.

This application is based on Japanese Patent Application serial no. 2005-158761 filed in Japan Patent Office on May, 5th, in 2005, the entire contents of which are hereby incorporated by reference.

What is claimed is:

1. A manufacturing method of a semiconductor device, comprising the steps of:
   forming a metal film over a substrate;
   performing a plasma treatment on the metal film in a dinitrogen monoxide atmosphere to form a metal oxide film on a surface of the metal film;
   forming an element forming layer over the metal oxide film after performing the plasma treatment;
   forming an insulating film over the element forming layer;
   removing the metal oxide film and the metal film after forming the insulating film; and
   peeling the element forming layer from the substrate after removing the metal oxide film and the metal film.

2. A manufacturing method of a semiconductor device, comprising the steps of:
   forming a metal film over a substrate;
   performing a plasma treatment on the metal film in a mixture gas atmosphere of dinitrogen monoxide and argon to form a metal oxide film on a surface of the metal film;

forming an element forming layer over the metal oxide film after performing the plasma treatment;
forming an insulating film over the element forming layer;
removing the metal oxide film and the metal film after forming the insulating film; and
peeling the element forming layer from the substrate after removing the metal oxide film and the metal film.

3. A manufacturing method of a semiconductor device, comprising the steps of:
forming a metal film over a substrate;
performing a plasma treatment on the metal film in a dinitrogen monoxide atmosphere to form a metal oxide film on a surface of the metal film and forming a first insulating film over the metal oxide film continuously without being exposed to the air;
forming an element forming layer over the first insulating film;
forming a second insulating film over the element forming layer;
removing the metal oxide film and the metal film after forming the second insulating film; and
peeling the element forming layer from the substrate after removing the metal oxide film and the metal film.

4. A manufacturing method of a semiconductor device, comprising the steps of:
forming a metal film over a substrate;
performing a plasma treatment on the metal film in a mixture gas atmosphere of dinitrogen monoxide and argon to form a metal oxide film on a surface of the metal film and forming a first insulating film over the metal oxide film continuously without being exposed to the air;
forming an element forming layer over the first insulating film;
forming a second insulating film over the element forming layer;
removing the metal oxide film and the metal film after forming the second insulating film; and
peeling the element forming layer from the substrate after removing the metal oxide film and the metal film.

5. A manufacturing method of a semiconductor device, comprising the steps of:
forming a metal film over a substrate;
performing a plasma treatment on the metal film in an atmosphere containing dinitrogen monoxide to form a metal oxide film on a surface of the metal film;
forming a first insulating film over the metal oxide film;
forming an element forming layer including a semiconductor film over the first insulating film;
forming a second insulating film over the element forming layer;
removing the metal oxide film and the metal film after forming the second insulating film; and
peeling the element forming layer from the substrate after removing the metal oxide film and the metal film,
wherein the laminated metal oxide film, first insulating film and semiconductor film are formed continuously without being exposed to the air.

6. A manufacturing method of a semiconductor device, comprising the steps of:
forming a metal film over a substrate;
performing a plasma treatment on the metal film in a dinitrogen monoxide atmosphere to form a metal oxide film on a surface of the metal film;
forming an element forming layer over the metal oxide film;
forming an insulating film over the element forming layer;
forming an opening in the insulating film and the element forming layer after forming the insulating film;
introducing an etchant into the opening to remove the metal film and the metal oxide film; and
peeling the element forming layer from the substrate after introducing the etchant into the opening.

7. A manufacturing method of a semiconductor device, comprising the steps of:
forming a metal film over a substrate;
performing a plasma treatment on the metal film in a dinitrogen monoxide atmosphere to form a metal oxide film on a surface of the metal film;
forming an element forming layer over the metal oxide film;
forming an insulating film over the element forming layer;
forming an opening in the insulating film and the element forming layer;
introducing an etchant into the opening to remove the metal film and the metal oxide film so as to leave at least a portion of the metal film and the metal oxide film; and
peeling the element forming layer from the substrate by a physical means after introducing the etchant into the opening.

8. A manufacturing method of a semiconductor device, comprising the steps of:
forming a metal film over a substrate;
performing a plasma treatment on the metal film in a mixture gas atmosphere of dinitrogen monoxide and argon to form a metal oxide film on a surface of the metal film;
forming an element forming layer over the metal oxide film;
forming an insulating film over the element forming layer;
forming an opening in the insulating film and the element forming layer;
introducing an etchant into the opening to remove the metal film and the metal oxide film; and
peeling the element forming layer from the substrate after introducing the etchant into the opening.

9. A manufacturing method of a semiconductor device, comprising the steps of:
forming a metal film over a substrate;
performing a plasma treatment on the metal film in a mixture gas atmosphere of dinitrogen monoxide and argon to form a metal oxide film on a surface of the metal film;
forming an element forming layer over the metal oxide film;
forming an insulating film over the element forming layer;
forming an opening in the insulating film and the element forming layer;
introducing an etchant into the opening to remove the metal film and the metal oxide film so as to leave at least a portion of the metal film and the metal oxide film; and
peeling the element forming layer from the substrate by a physical means after introducing the etchant into the opening.

10. A manufacturing method of a semiconductor device, comprising the steps of:
forming a metal film over a substrate;
performing a plasma treatment on the metal film in a dinitrogen monoxide atmosphere to form a metal oxide film on a surface of the metal film and forming a first insulating film over the metal oxide film continuously without being exposed to the air;
forming an element forming layer over the first insulating film;
forming a second insulating film over the element forming layer;

forming an opening in the second insulating film and the element forming layer;

introducing an etchant into the opening to remove the metal film and the metal oxide film; and peeling the element forming layer from the substrate after introducing the etchant into the opening.

11. A manufacturing method of a semiconductor device, comprising the steps of:

forming a metal film over a substrate;

performing a plasma treatment on the metal film in a dinitrogen monoxide atmosphere to form a metal oxide film on a surface of the metal film and forming a first insulating film over the metal oxide film continuously without being exposed to the air;

forming an element forming layer over the first insulating film;

forming a second insulating film over the element forming layer;

forming an opening in the second insulating film and the element forming layer;

introducing an etchant into the opening to remove the metal film and the metal oxide film so as to leave at least a portion of the metal film and the metal oxide film; and peeling the element forming layer from the substrate by a physical means after introducing the etchant into the opening.

12. A manufacturing method of a semiconductor device, comprising the steps of:

forming a metal film over a substrate;

performing a plasma treatment on the metal film in a mixture gas atmosphere of dinitrogen monoxide and argon to form a metal oxide film on a surface of the metal film and forming a first insulating film over the metal oxide film continuously without being exposed to the air;

forming an element forming layer over the first insulating film;

forming a second insulating film over the element forming layer;

forming an opening in the second insulating film and the element forming layer;

introducing an etchant into the opening to remove the metal film and the metal oxide film; and peeling the element forming layer from the substrate after introducing the etchant into the opening.

13. A manufacturing method of a semiconductor device, comprising the steps of:

forming a metal film over a substrate;

performing a plasma treatment on the metal film in a mixture gas atmosphere of dinitrogen monoxide and argon to form a metal oxide film on a surface of the metal film and forming a first insulating film over the metal oxide film continuously without being exposed to the air;

forming an element forming layer over the first insulating film;

forming a second insulating film over the element forming layer;

forming an opening in the second insulating film and the element forming layer;

introducing an etchant into the opening to remove the metal film and the metal oxide film so as to leave at least a portion of the metal film and the metal oxide film; and peeling the element forming layer from the substrate by a physical means after introducing the etchant into the opening.

14. The manufacturing method of a semiconductor device according to any one of claim 5 to claim 8, wherein the metal oxide film and the first insulating film are formed by a plasma CVD apparatus.

15. The manufacturing method of a semiconductor device according to any one of claim 5 to claim 9, wherein the metal oxide film and the first insulating film are formed in the same chamber.

16. A manufacturing method of a semiconductor device, comprising the steps of:

forming a metal film over a substrate;

performing a plasma treatment on the metal film in an atmosphere containing dinitrogen monoxide to form a metal oxide film on a surface of the metal film;

forming a first insulating film over the metal oxide film;

forming an element forming layer having a semiconductor film over the first insulating film;

forming a second insulating film over the element forming layer;

forming an opening in the second insulating film and the element forming layer;

introducing an etchant into the opening to remove the metal film and the metal oxide film;

removing the metal oxide film and the metal film after forming the second insulating film; and peeling the element forming layer from the substrate after removing the metal oxide and the metal film, wherein the laminated metal oxide film, first insulating film and semiconductor film are formed continuously without being exposed to the air.

17. The manufacturing method of a semiconductor device according to any one of claim 1 to claim 13, wherein the metal film is formed using an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material containing the element as a main component.

* * * * *